United States Patent
Hamelin et al.

(10) Patent No.: US 10,735,154 B2
(45) Date of Patent: Aug. 4, 2020

(54) METHODS AND APPARATUS FOR CODING SUB-CHANNEL SELECTION

(71) Applicant: HUAWEI TECHNOLOGIES CO., LTD., Shenzhen, Guangdong (CN)

(72) Inventors: Louis-Philippe Hamelin, Montreal (CA); Yiqun Ge, Kanata (CA); Wuxian Shi, Kanata (CA); Ran Zhang, Kanata (CA); Nan Cheng, Kanata (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/901,238

(22) Filed: Feb. 21, 2018

(65) Prior Publication Data
US 2018/0278389 A1     Sep. 27, 2018

Related U.S. Application Data

(60) Provisional application No. 62/475,520, filed on Mar. 23, 2017.

(51) Int. Cl.
| | | |
|---|---|---|
| H04L 5/00 | (2006.01) | |
| H04L 1/00 | (2006.01) | |
| H03M 13/13 | (2006.01) | |
| H03M 13/03 | (2006.01) | |

(52) U.S. Cl.
CPC ........ H04L 5/0046 (2013.01); H03M 13/033 (2013.01); H03M 13/13 (2013.01); H04L 1/0009 (2013.01); H04L 1/0041 (2013.01); H04L 1/0057 (2013.01); H04L 1/0068 (2013.01)

(58) Field of Classification Search
None
See application file for complete search history.

(56) References Cited

U.S. PATENT DOCUMENTS

| | | | |
|---|---|---|---|
| 2005/0220179 A1* | 10/2005 | Tsatsanis | H04L 5/023 375/222 |
| 2009/0067355 A1* | 3/2009 | Haartsen | H04W 72/08 370/311 |
| 2014/0331083 A1 | 11/2014 | Aliev et al. | |
| 2018/0375615 A1* | 12/2018 | Xu | H04L 1/0054 |
| 2019/0372608 A1* | 12/2019 | Wei | H03M 13/6362 |

FOREIGN PATENT DOCUMENTS

CN     103414540 A     11/2013

OTHER PUBLICATIONS

Huawei et al.,"Details of the Polar code design",3GPP TSG RAN WG1 Meeting #87 R1-1611254, Nov. 10-14, 2016,total 15 pages.
(Continued)

*Primary Examiner* — Kodzovi Acolatse
*Assistant Examiner* — Jay L Vogel

(57) ABSTRACT

Coding sub-channel selection involves, in an embodiment, determining, from sub-channels that are defined by a code and that have associated reliabilities for input bits at input bit positions, a first number of the sub-channels to carry bits that are to be encoded. A second number of the sub-channels, greater than the first number, are selected. The second number of sub-channels are selected to provide exactly the first number sub-channels to be available to carry the bits that are to be encoded.

26 Claims, 28 Drawing Sheets

(56) References Cited

OTHER PUBLICATIONS

Qualcomm Incorporated,"Polar code design overview",3GPP TSG-RAN WG1 #85 R1-164699,May 23-27, 2016, total 3 pages.
E. Arikan, "Channel Polarization: A Method for Constructing Capacity-Achieving Codes for Symmetric Binary-Input Memoryless Channels," IEEE Transactions on Information Theory, vol. 55, No. 7, 2009, pp. 3051-3073.
Tal and Vardy, "List Decoding of Polar Codes", Proceedings of the 2011 IEEE International Symposium on Information Theory, Jul. 2011, 11 pages.
R. Pedarsani, "Polar Codes: Construction and Performance Analysis", Jun. 2011, EPFL master project, 48 pages.
Mori R, Tanaka T., "Performance and Construction of Polar Codes on Symmetric Binary-Input Memoryless Channels", IEEE International Symposium on Information Theory, 2009, pp. 1496-1500.
J.Dai, K.Niu, Z.Si, J.Lin, "Evaluation and Optimization of Gaussian Approximation for Polar Codes", May 2016, 4 pages.
P. Trifonov, "Efficient Design and Decoding of Polar Codes." IEEE Transactions on Communications 60.11 (2012): pp. 3221-3227.
R1-1611254, "Details of the Polar Code Design", Huawei & HiSilicon, 3GPP TSG RAN WG1 Meeting #87, Nov. 10-14, 2016, 33 pages.
C. Schürch, "A Partial Order for the Synthesized Channels of a Polar Code," Proc. of the IEEE Int. Symposium on Inform. Theory (ISIT), Barcelona, Spain, Jul. 2016, pp. 220-224.
M. Bardet, V. Dragoi, A. Otmani, and J.-P. Tillich, "Algebraic Properties of Polar Codes From a New Polynomial Formalism," Proc. of the IEEE Int. Symposium on Inform. Theory (ISIT), Barcelona, Spain, Jul. 2016, pp. 230-234.

\* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$100$ $$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$102$ $$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

Successive Cancellation Decoding for $i = 0, 1, \ldots, n-1$ do
  if $\hat{u}_i$ is frozen then set $\hat{u}_i$ accordingly;
  else
    if $W_i(y_0^{n-1}, \hat{u}_0^{i-1}|0) > W_i(y_0^{n-1}, \hat{u}_0^{i-1}|1)$ then
      set $\hat{u}_i \leftarrow 0$;
    else
      set $\hat{u}_i \leftarrow 1$;

$F = \{0, 1, 2, 4\}$

From 0 till $N - 1$ if $i \in F$, $\hat{u}_i = 0$ if $i \in F^c$, $$\hat{u}_i = \begin{cases} 0, & \text{if } \dfrac{P(0 \mid \hat{u}_0^{i-1}, \bar{y})}{P(1 \mid \hat{u}_0^{i-1}, \bar{y})} > 1 \\ 1, & \text{otherwise} \end{cases}$$

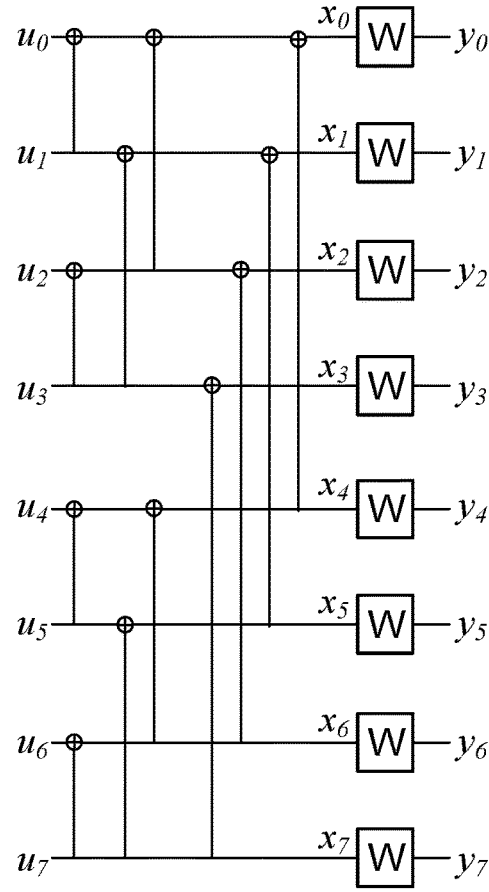

FIG. 4

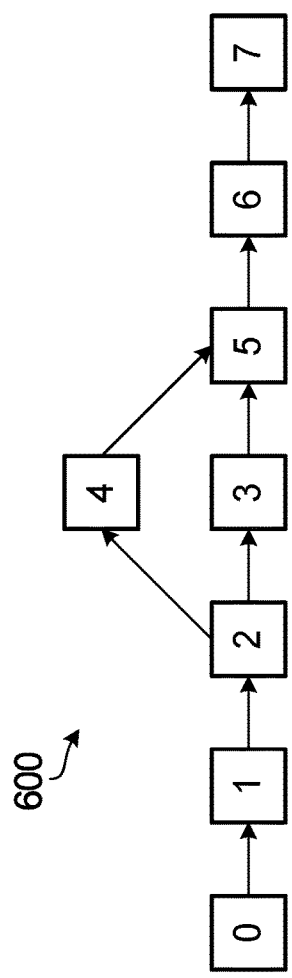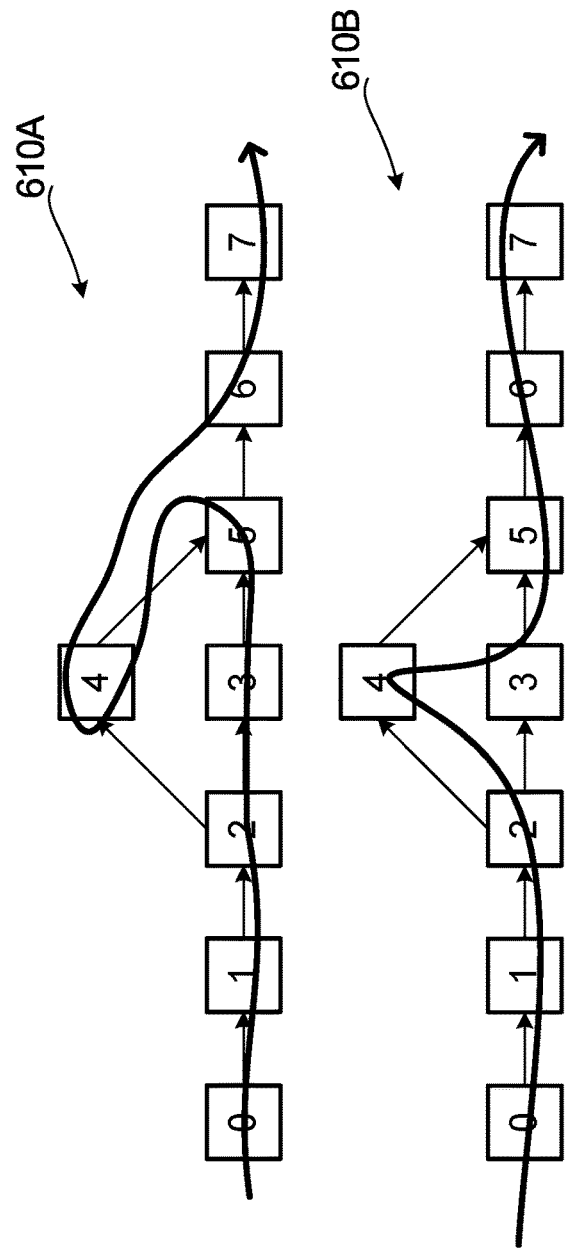
FIG. 6A
FIG. 6B

METHODS AND APPARATUS FOR CODING SUB-CHANNEL SELECTION

CROSS-REFERENCE TO RELATED APPLICATIONS

The present application claims the benefit of U.S. Provisional Application No. 62/475,520, filed on Mar. 23, 2017, entitled "METHODS AND APPARATUS FOR CODING SUB-CHANNEL SELECTION", the entire contents of which are incorporated herein by reference.

FIELD

The present disclosure relates to generally to communications and, in particular, to selection of coding sub-channels.

BACKGROUND

Polar codes are proposed as channel codes for use in future wireless communications, and have been selected for uplink and downlink enhanced Mobile Broadband (eMBB) control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation (SC) decoding and its extensions (e.g., SC List decoding) are effective and efficient options for decoding polar coded information.

Based on channel polarization, Arikan designed a channel code that is proven to reach channel capacity. Polarization refers to a coding property that, as code length increases to infinity, bit-channels also referred to as sub-channels polarize and their capacities approach either zero (completely noisy channel) or one (completely perfect channel). In other words, bits encoded in high capacity sub-channels will experience a channel with high Signal-to-Noise Ratio (SNR), and will have a relatively high reliability or a high likelihood of being correctly decoded, and bits encoded in low capacity sub-channels will experience a channel with low SNR, and will have low reliability or a low possibility to be correctly decoded. The fraction of perfect bit-channels is equal to the capacity of a channel.

SUMMARY

Illustrative embodiments are disclosed by way of example in the description and claims.

According to one aspect of the present disclosure, a method involves determining, from sub-channels that are defined by a code and that have associated reliabilities for input bits at input bit positions, a first number of the sub-channels to carry bits that are to be encoded. A method could also involve selecting a second number of the sub-channels, greater than the first number, to provide exactly the first number of sub-channels to be available to carry the bits that are to be encoded.

Another aspect of the present disclosure relates to a non-transitory processor-readable medium storing instructions which, when executed by one or more processors, cause the one or more processors to perform a method. Similarly, an apparatus could include a processor and a memory, coupled to the processor, storing instructions which, when executed by the processor, cause the processor to perform a method. Such a method could involve determining, from sub-channels that are defined by a code and that have associated reliabilities for input bits at input bit positions, a first number of the sub-channels to carry bits that are to be encoded, and selecting a second number of the sub-channels, greater than the first number, to provide exactly the first number of sub-channels to be available to carry the bits that are to be encoded.

Another apparatus as disclosed herein includes a sub-channel processing module to determine, from sub-channels that are defined by a code and that have associated reliabilities for input bits at input bit positions, a first number of the sub-channels to carry bits that are to be encoded; and to select a second number of the sub-channels, greater than the first number, to provide exactly the first number of sub-channels to be available to carry the bits that are to be encoded.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 1 is a diagram showing one example of how a polar coding generator matrix can be produced from a kernel.

FIG. 4 illustrates an example of an SC (Successive Cancellation) decoding algorithm.

FIG. 6A is a block diagram illustrating an example partial order of N=8 sub-channels.

FIG. 6B includes block diagrams illustrating two possible ordered sub-channel sequences for N=8 sub-channels.

DETAILED DESCRIPTION

FIG. 1 is a diagram showing, by way of an illustrative example, how a polar coding generator matrix can be produced from a kernel $G_2$ 100. Note that FIG. 1 is an example. Other forms of kernel are also possible. Polarization comes from the "nested" way in which a generator matrix is created from a kernel (or combination of kernels).

A polar code can be formed from a Kronecker product matrix based on matrix $G_2$ 100, also referred to as a seed matrix F. For a polar code having codewords of length $N=2^m$, the generator matrix is $G_2^{\otimes m}$. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

Figure 2:
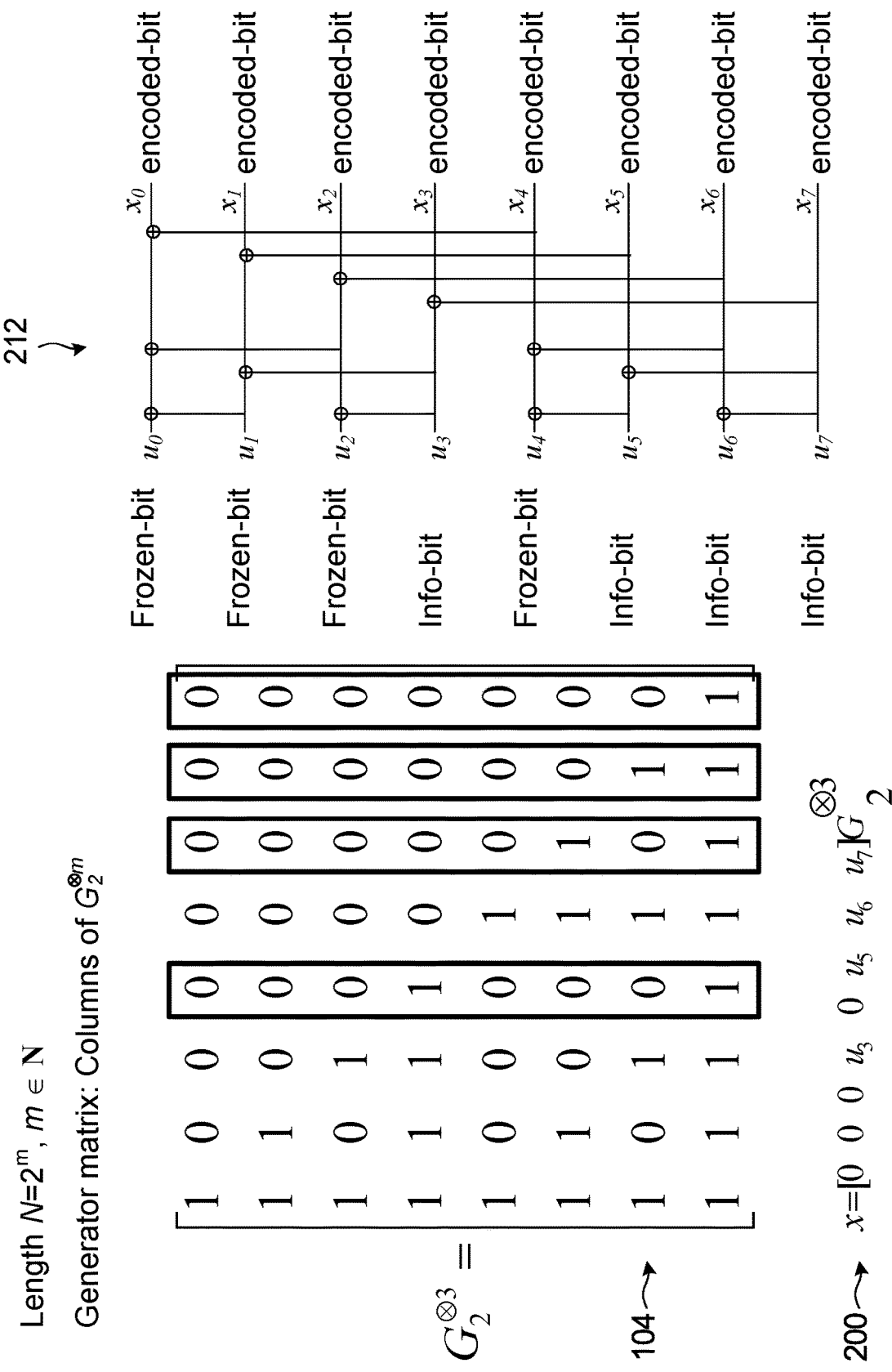
FIG. 2 is a diagram showing an example use of a polar coding generator matrix for producing codewords and a schematic illustration of an example polar encoder.

FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2^{\otimes 3}$ 104 as indicated at 200. The input vector u is composed of information bits and fixed or frozen bits. In the specific example shown in FIG. 2, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other bit values that are known to both an encoder and a decoder. For ease of description, all-zero frozen bits are considered herein, and may be generally preferred.

Figure 3:
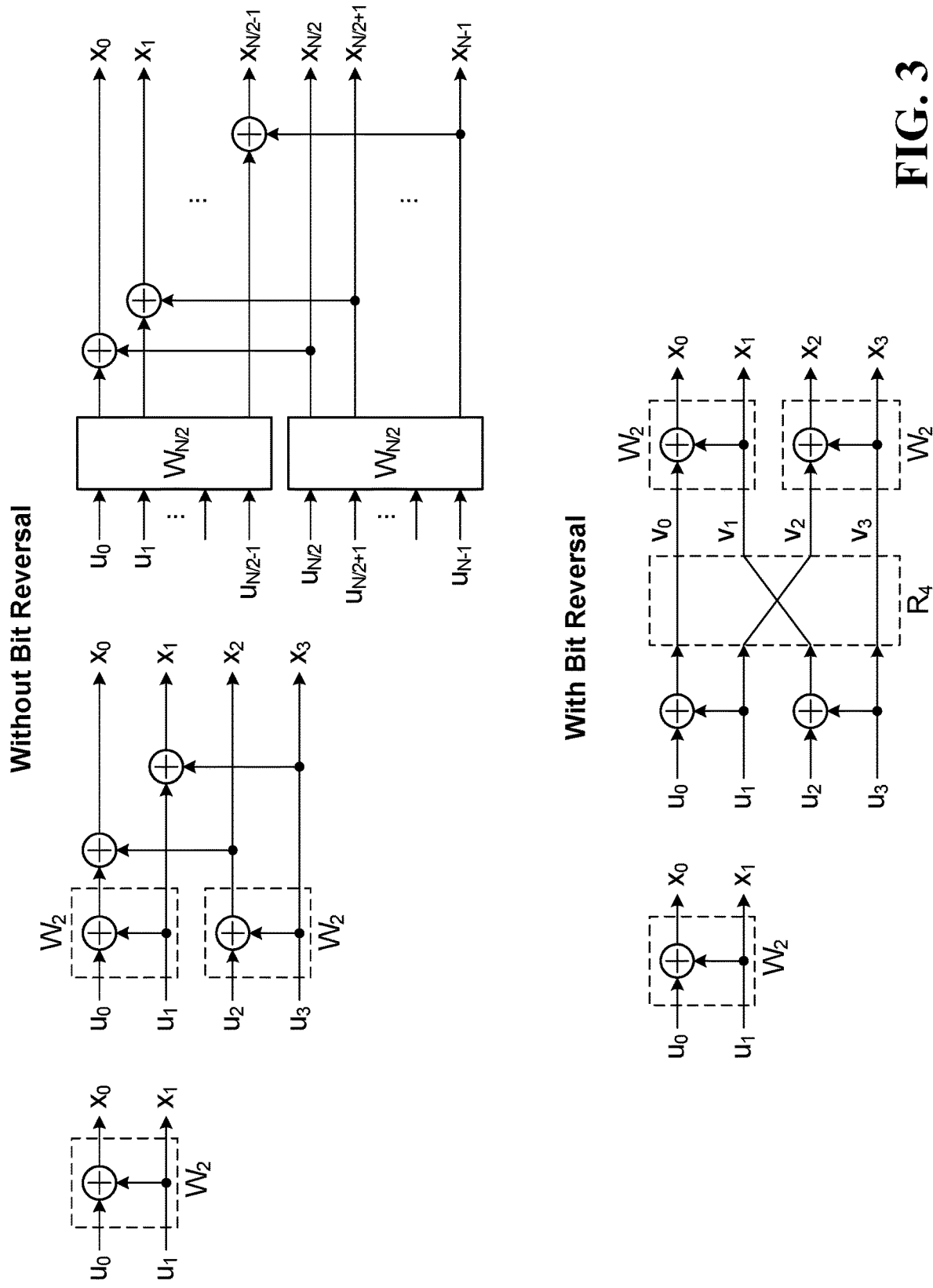
FIG. 3 includes block diagrams that illustrate polar coding without bit reversal and with bit reversal.

FIG. 3 includes block diagrams that illustrate polar coding without bit reversal and with bit reversal. The example polar encoder in FIG. 2 is without bit reversal, and is consistent with the example 2-by-2 kernel and higher-order encoder examples at the top of FIG. 3. Bit reversal might not change the structure of a kernel, as shown in FIG. 3 with the same 2-by-2 kernel for the examples without and with bit reversal. An example of higher-order polar encoder with 2-by-2 kernels and bit reversal represented at $R_4$, is shown at the bottom right of FIG. 3.

In more general terms, the output of a polar encoder is $x_0^{N-1} = u_0^{N-1} G_N$, where $G_N = F^{\otimes n}$ is an N-by-N generator matrix, $N=2^n$, $n \geq 1$, and $F=G_2$ 100 in the example shown in FIG. 1. For bit reversal, $G_N = B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate or the Signal-to-Noise Ratio (SNR) of the physical channel. A reliability sequence (reliable and unreliable positions) could be calculated based on assumed or measured characteristics of the physical channel before the information is transmitted over the channel, for example. In theory, the frozen bits can be set to any value as long as the location and value of each frozen bit is known to both the encoder and the decoder. In conventional applications, the frozen bits are all set to zero.

With a sufficiently long code length, a code designed according to polarization theory can reach the channel capacity in a binary symmetric memoryless channel if a Successive Cancellation (SC) based decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance. During encoding, an N-bit input vector could be formed from K information bits including one or more CRC bits, and (N−K) frozen bits. In this example, starting with a number of input bits, a CRC is calculated and appended to the input bits to produce a set of information bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit. FIG. 4 illustrates an example of an SC decoding algorithm.

Another type of polar decoding algorithm, which is an extension of the SC polar decoding algorithm with greater space efficiency and better error correction performance, referred to as a List or SCL decoding, is described in "List Decoding of Polar Codes" by Tal and Vardy, *Proceedings of the 2011 IEEE International Symposium on Information Theory*, pp. 1-5 (July 2011). In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. Typically, during generation of the decision tree, at each level of the decision tree where the number of paths grows beyond a set threshold L, the L paths having the highest likelihoods are identified, and the remaining paths are discarded.

Some List decoders may also make use of CRC bits included in the codeword to assist in decoding. For example, if the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation, including SC decoding and List decoding, which is also referred to as SCL decoding. For bit-level decoding, a decoding path generates 2 leaf branches (bit=0|1) for a next decoding bit. SC decoding is a special case of SCL decoding, with list size L=1. An SC decoder tracks only one decoding path. After the value of a decoded bit is estimated, the other possible value is ignored. Decoding continues with the next bit, assuming that each previous bit has been correctly estimated when updating partial sum results.

Although tracking multiple decoding paths as in SCL decoding may offer better decoding performance than single-path tracking as in SC decoders, multi-path decoder size and complexity increases with codeword length and with list size L. For example, for a codeword length N=8 with a 2-by-2 kernel, there are $2^8=256$ possibilities for estimated values $\hat{u}_0$ to $\hat{u}_7$. Other kernel sizes have different numbers of possibilities, such as $3^8$ for N=8 and a 3-by-3 kernel. As codeword length increases, the number of possibilities grows exponentially, and tracking of all decoding paths for all combinations of $\hat{u}_x$ becomes impractical. By tracking multiple decoding paths according to a list of size L, SCL decoders may still offer better decoding performance than SC decoders, with reasonable size and complexity. An SCL decoder monitors the best L decoding paths and estimates information bit values for the L decoding paths by combining Log Likelihood Ratio (LLR) values with previously computed partial sum values.

In one implementation, each decoding path from the root (decoded bit #0) of a decoding tree is associated with a Path Metric (PM). A decoding path appends each newly decoded bit to previous estimated values. After the LLR computations for each decoded bit, path metrics are continuously updated using the LLR values as follows:
  if the LLR value>=0
    PM[0, i+1]=PM[i]
    PM[1, i+1]=PM[i]+|LLR|
  if the LLR value<0
    PM[0, i+1]=PM[i]+|LLR|
    PM[1, i+1]=PM[i].

In that example, the best decoding paths have the smallest PM values. If an LLR is less than 0, then decoded bit is most likely a 1, so the next PM for the estimated value 1 (PM[1, i+1]) remains the same as the current path metric, and the absolute LLR value is added to the PM for the estimated value 0 (PM[0, i+1]), in effect "penalizing" the less likely path with the absolute LLR value. If the LLR value is near 0, then the decision for the value of Ox is unreliable and the PM penalty on the penalized path is small.

For bit-level decoding, each decoding path in a decoding tree produces 2 new decoding paths for every decoded bit, in the case of a 2-by-2 kernel. Each "leaf" decoding path inherits the LLR, partial sum, and PM values from its parent. After the number of decoding paths reaches L, an SCL decoder selects, based on the 2L PMs for the 2L candidate decoding paths, the L paths with the lowest PMs, and drops the other L decoding paths. The selected L paths are sorted using the PMs. For example, path sorting could assign path identifiers (IDs) or indices to the selected paths, with the path having the best PM being assigned a path ID #1, a path with the worst PM being assigned path ID #L, and other paths being assigned path IDs #2 to #(L−1) in accordance with their PMs. New decoding path IDs could be assigned after each sort step, following estimation of each codeword bit.

Figure 5:
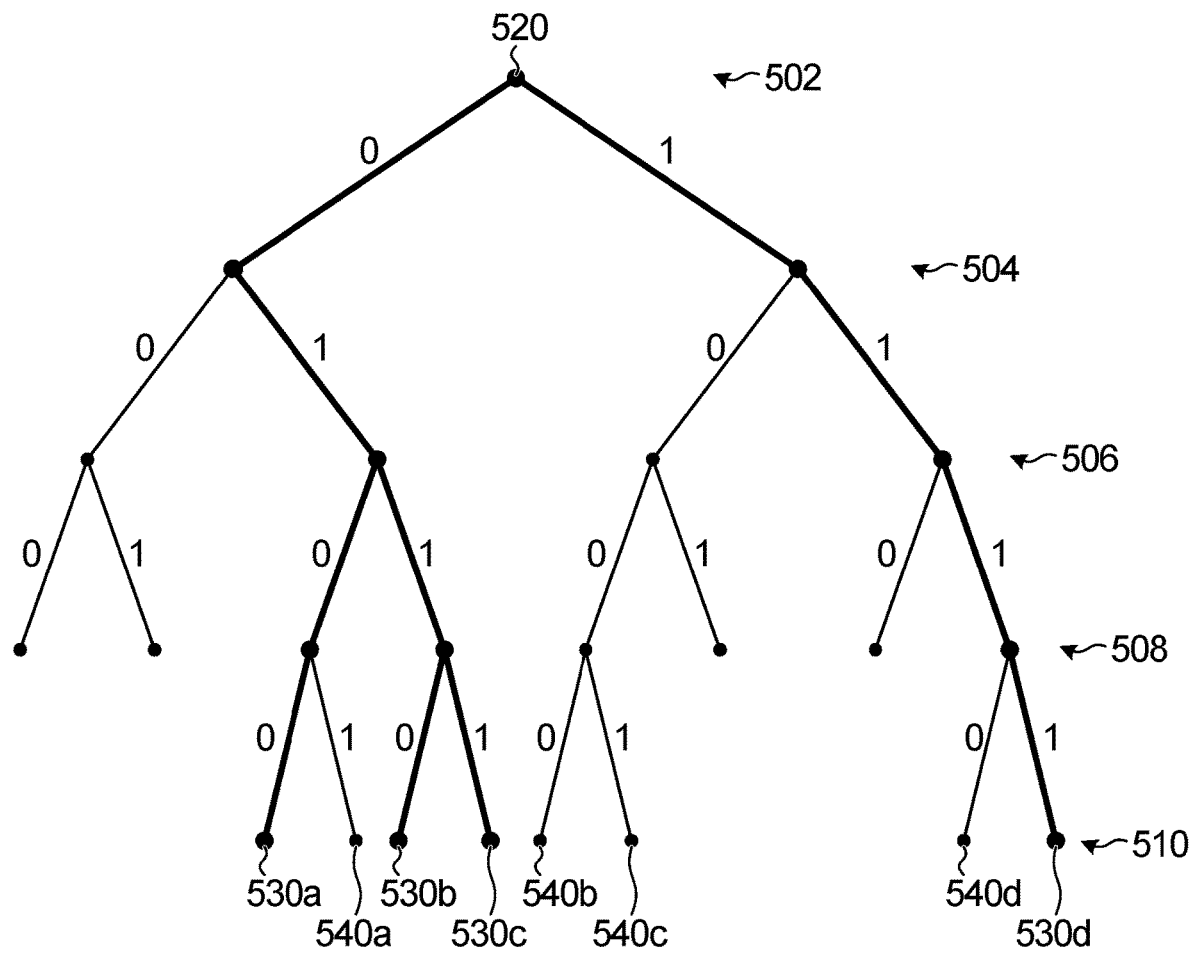
FIG. 5 is a diagram showing a portion of an example decision list tree whose width is limited by a maximum given list size and used in an SCL (Successive Cancellation List) polar decoder.

FIG. 5 is a diagram showing a portion of an example decision list tree used in an SCL polar decoder, whose width is limited by a maximum given list size L. In FIG. 5 the list size L is 4. Five levels 502, 504, 506, 508, 510 of the decision tree are illustrated. Although five levels are illustrated, it should be understood that a decision tree to decode K information bits (possibly including CRC bits) would have K+1 levels. At each level after the root level 502, each one of up to 4 surviving decoding paths is extended by one bit. The leaf or child nodes of root node 520 represent possible choices for a first bit, and subsequent leaf nodes represent possible choices for subsequent bits. The decoding path from the root node 520 to leaf node 530a, for example, represents an estimated codeword bit sequence: 0, 1, 0, 0. At level 508, the number of possible paths is greater than L, so L paths having the highest likelihood (e.g., best PMs) are identified, and the remaining paths are discarded. The decoding paths that survive after the path sort at level 506 are shown in bold in FIG. 5. Similarly, at level 510, the number of possible paths is again greater than L, so the L paths having the highest likelihood (e.g., best PMs) are identified, and the remaining paths are again discarded. In the example shown, the paths terminating in leaf nodes 530a, 530b, 530c, and 530d represent the highest likelihood paths. The paths terminating in leaf nodes 540a, 540b, 540c, 540d are the lower likelihood paths which are discarded.

SCL decoding can be further divided into pure list decoding in which survivor paths with the highest likelihood are selected and CRC-aided SCL (CA-SCL) decoding where CRC bits are used for path selection. SC decoding is a special case of pure list decoding, with list size L=1. A CRC may provide better error correction performance in the final path selection, but is optional in SCL decoding. Other decoding-assistant operations, such as a Parity Check (PC) based on parity or "PC" bits that are included in an input vector, could be used instead of or jointly with CRC in path selection during decoding or in the final path selection.

SCL decoding may improve the performance of a polar code for a limited code size. However, compared with the similar code length and code rates of Low Density Parity Check (LDPC) codes and Turbo codes, SCL decoding may have a worse Block Error Rate (BLER) than well-designed LDPC and Turbo codes. CRC-aided SCL (CA-SCL) decoding may improve the performance of a polar code with a limited code length. For example, a CA-SCL decoder with a list size L=32 could provide for much better performance than LDPC and Turbo codes with similar computational complexity.

In an Additive White Gaussian Noise (AWGN) channel, a polar code in effect divides a channel into N sub-channels. N is referred to as mother code length and is always is power of 2 in an Arikan polar code, which is based on a polar kernel that is a 2-by-2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 6:
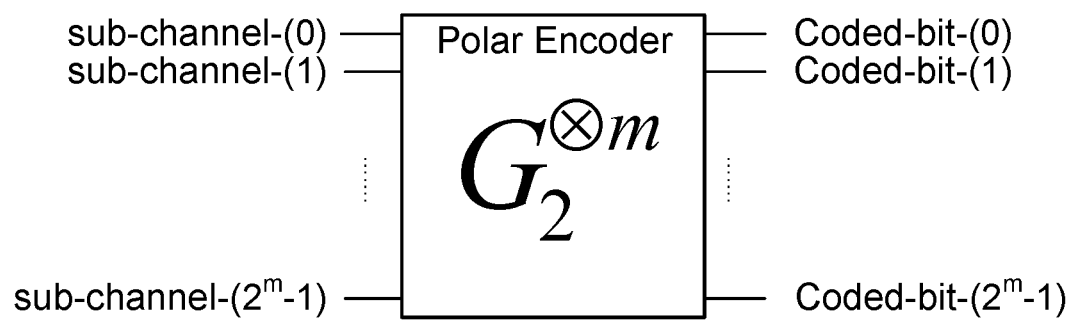
FIG. 6 is a block diagram illustrating an example of a polar encoder based on a 2-by-2 kernel.

Polar encoders based on Kronecker products of a 2-by-2 Arikan kernel $G_2$ are described above. FIG. 6 is a block diagram illustrating an example of a polar encoder based on a 2-by-2 kernel. Sub-channels and coded bits are labeled in FIG. 6, and a channel is divided into N sub-channels by a polar code as noted above. An information block and frozen bits are allocated onto the N sub-channels, and the resultant N-sized vector is multiplied with an N-by-N Kronecker matrix by the polar encoder to generate a codeword that includes N coded bits. An information block includes at least information bits and could also include assistant bits such as CRC bits or PC bits. A sub-channel selector (not shown) could be coupled to the polar encoder to select at least sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels such as prime-number kernels (e.g. 3-by-3 or 5-by-5) or combinations of (prime or non-prime number) kernels to produce higher-order kernels could yield polarization among code sub-channels. Polarization kernels with a different size (or number of inputs) could be generally characterized by code length $N=L^n$, where L is the dimension (i.e., size or number of inputs) of the applied kernel. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or CA-SCL decoding, the polarization phenomenon appears over the synthesized sub-channels. Some synthesized sub-channels have high capacity, and some sub-channels have low capacity. Put another way, some synthesized sub-channels have equivalently high Signal-to-Noise Ratio (SNR) and others have equivalently low SNR. These metrics are examples of characteristics that could be used to quantify or classify sub-channel "reliability". Other metrics indicative of sub-channel reliability can also be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths Ni could instead be computed, and one of the mother code length sequences could be selected for a particular code based on preferred code length. Another possible option involves computing multiple ordered sequences in terms of SNR values, for example, and selecting an ordered sequence based on measured SNR.

There are also several methods to compute sub-channel reliabilities. For example, according to a genie-aided method proposed in R. Pedarsani, "Polar Codes: Construction and Performance Analysis", June 2011, EPFL master project, an encoder encodes a training sequence that is known to the decoder on different sub-channels. The decoder feeds back decoding results to the encoder so that the encoder can compute reliability statistics for every sub-channel, and a well-adapted reliability-vector over the sub-channels is obtained.

Mori R, Tanaka T., "Performance and construction of polar codes on symmetric binary-input memoryless channels", IEEE International Symposium on Information Theory, 2009, 1496-1500, proposes a density evolution (DE) method in which the reliability of a sub-channel is measured using the decoding error probabilities of Belief Propagation decoding, which can be calculated via density evolution. The proposed method is proven to be capacity-achieving for arbitrary symmetric binary erasure channels when used for polar construction. However, because the method relies on iterative calculations of LLR values for each sub-channel, it is computationally complex.

According to a genie-aided method proposed in E. Arikan, "Channel polarization: A method for constructing capacity-achieving codes for symmetric binary-input memoryless channels", IEEE Transactions on Information Theory, 2009, 55(7): 3051-3073, an encoder encodes on different sub-channels a training sequence that is known to the decoder. The decoder feeds back decoding results to the encoder so that the encoder can compute reliability statistics for every sub-channel, and a well-adapted reliability-vector over the sub-channels is obtained. The relative reliabilities for the sub-channels are dependent on the receiving SNR, making this method an SNR-dependent method.

Gaussian-approximation (GA) methods proposed in J. Dai, K. Niu, Z. Si, J. Lin, "Evaluation and Optimization of Gaussian Approximation for Polar Codes", May 2016, and in P. Trifonov, "Efficient design and decoding of polar codes." IEEE Trans. on Communications 60.11 (2012): 3221-3227, assume that every coded bit is subjected to an equal error probability. From the error probability, the reliabilities over the sub-channels are obtained with a density evolution (DE) algorithm. Because this error probability on the coded bits is related to the receiving SNR, this method is SNR-related and is computationally complex.

An SNR-independent polarization weight (PW) method is disclosed in R1-1611254, "Details of the Polar Code Design", Huawei & HiSilicon, 3GPP TSG RAN WG1 Meeting #87. In this method, the reliability of a sub-channel is measured by the corresponding beta-expansion values, which are given by a closed-form formula as a function of the binary representation of the sub-channel index. The reliability measure is SNR-independent, and can lead to a single nested ordered sub-channel sequence for different coding rates and block lengths. The sequence may be calculated offline and stored in memory for use, to provide a lower implementation and computational complexity relative to other methods.

As mentioned above, there are several ways to generate an ordered sequence from a kernel and its generator matrix via calculating the sub-channel reliabilities. Not every way might necessarily lead to a nested sequence, and this nested sequence might not necessarily be unique. Nested ordered sequences could be generated, for example, based on a polarization weight as disclosed in Chinese Patent Application No. CN 201610619696.5, filed on Jul. 29, 2016, or based on a hamming weight as disclosed in U.S. Patent Application No. 62/438,565, filed on Dec. 23, 2016, both of which are entirely incorporated herein by reference. Other techniques could also or instead be used.

Ordered sequence computations can be performed in a number of different ways. For example, the computations could be performed online, producing ordered sequences that can be dynamically adjusted or recomputed based on, for example, observed channel condition. The computations may alternatively be performed offline and in advance to produce pre-computed and static ordered sequences that can be stored and retrieved for use during subsequent coding operations. In yet another alternative, the computations may be performed partially online and partially offline.

In mobile wireless communications, the radio channel is time-varying, and channel conditions may significantly vary in time. It may be impractical to use online sequence computing methods with high computational complexity (e.g. genie-aided, DE and GA-based methods) because those methods may consume significant communication bandwidth and processing resources. Computationally complex methods, such as Genie-aided, DE and/or GA-based methods, are generally performed offline to produce multiple static ordered sequences, for example, in conjunction with fixing a working SNR or reference SNR for different combinations of code length and code rate. However, simple online sequence generation methods such as those disclosed in U.S. Patent Application No. 62/463,128 entitled "APPARATUS AND METHODS OF SPECIFYING ORDERED SEQUENCES OF CODING SUB-CHANNELS" filed on Feb. 24, 2017 and incorporated herein by reference in its entirety may still be preferred, in that they generally consume less memory, and may be more flexible and adaptive to time-varying wireless channel conditions.

It has been found that, among ordered sequences generated by different methods, the ordering of a portion of sub-channels is the same and only some sub-channels are ordered differently in different ordered sequences. In the case of a single, nested ordered sequence, the ordering of sub-channels for any code length is the same as the ordering of those sub-channels for a longer code length. Even for non-nested ordered sequences, only a small number of sub-channels have a different order between ordered sequences for different code lengths.

In C. Schürch, "A partial order for the synthesized channels of a polar code," in Proc. of the IEEE Int. Symposium on Inform. Theory (ISIT), Barcelona, Spain, July 2016, pp. 220-224 and M. Bardet, V. Dragoi, A. Otmani, and J.-P. Tillich, "Algebraic properties of polar codes from a new polynomial formalism," in Proc. of the IEEE Int. Symposium on Inform. Theory (ISIT), Barcelona, Spain, July 2016, pp. 230-234, it is proven that, for polar codes, there exists a universal partial order that holds for any transmission model and is therefore transmission model independent. In other words, the ordering of a portion of sub-channels is the same in different ordered sequences, and only some sub-channels are ordered differently.

A transmission model includes one or more parameters specific to or indicative of a particular transmission scheme, channel or channel condition. Examples of a transmission model include a channel model, type, a transmission/channel quality, for example as expressed in a Channel Quality Index (CQI) report, a noise level, an SNR, etc. Based on the partial order, only approximately a fraction $1/\log^{3/2}(N)$ sub-channels, rather than all N sub-channels, need to be considered for reliability ordering. The partial order provides a "tendency" or "mainstream" view about reliability distribution for a given N. U.S. Patent Application No. 62/463,289 entitled "Apparatus and Methods for Coding Sub-Channel Selection" filed on Feb. 24, 2017 and incorporated herein by reference in its entirety provides an example of sub-channel ordering based on partial order.

FIG. 6A is a block diagram illustrating an example partial order 600 of N=8 sub-channels. Each node in the partial order example of FIG. 6 represents a sub-channel, and each directed edge or arrow between nodes represents relative reliabilities of the sub-channels. In this representation of a partial order, sub-channel ordering and selection may involve ordering and selection of nodes. Node ordering and selection represents one example of how sub-channels may be ordered and selected, and therefore nodes and sub-channels may be referenced interchangeably. It should also be noted that sub-channels correspond to bit positions, and bit positions could include at least information bit positions and frozen bit positions. Features disclosed herein with reference to sub-channels may also or instead apply to bit positions. For example, sub-channel ordering and selection as disclosed herein are equivalent to ordering and selecting bit positions. References to nodes, sub-channels, and bits or bit positions should be interpreted accordingly.

For each edge in a partial order representation, the reliability of its source node is always lower than its destination node for any transmission channel. As can be seen, the edges indicate increasing reliability in the example shown. Partial orders with edges indicating decreasing reliabilities are also possible. In the example partial order of FIG. 6, an edge exists between nodes if the source node binary index can be transformed into the destination node binary index with at least one of the following defined operations:

Operation 1: if the last (least significant) bit of a source node index is 0, changing the 0-bit from 0 to 1, as in the example of nodes 2 and 3, (0, 0, 1, 0)→(0, 0, 1, 1), is indicative of higher reliability for the destination node index (relative to the source node index);

Operation 2: left-swapping a 1 bit in the source node index with a bit position of an adjacent 0 bit, as in the example of nodes 2 and 4, (0, 0, 1, 0)→(0, 1, 0, 0), is indicative of higher reliability for the destination node index (relative to the source node index).

It should be noted that two nodes without an arrow between them can still have a fixed reliability relationship, as long as there exists at least one directed path composed of arrows between the two nodes, e.g., nodes 1 and 4, nodes 2 and 5.

Operations other than or in addition to the above-noted operations may apply in other partial orders.

A partial order is "partial" in the sense that not every node, or every sub-channel which is represented by a node, has a reliability relative to all other nodes that is transmission model independent or otherwise fixed. With reference to FIG. 6A, sub-channels 0, 1, 2 and 5, 6, 7 have a transmission model independent or fixed order or sequence relative to each other and all other sub-channels. From the example partial order in FIG. 6A, it can be seen that sub-channels 3 and 4 both have reliabilities that are higher than the reliability of sub-channel 2 and lower than the reliability of sub-channel 5, but the reliabilities of sub-channels 3 and 4 relative to each other are not transmission model independent and are not otherwise fixed.

FIG. 6B includes block diagrams illustrating two possible ordered sub-channel sequences 610A, 610B, for N=8 sub-channels. An ordered sequence, also referred to herein as an ordered sub-channel sequence, is a path or chain that traverses all nodes. The ordering among nodes 3 and 4, and the sub-channels represented by those nodes, is related to such transmission model parameters or conditions as a working SNR and a specific channel type. With a partial order as shown in FIG. 6A, only the relative reliabilities of nodes 3 and 4 with respect to each other are not fixed in the partial order. All other nodes in the partial order have fixed reliabilities relative to each other and all other nodes.

An ordered sub-channel sequence need not follow all edges in a partial order and may traverse between nodes that are not connected by an edge. However, ordered sub-channel sequences that do not conflict with the partial order may generally be preferred. Coding based on an ordered sub-channel sequence that does not conflict with the partial order may have better performance than similar coding that is based on a sequence that conflicts with the partial order. An ordered sub-channel sequence does not conflict with a partial order if the sequence does not traverse nodes in a manner that conflicts with a directed edge. For example, with reference to FIG. 6B, sequence 610A conflicts with the directed edge that exists between nodes 4 and 5, and thus conflicts with their reliability relationship. This sequence 610A therefore conflicts with the partial order. In contrast, sequence 610B follows relationships indicated by the directed edges, and thus does not conflict with the partial order. This sequence 610B should therefore exhibit better performance than sequence 610A, and may be preferred.

As noted above, because of the absence of partial order conflict, the ordered sub-channel sequence 610B at the bottom in FIG. 6B provides better coding performance at least for Gaussian channels than sequence 610A. However, not all sequences that comply with the partial order may not result in the same performance. For example, a N=8 sub-channel sequence {0, 1, 2, 3, 4, 5, 6, 7} with sub-channels ordered in their natural order might still comply with the partial order but traversal from node 3 to node 4 (as opposed to the opposite) may result is significantly worse performance than with sequence 610B, especially if the N=8 sequence is used to build longer sequences i.e. as N increases.

Figure 6C:
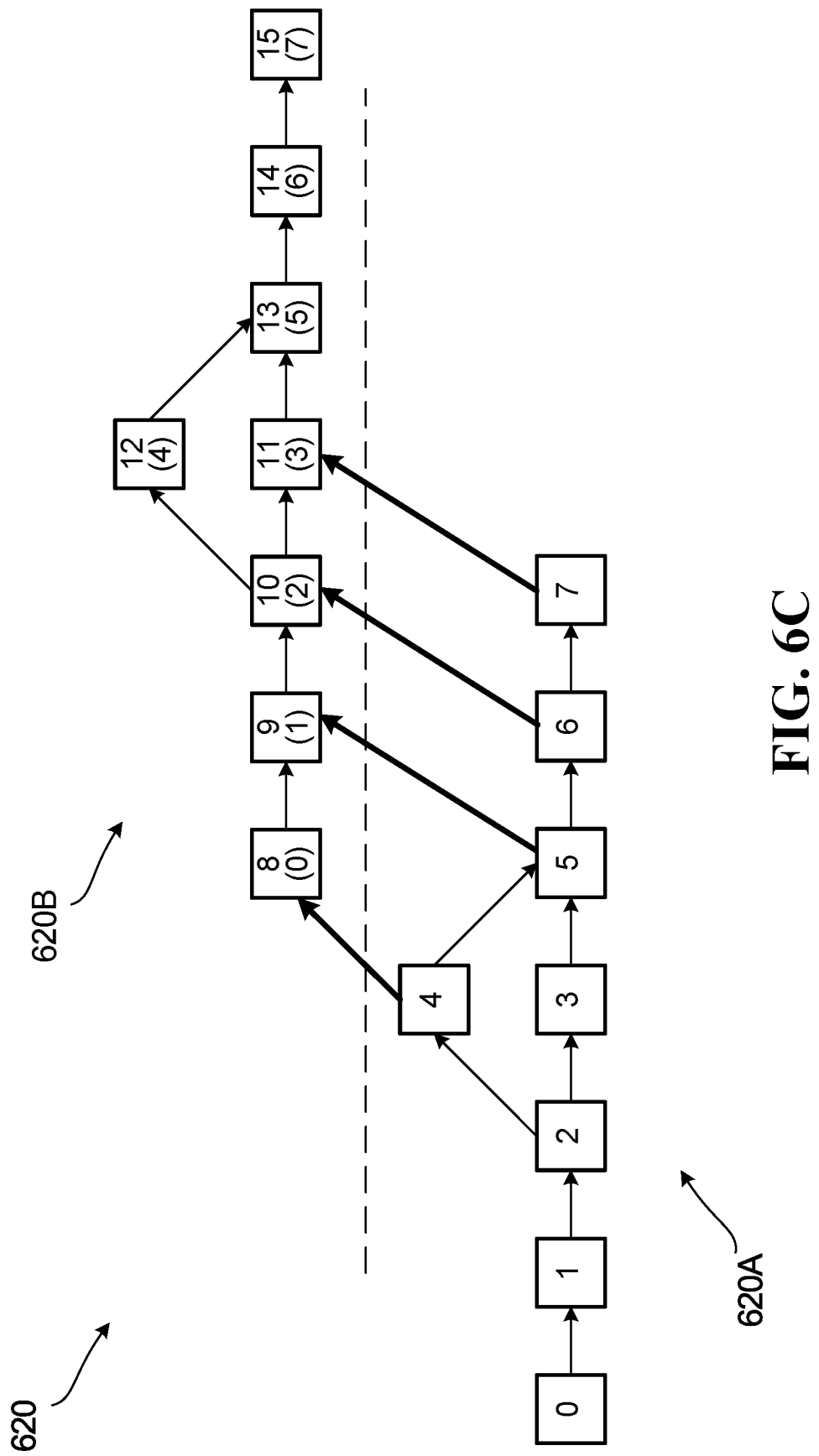
FIG. 6C is a block diagram illustrating an example partial order of N=16 sub-channels.

Consider, for example, the block diagram in FIG. 6C, which illustrates an example partial order 620 of N=16 sub-channels. FIG. 6C also illustrates how an N=8 partial order could be used as a basic element to build a larger partial order for N=16 sub-channels. In FIG. 6C, a first N=8 partial order 620A has nodes labeled with indices 0 to 7. A second N=8 partial order 620B has nodes labeled with indices 8 to 15, with corresponding N=8 partial order indices also included in parentheses. The indices in parentheses are included in the second N=8 partial order 620B to illustrate that both parts of the N=16 partial order are consistent with the N=8 basic partial order element 620A in this example.

The example partial order 620 in FIG. 6C includes directed edges between the two basic N=8 partial orders, 620A, 620B, between nodes 4 and 8, between nodes 5 and 9, between nodes 6 and 10, and between nodes 7 and 11.

The example partial order 620 for N=16 in FIG. 6C could be further extended. For example, two N=16 partial orders 620 could be used to construct an N=32 partial order. Two N=32 partial orders could similarly be used to construct an N=64 partial order, and so on, to recursively build larger partial orders.

In some embodiments, a partial order is structurally symmetric and nested. The structural symmetry of a partial order refers to a property that, for a partial order of N nodes, if a node with index i is changed to index N−1−i (for all $0 \le i < N$) and the directions of all edges are reversed, then the resultant partial order is the same as the original partial order in terms of node and edge structure. For example, the N=32 partial order is structurally symmetric and constructed based on an N=16 partial order, which itself is also structurally symmetric and constructed based on an N=8 partial order (FIG. 6C). Also, from a comparison of the N=16 and N=32 partial orders, it can be shown that nodes 0 to 15 in the N=32 partial order correspond to nodes 0 to 15 in the N=16 partial order, and nodes 16 to 31 in the N=32 partial order also have a node and edge structure consistent with the N=16 partial order. This consistency between partial orders of different sizes is referred to herein as a nested property of partial orders. The N=8 partial orders 620A, 620B in FIG. 6C are similarly consistent with the N=8 partial order node and edge structure in FIG. 6A. Even the N=8 partial order 600 in FIG. 6A could be considered structurally symmetric about a partition that splits the partial order at the edges between nodes 2 and 4 and between nodes 3 and 5, to form subsets $\{0, 1, 2, 3\}$ and $\{4, 5, 6, 7\}$.

Figure 7:
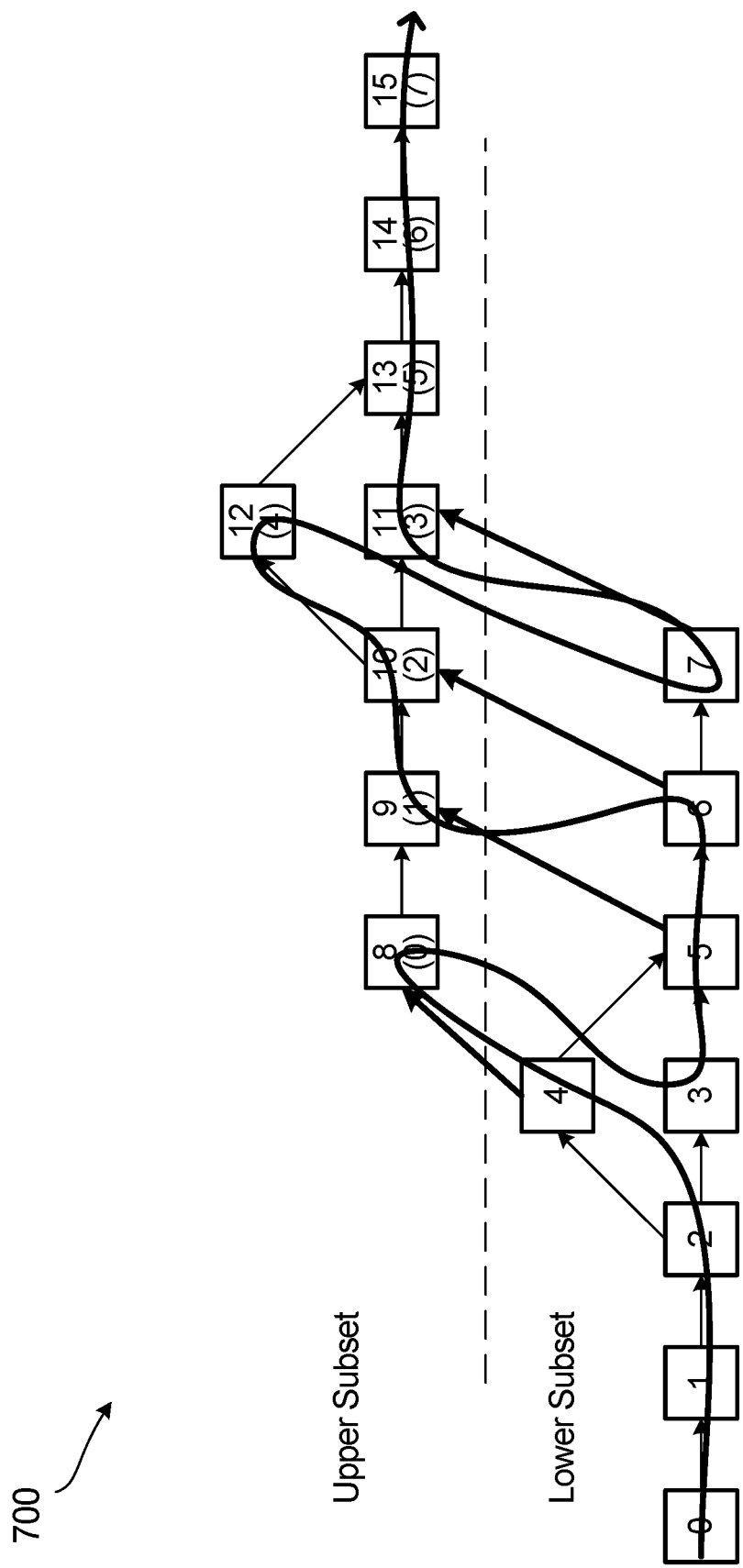
FIG. 7 is a block diagram illustrating a possible ordered sub-channel sequence for N=16 sub-channels.

Turning now to ordered sub-channel sequences, FIG. 7 is a block diagram illustrating a possible ordered sub-channel sequence for N=16 sub-channels that does not conflict with the partial order. Embodiments of the present disclosure could be applied to sub-channel selection based on any of various sizes of partial order (e.g. various values of N), and N=16 is used herein as a non-limiting example. Embodiments could also or instead be applied to sub-channel selection that is not necessarily based on partial orders.

A partial order may specify or define an order in which some nodes or sub-channels have an order or sequence that is fixed (sometimes referred to as "transmission model independent") relative to each other and all other sub-channels. With reference to FIG. 7, nodes or sub-channels 0, 1, 2 and nodes or sub-channels 13, 14, 15 are examples. An ordered sub-channel sequence that traverses these nodes in any other order than shown in the drawing violates the partial order. The other sub-channels in FIG. 7 are in a transmission model dependent or variable part of the partial order, and ordering of these nodes and corresponding sub-channels and bit positions may vary with transmission model parameters such as channel model and SNR, for example. Reliability computations are used to determine an order of such nodes, sub-channels, or bit positions in a complete ordered sequence.

Although a partial order does not provide a complete single ordered sub-channel sequence on its own, a partial order can provide a tendency, anchor, or pillar for the reliability distribution of sub-channels for polar code, for example. In conjunction with a partial order, a higher resolution sorting, ordering, or ranking function could be used to form a chain or determine an ordered sub-channel sequence.

In some implementations, the higher resolution function could be a metric function that is used to compute a metric for each node and/or corresponding sub-channel. Although a binary expansion function is disclosed herein by way of example, other binary expansion functions such as described in Chinese Patent Application No. CN 201610619696.5, filed on Jul. 29, 2016 referred to above or in U.S. Patent Application No. 62/463,128, filed on Feb. 24, 2017, which is entirely incorporated herein by reference could be used. Generally, any function that depends on fixed or variable parameter(s) of a given transmission model (e.g. channel type, SNR, etc.) and/or code block length can be used. As described herein, any such function can be used to, for example, determine an ordered sub-channel sequence and/or to select K information sub-channels or N−K frozen sub-channels.

Like a partial order, an ordered sub-channel sequence or chain could also be symmetric and/or nested, for example, if a binary expansion associated polynomial (such as described in Chinese Patent Application No. CN 201610619696.5 referred to above) is used to compute a node or sub-channel reliability metric based upon which nodes and sub-channels are ordered. Other metric functions could be used in other embodiments.

With a nested sequence, a shorter ordered sub-channel sequence can be selected from a longer ordered sub-channel sequence. For example, an N=8 ordered sub-channel sequence can be selected by selecting sub-channel indices less than i=8 from an N=16 ordered sub-channel sequence $\{0, 1, 2, 4, 8, 3, 5, 6, 9, 10, 12, 7, 11, 13, 14, 15\}$, which is $\{0, 1, 2, 4, 3, 5, 6, 7\}$. In a symmetric sequence, i.e., $$\text{seq}\{i\}+\text{seq}\{N+1-i\}=N-1,$$

where i=1, 2, . . . , N, and seq{i}, seq{N+1−i} are sub-channel indices of {i}th and {N+1−i}th entries in an ordered sub-channel sequence. According to this property, given one half of an ordered sub-channel sequence, a full ordered sub-channel sequence can be directly obtained and in this sense the full ordered sub-channel sequence is symmetric.

The ordered sub-channel sequence 700 shown in FIG. 7 does not violate the partial order, and could be determined according to any of various metric or sorting/ordering functions. This illustrated sequence represents just one example, and different sequences could be determined using different functions to rank or order sub-channels, and/or for different code lengths N, different SNRs, etc.

Code design according to embodiments disclosed herein involves selection of K (or N−K) out of a total of N sub-channels or bit positions as information (or frozen) sub-channels or bit positions. In the N=16 partial order shown in FIG. 7, the N=8 partial orders could be considered component or constituent partial orders or subsets of the full set of N=16 sub-channels. In this sense, sub-channel or bit position selection for information bits, for example, could involve determining how many input bit positions or sub-channels K0 are allocated or selected from the range [0~7], and how may input bit positions or sub-channels K1, with K1=K−K0, are allocated or selected from the range [8~15]. More generally, this is equivalent to determining K0 and K1 from ranges [0~N/2−1] and [N/2, N−1].

Figure 8:
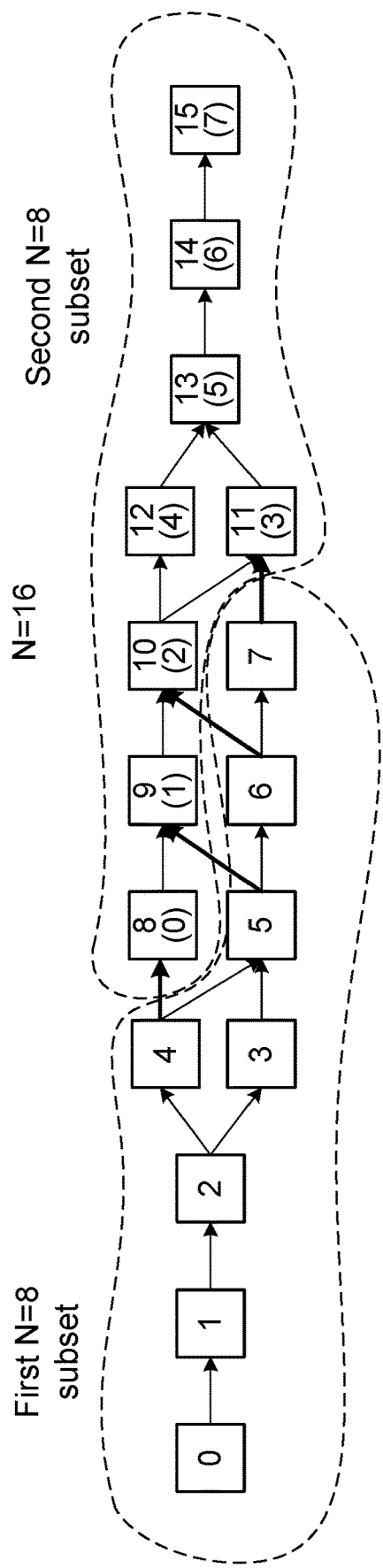
FIG. 8 is a block diagram illustrating a different representation of a partial order for N=16 sub-channels.

The "Upper" and "Lower" subset labels in FIG. 7 are simply for ease of reference. Embodiments are not in any way limited to subsets that have a particular position relative to each other in a particular type of partial order representation. Other partial order representations could illustrate subsets of N sub-channels side by side, for example. FIG. 8 is a block diagram illustrating a different representation of a partial order for N=16 sub-channels, as an example of side by side subsets, which are labelled as a first N=8 subset and a second N=8 subset. It should also be noted that N/2-sized subsets of a set of N sub-channels is also an illustrative example for coding based on a 2-by-2 kernel. Other numbers and/or sizes of subsets could be used in embodiments for different kernel sizes.

In FIG. 7, the complete ordered sub-channel sequence, in decreasing reliability order as an example, is [15, 14, 13, 11, 7, 12, 10, 9, 6, 5, 3, 8, 4, 2, 1, 0]. This ordered sub-channel sequence is nested, in that it specifies a sub-channel sequence of [7, 6, 5, 3, 4, 2, 1, 0] from the lower subset, in the same order that those sub-channels would appear in a preferred N=8 sub-channel sequence. Similarly, the full ordered sub-channel sequence specifies a sub-channel order of [15, 14, 13, 11, 12, 10, 9, 8] from the upper subset, in an order consistent with the N=8 sequence: [7+8, 6+8, 5+8, 3+8, 4+8, 2+8, 1+8, 0+8]. The N=8 ordered sub-channel sequence repeats for each subset, and sub-channels from the upper and lower subsets "interweave" with each other in the N=16 ordered sub-channel sequence while still remaining consistent with the relationships defined by the full N=16 partial order and the constituent N=8 partial order of the subsets.

In this N=16 example, the full ordered sub-channel sequence [15, 14, 13, 11, 7, 12, 10, 9, 6, 5, 3, 8, 4, 2, 1, 0] can be rewritten as [7+8, 6+8, 5+8, 3+8, 7, 4+8, 2+8, 1+8, 6, 5, 3, 0+8, 4, 2, 1, 0], with underlined indices in the sequence representing sub-channels from the upper subset in FIG. 7 and non-underlined indices in the sequence representing sub-channels from the lower subset. An ordered number sequence, also referenced herein as an interweaver or interweaving sequence, could be used to represent the ordered sub-channel sequence as a sequence of numbers of sub-channels from the upper and lower subsets that appear in the order specified by the ordered sub-channel sequence. An interweaving sequence itself is also ordered in terms of reliability. The full ordered sub-channel sequence includes indices of 4 upper-subset sub-channels, then 1 lower-subset sub-channel, then 3 upper-subset sub-channels, then 3 lower-subset sub-channels, then 1 upper-subset sub-channel, then finally 4 lower-subset sub-channels. An ordered number sequence of [4, 1, 3, 3, 1, 4] can therefore represent, in just six numbers, an N=16 ordered sub-channel sequence. The numbers 4, 1, 3, 3, 1, 4, when added together, total N=16 sub-channels. Such an ordered number sequence is significantly shorter than the full ordered sub-channel sequence, and could be stored in memory, such as in a lookup table.

An interweaving sequence could also be considered as specifying a relative "rate" of progression through nodes or sub-channels in each subset. In order of decreasing reliability, four nodes in the upper partial order are traversed, then one node in the lower subset, then three more nodes in the upper subset, and so on. In the example of two subsets as in FIG. 7, the numbers in the ordered number sequence alternate between subsets, specifying a number of sub-channels that appear in the ordered sub-channel sequence from one subset and then a number of sub-channels that next appear in the ordered sub-channel sequence from the other subset. Ordered number sequences for other embodiments may similarly alternate between or cycle through different subsets.

Other types of ordered number sequences are also possible. Considering the above example N=16 ordered sub-channel sequence [15, 14, 13, 11, 7, 12, 10, 9, 6, 5, 3, 8, 4, 2, 1, 0], an alternative ordered number sequence could be [0 3 5 7 11 11], where not all consecutive sections or numbers of sub-channels from each subset are explicitly indicated. In this example, only sections of sub-channels from the upper subset are explicitly indicated with every 2 numbers indicating the left border and right border of a continuous section of the upper subset. Specifically, the first continuous section (length 4) from the upper subset is [15 14 13 11], where the left border is index 0 for the first entry in the ordered sub-channel sequence, and the right border is index 3 for the fourth entry in the sequence. Similarly, the left border of the second continuous section [12, 10, 9] of length 3 is 5, and the right border is 7, etc. An alternative could be [4, 4, 8, 10, 12, 15], where sections from the upper subset are implied and only sections of sub-channels from the lower subset are explicitly indicated.

Interweaving sequences of the first type described above are disclosed herein as an illustrative example of ordered number sequences. Other types of ordered number sequences with explicit and/or with implicit indications of sub-channel sections such as in border-type sequences, could be used in other embodiments. Ordered number sequences as disclosed by way of example herein represent how sub-channels in subsets are alternated in a larger or longer ordered sub-channel sequence. Sequences of any of various types could be used directly in determining sub-channel ordering and/or in selecting information sub-channels, frozen sub-channels, and possibly other types of sub-channels, or be transformed from one type of ordered number sequence into another type of ordered number sequence, such as an ordered number sequence disclosed herein as an illustrative example.

In addition, interweaving sequences or ordered number sequences are not just applicable to ordered sub-channel sequences that specify an order of sub-channel reliabilities. Sub-channel sequences indicating an ordering according to one or more other sub-channel metric(s) could also or instead be represented by interweaving sequences, as long as those sub-channel sequences could be recovered from the corresponding interweaving/ordered number sequences.

Turning now to a more detailed example, an ordered sub-channel sequence for N=8 can be used to construct an ordered sub-channel sequence for N=16. Given an ordered sub-channel sequence of N8=[7, 6, 5, 3, 4, 2, 1, 0], then a further sequence N8'=[7+8, 6+8, 5+8, 3+8, 4+8, 2+8, 1+8, 0+8] can be computed. In practice, this could involve applying an OR operation between each sub-channel index in N8 and a value 0xb1000, to compute N8'. Based on an ordered number sequence [4, 1, 3, 3, 1, 4], for example, each number is read from the ordered number sequence, in the order in which the numbers appear in that sequence:

If the number that is read from the ordered number sequence is an underlined number (or has an even index or position 0, 2, 4, . . . in the ordered number sequence), then that number of elements are read from N8' and appended to an N=16 ordered sub-channel sequence;

If the number that is read from the ordered number sequence is not an underlined number (or has an odd index or position 1, 3, 5, . . . in the ordered number sequence), then that number of elements are read from N8 and appended to the N=16 ordered sub-channel sequence.

Figure 9:
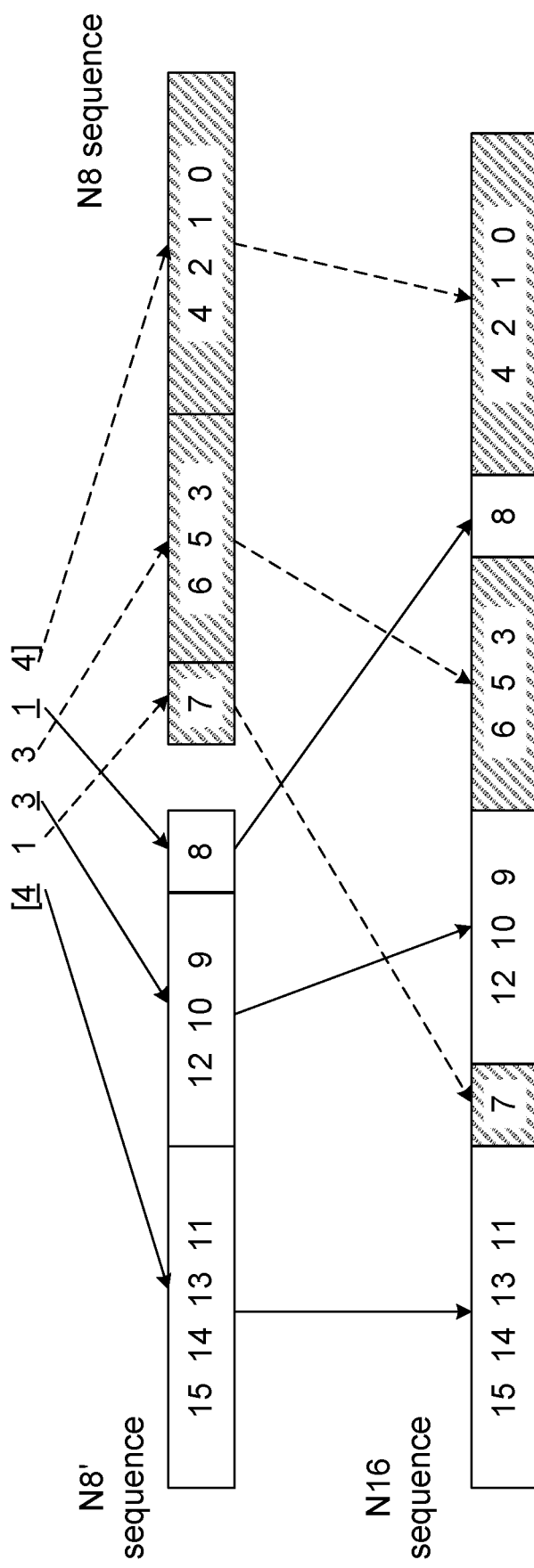
FIG. 9 is a block diagram illustrating generation of an N=16 ordered sub-channel sequence from two N=8 ordered sub-channel sequences.

FIG. 9 is a block diagram illustrating generation of an N=16 ordered sub-channel sequence from two N=8 ordered sub-channel sequences. In this example of N8, N8', and the ordered number sequence above, the first number that is read from the ordered number sequence (4) is underlined, and has an even index (0) in the ordered number sequence. That number (4) of elements from the ordered sub-channel sequence N8' populate the first 4 positions of an N=16 ordered sub-channel sequence, such that the N=16 ordered sub-channel sequence begins [7+8, 6+8, 5+8, 3+8, . . . ], or equivalently [15, 14, 13, 11, . . . ]. The second number that is read from the ordered number sequence (1) is not underlined, and has an odd index (1) in the ordered number sequence. That number (1) of elements from the ordered sub-channel sequence N8' populate the next position of the N=16 ordered sub-channel sequence, such that the N=16 ordered sub-channel sequence is extended to [15, 14, 13, 11, 7, . . . ]. The next number that is read from the ordered number sequence (3) is underlined, and has an even index (2) in the ordered number sequence. The next 3 elements from the ordered sub-channel sequence N8', after the elements that have already been used to populate the N=16 ordered sub-channel sequence, are appended to the sequence such that the N=16 ordered sub-channel sequence is extended to [15, 14, 13, 11, 7, 12, 10, 9, . . . ], and so on, to extend an N=8 ordered sub-channel sequence to an N=16 sub-channel sequence using an ordered number sequence.

An N=16 ordered sub-channel sequence can be extended in a similar manner to an N=32 ordered sub-channel sequence using an ordered number sequence of [5, 1, 5, 1, 1, 2, 1, 1, 2, 1, 1, 5, 1, 5]. Further extension using N=32 or longer ordered sub-channel sequences and other ordered number sequences are also contemplated in other embodiments.

In this example of recursive or iterative extension, the N=8 ordered sub-channel sequence of [7, 6, 5, 3, 4, 2, 1, 0] is a basic element or "seed" ordered sequence. The interweaving sequences for extension up to N=64 are as follows:

| N -> 2*N | Interweaving Sequence |
|---|---|
| N = 8 -> N = 16 | half: [4, 3, 1] or [4 1 3]<br>full: [4, 1, 3, 3, 1, 4]) |
| N = 16 -> N = 32 | half: [5, 5, 1, 1, 2, 1, 1] or [5, 1, 5, 1, 1, 2, 1]<br>full: [5, 1, 5, 1, 1, 2, 1, 1, 2, 1, 1, 5, 1, 5]) |
| N = 32 -> N = 64 | half: [7, 7, 1, 2, 1, 3, 1, 2, 1, 1, 1, 1, 1, 1, 1, 1] or<br>[7, 1, 7, 1, 1, 1, 2, 1, 1, 1, 3, 1, 1, 1, 2, 1]<br>full: [7, 1, 7, 1, 1, 1, 2, 1, 1, 1, 3, 1, 1, 1, 2, 1, 1, 2, 1, 1, 1, 3, 1, 1, 1, 2, 1, 1, 1, 7, 1, 7] |
| ... | ... |

The interweaving sequences in the table above are symmetric ordered number sequences. Half of each sequence could be stored in memory. Each of the first example half sequences above could be used to build a complete interweaving sequence by reversing the order of the entries in the stored half-sequence and combining the stored and reversed sequences by alternating between entries from those sequences. Each of the second example half sequences above could be used to build a complete interweaving sequence by reversing the order of the entries of the half sequence, [4 1 3] for example, and combining the two half-sequences directly, as [4 1 3] [3 1 4] for example, to build the full interweaving sequence [4 1 3 3 1 4]. In other embodiments, different sequences, including non-symmetric sequences, could be used.

Full interweaving sequences could be stored in memory, and could still be shorter than the corresponding full ordered sub-channel sequences. The above N=64 interweaving sequence, for example, includes only 32 numbers. The total sum of those numbers is 64, to specify 64 sub-channels in total, but the full 64 sub-channel order is specified using only 32 numbers in this example. Storing only half of the interweaving sequence in this example could further conserve storage space in that the full 64 sub-channel order is specified using only 16 numbers in the half sequence.

In an embodiment, to fully represent an N=64 sequence, N=64→32→16->8 interweaving sequences (or half sequences if the sequences are symmetric) and an N=8 ordered sub-channel sequence are stored, for a total of 34 numbers with symmetric sequences. In this example of storing half sequences, there are 16 numbers in the 64->32 half sequence, 7 numbers in the 32→16 half sequence, 3 numbers in the 16→8 half sequence, and 8 numbers in the N=8 ordered sub-channel sequence, for the total of 34 numbers referenced above. Also, in an interweaving method based on an N=8 basic ordered sub-channel sequence and up to N=64→32 interweaving sequences, the maximum possible value in an interweaving sequence and the basic ordered sequence (N=8) could be 7, if indices are from 0 to 7. Numbers up to a value of 7 could be represented by 3 bits. If a complete N=64 ordered sub-channel sequence were stored, then 64 numbers of at least 6 bits ($63=2^6-1$) in length would be stored. This illustrates that memory savings could be realized even if multiple interweaving sequences and a basic ordered sub-channel sequence are stored instead of a full-length ordered sub-channel sequence.

Figure 9A:
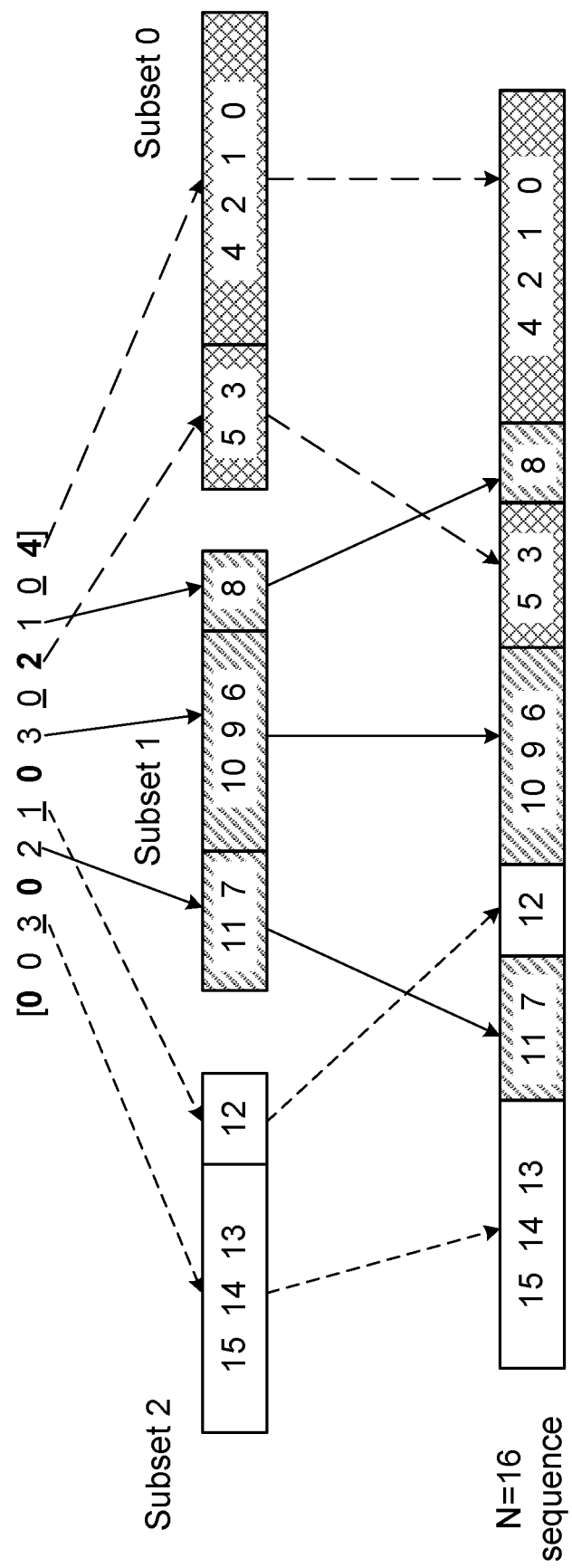
FIG. 9A is a block diagram illustrating generation of an N=16 ordered sub-channel sequence from more than two ordered sub-channel sequences.

In some other embodiments, the number of sub-channel sequences or subsets is not limited to 2. More than 2 subsets of an ordered sub-channel sequence could exist, and the sub-channels in a larger sub-channel sequence could alternate between different subsets in an order as specified by one or more ordered number sequences. FIG. 9A is a block diagram illustrating generation of an N=16 ordered sub-channel sequence from more than two ordered sub-channel sequences.

In FIG. 9A, consider the above example N=16 ordered sub-channel sequence [15, 14, 13, 11, 7, 12, 10, 9, 6, 5, 3, 8, 4, 2, 1, 0], which could be decomposed into 3 disjoint sub-channel subsets with the following ordering: [5, 3, 4, 2, 1, 0], [11, 7, 10, 9, 6, 8] and [15, 14, 13, 12]. One ordered number sequence could be used to represent this ordered sub-channel sequence, e.g., [0, 0, 3, 0, 2, 1, 0, 3, 0, 2, 1, 0, 4, 0, 0]. In this ordered number sequence, the ith element represents the number of sub-channels from the jth subset, where i counts from 0, j={0, 1, 2}, and j equals to i mod 3. In other words, the indices or positions of the ordered number sequence are pre-allocated to different subsets and the numbers corresponding to one subset only occur in the indices or positions that are allocated to that subset. In this example, the numbers corresponding to subset 0 could only occur in indices 0, 3, 6, . . . , the numbers corresponding to subset 1 occur in indices 1, 4, 7, . . . , and the numbers corresponding to subset 2 occur in indices 2, 5, 8, . . . . Thus, as indicated by the above ordered number sequence, in the ordered sub-channel sequence, 3 sub-channels (15, 14, 13) from subset 2 occur first, then 2 sub-channels (11, 7) from subset 1 occur, then 1 (12) from subset 3, then 3 (10, 9, 6) from subset 1, and so on. Note that any zeros at the end of an ordered number sequence could be left out without any information loss, i.e., [0, 0, 3, 0, 2, 1, 0, 3, 0, 2, 1, 0, 4] as shown in FIG. 9A, without the two trailing zeros that are listed after the entry "4" in the ordered number sequence referenced above.

Figure 9B:
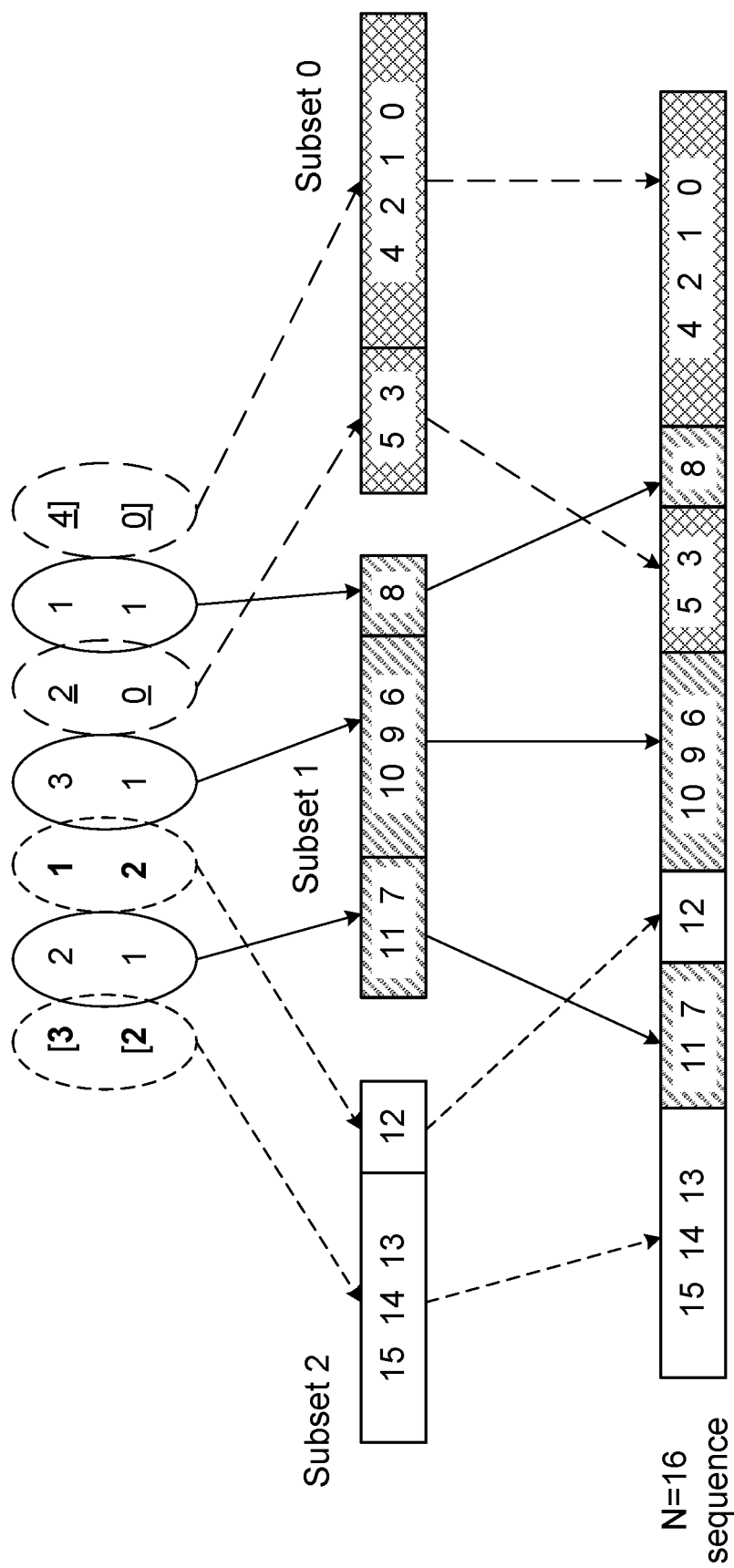
FIG. 9B is a block diagram illustrating generation of an N=16 ordered sub-channel sequence from more than two ordered sub-channel sequences using more than one ordered number sequence.

In another embodiment, more than 1 ordered number sequence could jointly represent one ordered sub-channel sequence. FIG. 9B is a block diagram illustrating generation of an N=16 ordered sub-channel sequence from more than two ordered sub-channel sequences, and using more than one ordered number sequence. FIG. 9B shows the same N=16 ordered sub-channel sequence and subsets as FIG. 9A. The sub-channel sequence could be represented by two ordered number sequences jointly, i.e., [3, 2, 1, 3, 2, 1, 4] and [2, 1, 2, 1, 0, 1, 0]. Each number in the first ordered number sequence represents a number of sub-channels, and the corresponding element in the second ordered number sequence indicates the subset from which each number of sub-channels comes. For example, "3" and "2" are the first numbers from the first ordered number sequence and the second ordered number sequence, respectively, which indicate 3 sub-channels (15, 14, 13) from subset 2 occur first, then the next elements "2" and "1" in the first and second ordered number sequences indicate that the next 2 sub-channels (11, 7) come from subset 1, and so on.

In the examples shown in FIGS. 7, 9, 9A, and 9B, the longer or larger sub-channel sequence alternates between subsets multiple times. In FIG. 9B, for example, the N=16 ordered sub-channel sequence, and the ordered number sequences, alternate from subset 2 to subset 1, then back to subset 2 and to subset 1 again, and similarly from subset 1 to subset 0, then back to subset 1 and to subset 0 again. It should be noted, however, that a longer subset could alternate between subsets only once. For example, for the above N=16 ordered sub-channel sequence [15, 14, 13, 11, 7, 12, 10, 9, 6, 5, 3, 8, 4, 2, 1, 0], if three disjoint subsets are ordered as [3, 8, 4, 2, 1, 0], [12, 10, 9, 6, 5], and [15, 14, 13, 11, 7], then the ordered number sequence [0, 0, 5, 0, 5, 0, 6] in an embodiment consistent with FIG. 9A or the ordered number sequences [5, 5, 6] and [2, 1, 0] in an embodiment consistent with FIG. 9B could be used to represent the N=16 ordered sub-channel sequence, without alternating multiple times between the same subsets of sub-channels.

Figure 9C:
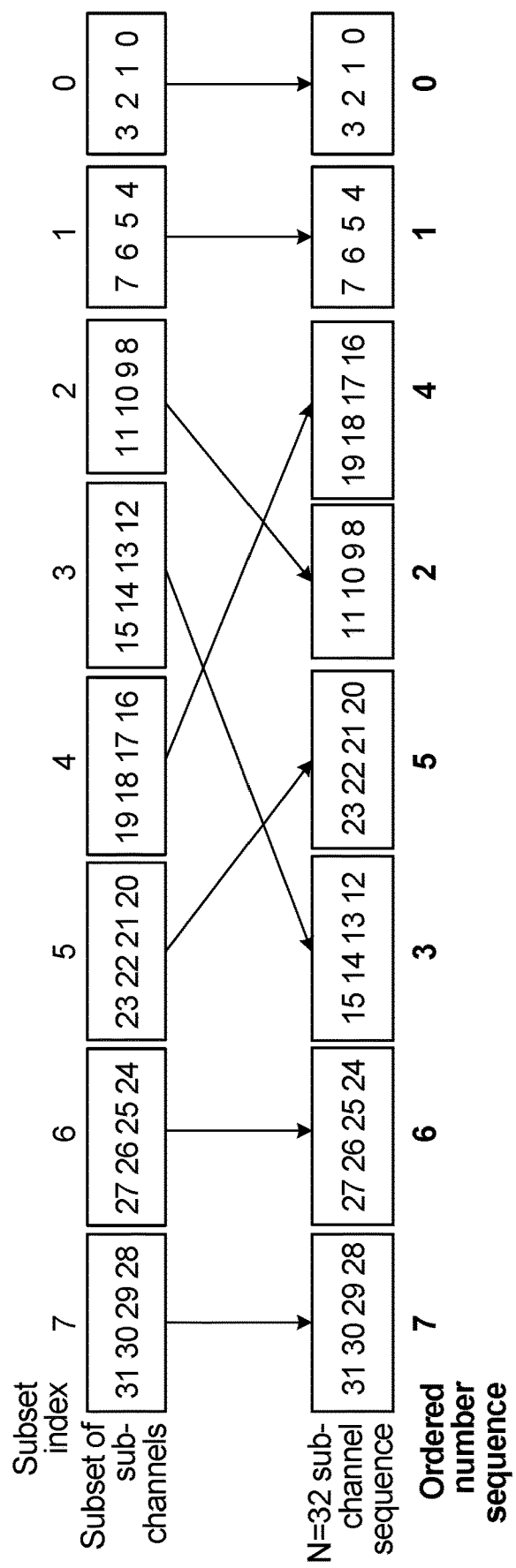
FIG. 9C is a block diagram illustrating generation of an N=32 ordered sub-channel sequence from 8 sub-channel sequences of length 4.

This single-alternation principle could be extended even further. For example, when the number of sub-channels in each subset is equal, and the sub-channel ordering in each subset could be generated from the same basic ordering (e.g. based on a particular metric or function or based on an increasing/decreasing order of sub-channel indices (i.e. a natural order)), the ordered number sequence(s) could be simplified into just one shorter ordered sequence of subset indices. FIG. 9C is a block diagram illustrating generation of an N=32 ordered sub-channel sequence from 8 sub-channel sequences that specify sub-channel order for 8 sub-channel subsets, with each subset having 4 sub-channels. The ordering of sub-channels in subset i is [3+4*i, 2+4*i, 1+4*i, 4*i], where i=0, 1, 2, . . . , 7. In other words, the sub-channel ordering of each subset could be generated to have the same ordering [3, 2, 1, 0]. According to the ordered sub-channel sequence, the ordered number sequence used to represent the ordered sub-channel sequence is [7, 6, 3, 5, 2, 4, 1, 0], where each element in this ordered number sequence indicates a subset index, or equivalently all of the 4 sub-channels from one subset, rather than a number of sub-channels within a subset.

On-the-fly computation of ordered sub-channel sequences may be feasible, using the techniques disclosed herein. According to one prior technique, an ordered sub-channel sequence is generated by first calculating reliabilities of each sub-channel, and then sorting all of the sub-channels to get a complete ordered sub-channel sequence. The reliability calculation can be complicated, involving exp( ) functions and sorting for example, which can make it difficult to generate ordered sub-channel sequences online for any given (N,K). Ordered sub-channel sequences are therefore often generated offline and stored in memory. According to embodiments of the present disclosure, given (N,K) and based on a seed or basic ordered sub-channel sequence and a series of stored interweaving sequences, a complete ordered sub-channel sequence of any length could be generated online (or "on-the-fly") as needed. Ordered sub-channel sequence generation could involve only compare operations, without more complex computations of reliabilities for all sub-channels followed by sub-channel sorting. Generation of ordered sub-channel sequences from a basic sequence and one or more interweaving sequences can be very simple and fast relative to prior techniques.

Further computation complexity savings could be realized, for example, in the case of a large sequence N and low coding rate. In this situation, information bits or sub-channels tend to be allocated at higher indices. This property could be exploited when decomposing from N to N/2 or other sizes of sub-channel subsets for example. Positions from 0 to N/2−1, or another minimum index or position, could be ignored because no information bits or sub-channels are expected to be allocated to those positions. This technique could also be applied in decomposing to smaller subsets as well.

In general, according to aspects of the present disclosure, certain sub-channels are allocated or selected as information sub-channels and frozen sub-channels. A sub-channel allocation pattern may be determined or established as a function of {K, N} where K is the number of information sub-channels or an information block length for encoding, and N is the code length. Typically, both an encoder and a decoder will produce or use the same sub-channel allocation pattern so that the encoded information can be properly decoded.

In some embodiments, given an ordered sub-channel sequence, an ordered number sequence that also represents the ordered sub-channel sequence with fewer values can be determined. Subsets of sub-channels may be decomposed into smaller subsets, and information sub-channels or bit positions may be selected based on a corresponding interweaving sequence. This is described by way of example below, with reference to FIG. 10, which is a block diagram illustrating an example of sub-channel selection. Although the labels in FIG. 10 refer to bits, as noted herein selection of information bits or bit positions is equivalent to selecting sub-channels.

Figure 10:
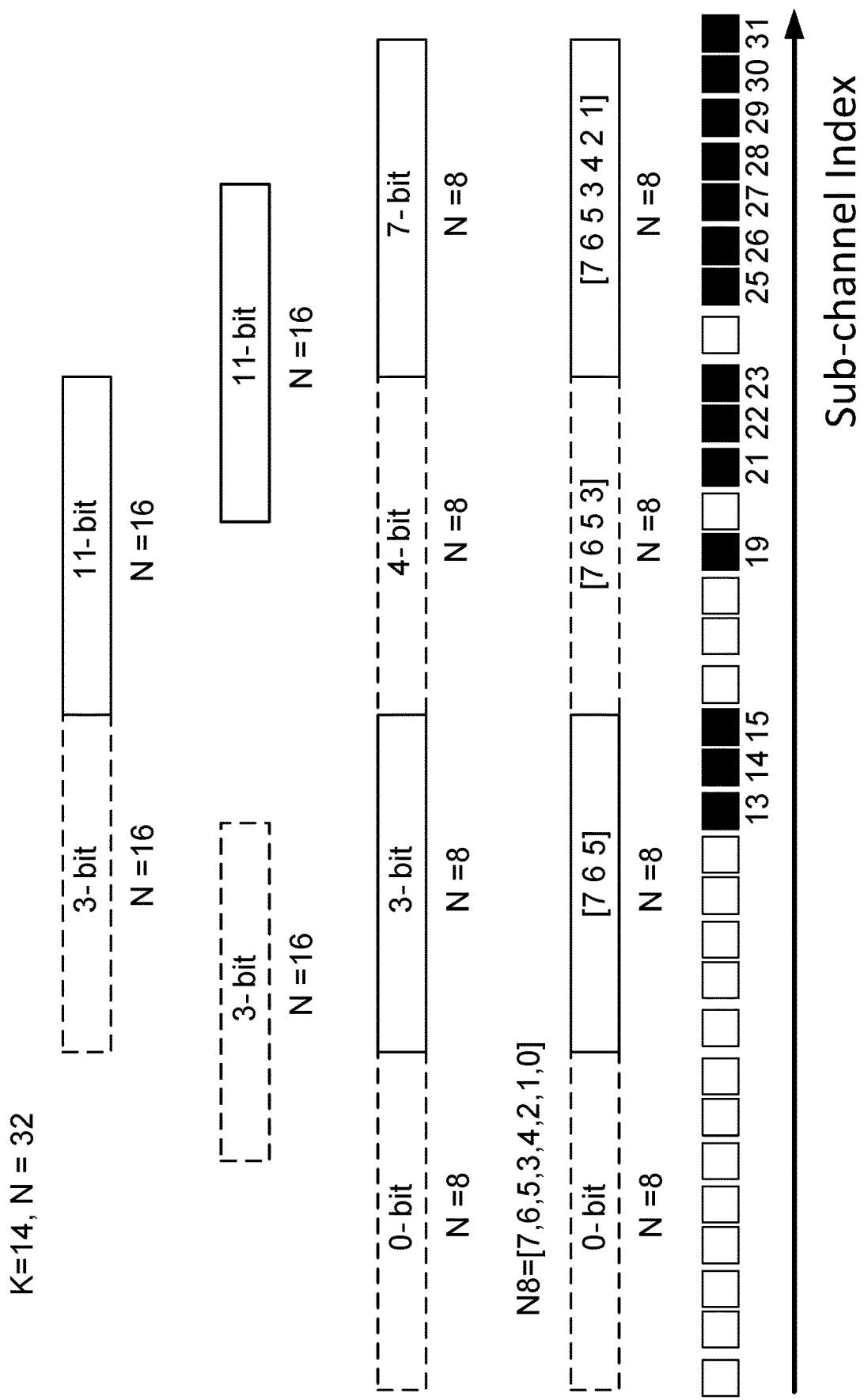
FIG. 10 is a block diagram illustrating an example of sub-channel selection without rate matching (or puncturing/shortening).

FIGS. 7, 9, 9A, and 9B illustrate construction of longer ordered sub-channel sequences from a shorter sequence, whereas FIG. 10 illustrates another possible use of interweaving sequences, for example to divide K sub-channels to be selected from a longer ordered sub-channel sequence into two or more parts, with each part to be selected from shorter ordered sub-channel sequences. As noted above, the shorter ordered sequences can be ordered in many different ways, including for example based on a reliability metric or a natural order of the sub-channel indices. Either of these embodiments could be used, for example, to select K sub-channels for bits of interest, but these embodiments work in different ways. In using a shorter ordered sub-channel sequence to construct a longer one (e.g., FIG. 9), a basic ordered sub-channel sequence and one or more interweaving sequences are used to first establish a full ordered sub-channel sequence with a target length, from which the K sub-channels can be directly selected. In embodiments in which K sub-channels are divided into multiple parts for selection from shorter ordered sub-channel sequences (e.g., FIG. 10), a basic ordered sub-channel sequence and one or more interweaving sequences are used to first distribute the K sub-channels to be selected into a group of sub-channel subsets, with each subset having the basic ordered sub-channel sequence. In this way, a problem of selecting sub-channels from a large N ordered sub-channel sequence can be simplified into parallel selection of sub-channels from multiple shorter basic ordered sub-channel sequences.

Both of these examples make use of one or more interweaving sequences and could be used to select sub-channels for different purposes (for information bits, frozen bits, and/or other types of bits such as assistant bits). However, the example shown in FIG. 10 does not require the entire sub-channel sequence of length N to be known or generated. Given the number of sub-channels to select, one or more interweaving sequences and a seed or basic ordered sub-channel sequence, the number of sub-channels can be selected by decomposing N down to the basic sequence length.

The approaches illustrated by way of example in FIGS. 7, 9, 9A, and 9B to generate a longer ordered sub-channel sequence from a shorter ordered sub-channel sequence may provide for computation of a complete ordered sub-channel sequence on the fly, for example, with potentially reduced complexity and reduced memory space and costs compared to saving the whole sequence. After generating a complete sequence, a determination can be made as to which positions or sub-channels should be allocated to information bits, for example. The approach illustrated in FIG. 10 provides for sub-channel selection without the need to know the complete ordered sub-channel sequence of length N.

Considering the example in FIG. 10 in more detail, K=14 and N=32. At the top of FIG. 10, based on the interweaving sequence [5, 1, 5, 1, 1, 2, 1, 1, 2, 1, 1, 5, 1, 5] that specifies an N=32 ordered sub-channel sequence in terms of numbers of sub-channels from subsets of N=16 sub-channels, a series of numbers in the interweaving sequence that, in total, provide at least K sub-channels are determined. Because 5+1+5+1+1+2=15>=K=14, and the interweaving sequence is also ordered in terms of reliability as noted above, we can concentrate on the [5, 1, 5, 1, 1, 2] part of the interweaving sequence. The underlined 5+5+1 entries sum to 11, meaning that 11 of these 15 sub-channels are in the N=16 position area or subset [16, 17, 18, . . . , 31]. The underlined entries in the portion of the interweaving sequence that is of interest do not include the last entry (the non-underlined 2) in that portion, and therefore all 11 of the sub-channels in the [16, 17, 18, . . . , 31] subset would be among the sub-channels that are eventually selected. The non-underlined 1+1+2 entries sum to 4, meaning that 4 of the 15 sub-channels are in the N=16 subset [0, 1, 2, . . . , 15]. However, because the non-underlined entries include the last entry in the portion of the interweaving sequence that is of interest, and that portion specifies a total of 15>K=14 sub-channels, not all 4 of the sub-channels in the [0, 1, 2, . . . , 15] subset would be among the sub-channels that are eventually selected. Only 3 of the 4 sub-channels in the subset [0, 1, 2, . . . , 15] would be selected, to provide a total of K=14 sub-channels.

At this point, sub-channels could be selected based on the [5, 1, 5, 1, 1, 2] portion of the ordered number sequence for the N=16 subsets, and an N=16 ordered sub-channel sequence. In FIG. 10, if sub-channels are to be selected from the N=16 subsets, then the best 11 sub-channels are selected from the right-hand N=16 subset [16, 17, 18, . . . , 31] based on the ordered number sequence (the underlined entries 5, 5, 1) and the N=16 ordered sub-channel sequence, and the best K−11=3 sub-channels are selected from the left-hand N=16 subset [0, 1, 2, . . . , 15] based on the ordered number sequence (the non-underlined entries 1, 1, 2) and the N=16 ordered sub-channel sequence. One example of the N=16 ordered sub-channel sequence could be the one in FIG. 7, i.e., [0, 1, 2, 4, 8, 3, 5, 6, 9, 10, 12, 7, 11, 13, 14, 15] in reliability ascending order, based on which sub-channels [3, 5, 6, 9, 10, 12, 7, 11, 13, 14, 15]+16=[19, 21, 22, 25, 26, 28, 23, 27, 29, 30, 31] from the right hand N=16 subset in FIG. 10 are selected and sub-channels [13, 14, 15] from the left hand N=16 subset in FIG. 10 are selected.

Instead of selecting the K sub-channels from the N=16 subsets, those subsets can be further decomposed into component N=8 subsets. For the N=16 subset [0, 1, 2, . . . , 15], based on the interweaving sequence [4, 1, 3, 3, 1, 4] for N=16, because 4>3, all 3 sub-channels will be selected from the N=8 subset [8 15] and no sub-channels will be selected from the N=8 subset [0, 1, 2, . . . , 7] in this example. For the 11 bits in the N=16 subset [16 31], based on the interweaving sequence [4, 1, 3, 3, 1, 4], because 4+1+3+3=11>=11, the portion of the interweaving sequence that is of interest is [4, 1, 3, 3]. 4+3=7 sub-channels are to be selected from the N=8 subset [24, 25, 26, . . . 31] and 1+3=4 sub-channels are to be selected from the N=8 subset [16, 17, 18, . . . , 23].

The original set of N=32 sub-channels has been decomposed to four N=8 subsets, from which the most reliable 0, 3, 4, and 7 sub-channels, respectively, are selected. The numbers of sub-channels to be selected is based on an interweaving sequence [4, 1, 3, 3, 1, 4] from which the numbers 0, 3, 4, and 7 were determined, and the N8 ordered sub-channel sequence [7, 6, 5, 3, 4, 2, 1, 0] for the N=8 subsets, as follows:

for the N=8 subset [8, 9, 10, . . . , 15], based on the N8 ordered sub-channel sequence, the three most reliable sub-channels [7, 6, 5]+8=[15, 14, 13] are selected;

for the N=8 subset [16, 17, 18, . . . , 23], based on the N8 ordered sub-channel sequence, the four most reliable sub-channels [7, 6, 5, 3]+16=[23, 22, 21, 19] are selected;

for the N=8 subset [24, 25, 26, . . . , 31], based on the N8 ordered sub-channel sequence, the seven most reliable sub-channels [7, 6, 5, 3, 4, 2, 1]+24=[31, 30, 29, 27, 28, 26, 25] are selected.

N=8 is the smallest basic subset or decomposition in this example, but other lengths of basic subset could be used in other embodiments. N=32 is also just an example, and this type of decomposition could be applied to other code lengths. At each stage, level, or iteration of decomposition before a minimum subset size is reached, there is an option to select sub-channels based on an ordered sub-channel sequence or to further decompose subsets into smaller subsets based on interweaving sequences. In some embodiments, decomposition could be limited to only subsets from which sub-channels are to be selected. For example, no sub-channels would be selected from the N=8 subset [0, 1, 2, . . . , 7] in the example shown in FIG. 10. If this were the case for an N=16 or larger subset in another embodiment, then that larger subset need not be further decomposed.

Larger subsets also need not necessarily be decomposed into only two subsets, or into equally sized subsets. Kernel size and/or type, for example, could impact the number(s) and size(s) of subsets into which larger subsets are decomposed. Other decomposition options should be apparent, for example, from FIGS. 9A to 9C.

One potential advantage of decomposing subsets into smaller subsets is that each decomposition reduces the size of an ordered sub-channel sequence that is used for sub-channel selection. For example, suppose N=1024. A full ordered sub-channel sequence in this case would have 1024 entries. According to an embodiment of the present disclosure, however, only interweaving sequences, or even just half of each such sequence if the interweaving sequences are symmetrical, could be stored to memory with just one full ordered sub-channel sequence such as the N8 sequence shown in FIG. 10.

The example in FIG. 10 does not illustrate sub-channels corresponding to bit positions that are to be punctured or shortened. The numbers of sub-channels that are to be selected from one or more particular subsets could be adjusted to account for puncturing or shortening, so that the number of remaining selected sub-channels after puncturing/shortening is equal to a target number of information sub-channels and/or other sub-channels of interest.

Regarding sub-channel selection, sub-channels could be selected as information sub-channels for example, by identifying the information sub-channels, or by determining frozen sub-channels and designating or selecting the remaining sub-channels as information sub-channels. Determining information sub-channels and determining frozen sub-channels are equivalent to each other.

Sub-channels could be selected for a variety of purposes, as a set K of sub-channels with the highest reliability (e.g. for information bits) or a set of N−K sub-channels with the lowest reliability (e.g. for frozen bits), for example. Alternatively, a particular set of sub-channels of interest (e.g. sub-channels for assistant bits) could be ordered and/or selected amongst N sub-channels.

Positions or sub-channels for other types of bits could also or instead be selected. For example, if a number N0 of CRC bits are used, then the total number of positions or sub-channels that are selected could be sufficient to accommodate both information bits and CRC bits. In some notations, this could be expressed as K including N0 positions or sub-channels (that is, K includes both information bits or sub-channels and other bits to be encoded or other sub-channels for such bits, such as CRC bits, PC bits and/or other types of bits). Other notations could express the number of positions or sub-channels as K+N0. The former notation is used primarily herein, and is intended to encompass selection of positions or sub-channels that could include information positions or sub-channels and possibly other types of positions or sub-channels.

As another example, if PC polar coding is used, assistant positions or sub-channels could be selected, along with information positions or sub-channels, for a complete set or a subset of PC bits. Positions or sub-channels for PC bits, CRC bits, assistant bits, and/or other types of bits that are to be encoded could be determined together with information bits. In some embodiments, other algorithms or techniques are applied to distinguish between different types of selected positions or sub-channels, to distinguish information positions or sub-channels from assistant positions or sub-channels, for example.

It should be appreciated that nodes, bits or bit positions, or sub-channels could be ordered and/or selected in increasing order of reliability as in examples described in detail above, or in decreasing order of reliability. It should also be appreciated that different parts of ordered sub-channel sequences and/or interweaving sequences could be of interest depending on the types of bits or sub-channels being considered (e.g., information sub-channels or frozen sub-channels).

Figure 11:
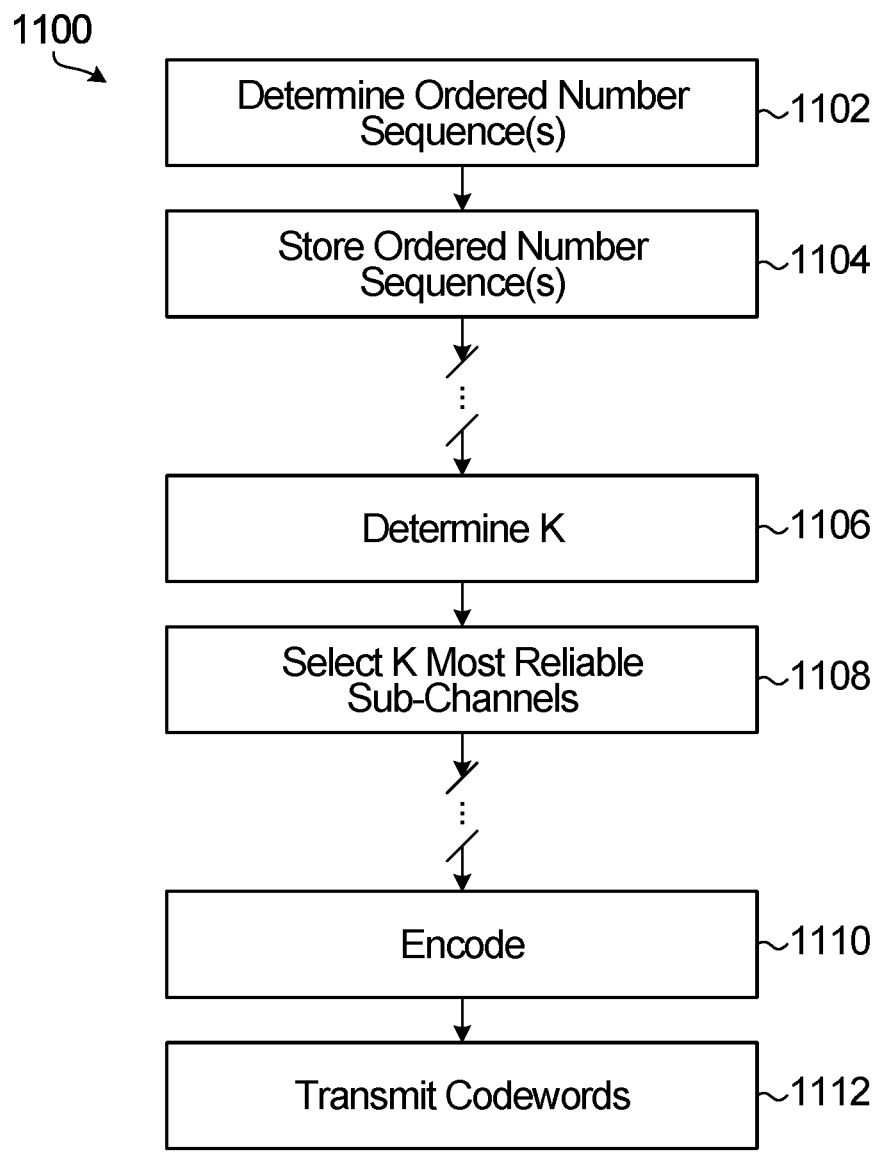
FIG. 11 is a flow diagram of an example coding method.

FIG. 11 is a flow diagram of an example coding method. The example method 1100 involves determining an ordered number sequence at 1102. The ordered number sequence is determined based on an ordered sub-channel sequence specifying an order of N sub-channels that are defined by a code and that have associated reliabilities for input bits at N input bit positions. The ordered number sequence determined at 1102 represents the ordered sub-channel sequence as a sequence of fewer than N numbers. The numbers in the ordered number sequence represent numbers of the sub-channels, from different subsets of the N sub-channels, that appear in the order specified by the ordered sub-channel sequence. One or more ordered number sequences could be determined at 1102.

At 1104, the (or each) ordered number sequence is stored in memory, for selection of K of the N sub-channels to carry bits that are to be encoded, for example. After an ordered number sequence is determined at 1102, it could be used for sub-channel selection based on one or more coding parameters such as K. Determining K at 1106 could involve reading K from memory or computing K from code rate R and code block length N, for example. K could be read, computed, configured, received, or otherwise obtained at 1106.

At 1108, K of the N sub-channels are selected, based on an ordered number sequence, to carry the bits that are to be encoded. The ordered number sequence, as noted above, includes fewer than N numbers representing an ordered sub-channel sequence that specifies an order of the N sub-channels, and the numbers in the ordered number sequence represent numbers of the sub-channels, from different subsets of the N sub-channels, that appear in the order specified by the ordered sub-channel sequence. The method 1100 is an example method in which the K most reliable sub-channels are selected. In other examples, the most reliable sub-channels might not necessarily be selected.

At some time after the K sub-channels have been selected at 1108, input bits that are to be encoded onto the K selected sub-channels are encoded at 1110 to generate codewords. The codewords are then transmitted at 1112.

Figure 12:
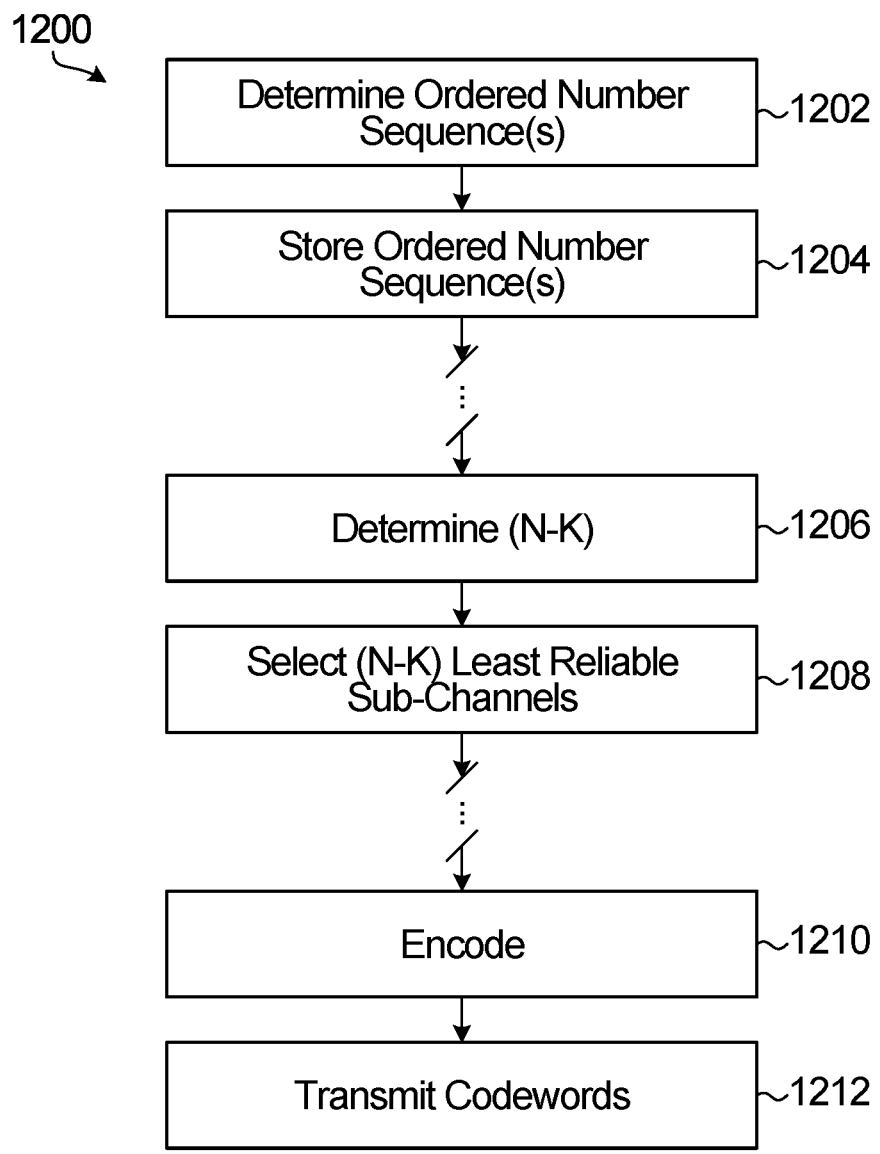
FIG. 12 is a flow diagram of another example coding method.

FIG. 12 is a flow diagram of another example coding method. The example method 1200, like the example method 1100 in FIG. 11, involves determining one or more ordered number sequences at 1202 and storing the sequence(s) at 1204. Instead of determining K, the method 1200 involves determining (N−K) at 1206. This illustrates that an ordered number sequence could be used not only for selection of information sub-channels to carry information bits for example, but also or instead for selection of sub-channels such as frozen sub-channels that are not used for encoding information. Determining (N−K) could involve reading N and K, or (N−K), from memory, and/or computing (N−K), for example. (N−K) could be configured, received, or otherwise obtained at 1206.

At 1208, (N−K) of the N sub-channels are selected based on an ordered number sequence, and least reliable sub-channels are selected in the example shown. The encoding at 1210 involves encoding input bits onto the remaining K non-selected sub-channels in this embodiment. Codewords that are generated by the encoding at 1210 are transmitted at 1212.

The example methods in FIGS. 11 and 12 are intended for illustrative purposes. Other examples could involve performing the illustrated operations in any of various ways, performing fewer or additional operations, and/or varying the order in which operations are performed. Other variations could be or become apparent to a skilled person based on the present disclosure.

For example, any one or more of the following could be provided, alone or in any of various combinations:

the determining at 1102, 1202 involves determining an ordered number sequence based on an ordered sub-channel sequence for each of a plurality of values of N;

the storing at 1104, 1204 involves storing each of the ordered number sequences and storing only the ordered sub-channel sequence for a smallest value of N;

the order of the N sub-channels specified in the ordered sub-channel sequence is an order according to a metric that is based on a function—the order could be in increasing order or decreasing order of the metric;

the function includes one or more of: a transmission model dependent function, a PW function, a GA function, and an DE function;

the N sub-channels include sub-channels corresponding to bit positions to be punctured or shortened;

the selecting at 1108 involves selecting K sub-channels corresponding to non-punctured/non-shortened bit positions—the selecting at 1208 could involve selecting sub-channels corresponding to the bit positions that are to be punctured or shortened;

the selecting involves using the ordered number sequence and an ordered sub-channel sequence specifying an order of the sub-channels in the different subsets to select the K sub-channels at 1108 (or to select the (N–K) sub-channels at 1208) from the sub-channels in the different subsets;

the selecting involves using the ordered number sequence, a further ordered number sequence representing a further ordered sub-channel sequence that specifies an order of sub-channels in smaller subsets of the sub-channels from the different subsets, and a smaller ordered sub-channel sequence that specifies an order of the sub-channels in the smaller subsets, to select the K sub-channels at 1108 (or to select the (N–K) sub-channels at 1208) from the sub-channels in the smaller subsets;

the selecting further involves using one or more additional ordered number sequences that each represent a respective additional ordered sub-channel sequence of a length between N and a length of the further sub-channel sequence;

the selecting further involves using a shortest of the one or more additional ordered number sequences and an ordered sub-channel sequence specifying an order of the sub-channels in different subsets from which the shortest ordered number sequence specifies numbers of sub-channels, to select the K sub-channels at 1108 (or to select the (N–K) sub-channels at 1208) from the sub-channels in the different subsets;

the selecting involves decomposing the subsets into basic subsets that each include a predetermined number of the sub-channels;

the decomposing involves iteratively separating the N sub-channels into smaller subsets until the number of sub-channels in each of the smaller subsets reaches the predetermined number of sub-channels;

the selecting involves: for each iteration of the separating, determining based on an ordered number sequence, numbers of sub-channels that are to be selected from subsets of the sub-channels; and after a final iteration of the separating, selecting the determined numbers of sub-channels from the basic subsets based on an ordered sub-channel sequence of the predetermined number of the sub-channels;

the determining for each iteration comprises determining the numbers of the sub-channels from the subsets based on a target number of sub-channels and one or more of the numbers, starting from one end of an ordered number sequence (e.g., the starting number could be the first number in the ordered number sequence or the last number in the ordered number sequence, depending on whether the ordered number sequence relates to an increasing or decreasing order of reliability and/or the types of sub-channels (e.g., information/assistant sub-channels or frozen sub-channels) being selected;

determining the numbers of sub-channels for each iteration is further based on position(s) of the one or more numbers in an ordered number sequence;

the one or more numbers could be the number at the one end of an ordered number sequence where the number is greater than or equal to the target number, or multiple sequential numbers from the one end where the number at the one end is less than the target number;

the order specified by the ordered sub-channel sequence yields no conflict with a partial order of the N sub-channels;

K is a number of information bit positions that are to be encoded;

N–K is a number of frozen bit positions;

the method includes encoding the bits that are to be encoded onto the K selected sub-channels (or the K remaining non-selected channels if (N–K) sub-channels are selected as shown in FIG. 12) to generate codewords;

the method includes transmitting the codewords.

Figure 13:
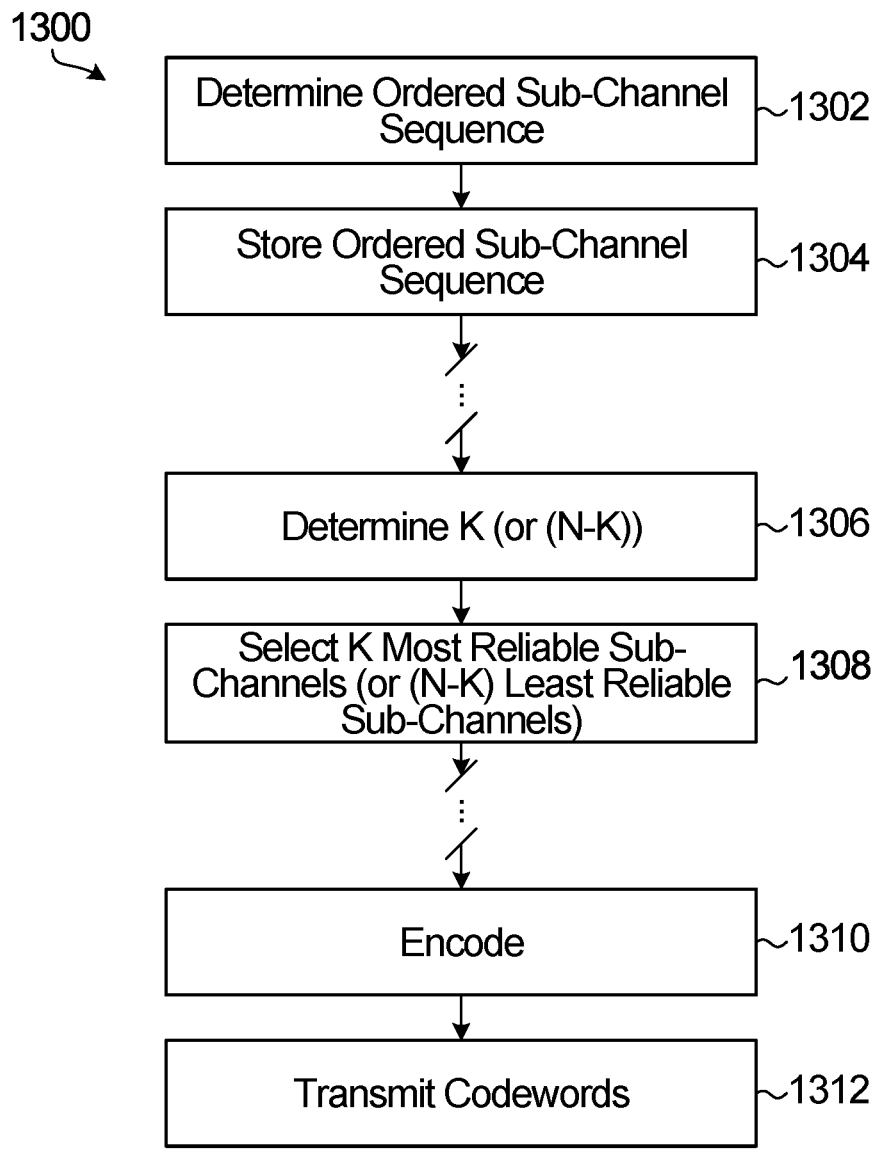
FIG. 13 is a flow diagram of a further example coding method.

FIGS. 9 to 9C and FIG. 10 illustrate different applications of ordered number sequences. The example methods 1100, 1200 in FIGS. 11 and 12 involve determining an ordered number sequence and using an ordered number sequence in sub-channel selection. An ordered number sequence could also or instead be used to build a longer ordered sub-channel sequence from a shorter ordered sub-channel sequence. K most reliable sub-channels, or (N–K) least reliable sub-channels, could be selected from the longer ordered sub-channel sequence. FIG. 13 is a flow diagram of an example of such a coding method.

The example method 1300 involves determining an ordered sequence of sub-channels at 1302. The sub-channels are defined by a code and have associated reliabilities for input bits at input bit positions. The ordered sub-channel sequence is determined at 1302 based on a shorter ordered sub-channel sequence that is shorter than the ordered sub-channel sequence and that specifies an order of sub-channels in subsets of the sub-channels. Determination of the ordered sub-channel sequence at 1302 is also based on an ordered number sequence that represents the ordered sub-channel sequence as a sequence of numbers of the sub-channels from the subsets of the sub-channels that appear in the ordered sub-channel sequence. The determined ordered sub-channel sequence is stored at 1304.

At 1306, one or more coding parameters, which could include K or (N–K) depending on the type of sub-channels to be selected, is determined at 1306, and examples of operations that could be involved in determining K or (N–K) are described above. At 1308, K most reliable sub-channels, or (N–K) least reliable sub-channels, of the N sub-channels are selected. The selection at 1308 is based on a shorter ordered sub-channel sequence of length less than N and that specifies an order of sub-channels in subsets of the N sub-channels. The selection is also based on an ordered number sequence that represents an ordered sub-channel sequence of length N as a sequence of numbers of the sub-channels from the subsets of the sub-channels that appear in the ordered sub-channel sequence. The encoding at 1310 involves encoding input bits onto the K selected sub-channels, or the remaining K non-selected sub-channels if (N–K) sub-channels are selected at 1308. Codewords that are generated by the encoding at 1310 are transmitted at 1312.

The example method 1300 is intended for illustrative purposes. Other examples could involve performing the illustrated operations in any of various ways, performing fewer or additional operations, and/or varying the order in which operations are performed. Other variations could be or become apparent to a skilled person based on the present disclosure. For example, any one or more of the following could be provided, alone or in any of various combinations:

the determining at 1302 is further based on one or more additional ordered number sequences;

the determining at 1302 involves determining the ordered sub-channel sequence on-the-fly for selection of sub-channels as needed for carrying the bits that are to be encoded;

the selecting at 1308 is further based on one or more additional ordered number sequences;

the selecting at 1308 involves selecting the K sub-channels or the (N–K) sub-channels on-the-fly as needed for carrying the bits that are to be encoded.

Features similar to those listed above with reference to FIGS. 11 and 12, could also or instead be implemented in conjunction with a method that is consistent with FIG. 13. An iterative technique similar to decomposition disclosed herein, for example, could be used to iteratively build longer and longer sequences using multiple ordered number sequences, for example, as illustrated in FIG. 9.

Although FIGS. 11 to 13 show example operations 1110, 1112; 1210, 1212; 1310, 1312 that would be performed at an encoder/transmitter, other embodiments could be implemented at a receiver/decoder. A word that is based on a codeword of a code could be received at a receiver and decoded, based on sub-channels that are selected by the decoder or a sub-channel selector coupled to the decoder according to a method as shown in any of FIGS. 11 to 13 and/or as otherwise disclosed herein.

In some embodiments, coded bit processing such as puncturing, shortening, zero padding, and/or repetition could be used in conjunction with polar codes that are based on 2-by-2 kernels or other types of kernels, for rate matching and/or other purposes for example. Such coded bit processing could impact code rate, if a coded bit position corresponding to a selected sub-channel is to be punctured or shortened. Assistant bits, such as PC bits, CRC bits, and/or other types of bits associated with error detection codes (EDCs) and/or error correction codes (ECCs), for example, may also be encoded onto selected sub-channels and may similarly affect code rate by reducing the number of selected sub-channels that are actually available to carry input bits. When selecting sub-channels or allocating information or frozen bit positions using, for example, the method(s) described above or any other method, coded bit positions that are to be punctured or shortened, bit positions of assistant bits, and/or other conditions or criteria that render selected sub-channels unavailable to carry input bits that are to be encoded, should also be considered.

Consider an example in which K1 input bits, not including any assistant bits such as CRC bits, PC bits, EDC bits, and/or ECC bits, are to be encoded into an M-bit codeword. Given (K1, M), there is a value K2=K1+X to construct a polar code in which exactly K1 sub-channels are available to carry the input bits, when puncturing, shortening, rate matching, and/or assistant bits reduce the number of selected sub-channels that are available to carry the input bits. In this example, X is the intersection between the selected bit positions corresponding to selected sub-channels and the bit positions corresponding to sub-channels that are not available to carry the input bits. Selected sub-channel unavailability could be due to puncturing, shortening, rate matching, and/or assistant bits, for example.

If the sub-channel availability is affected only due to the presence of assistant bits, X can be the number of assistant bits. In other words, in order to select K1 available sub-channels for K1 input bits, K2=K1+X sub-channels will be selected, where X is the number of assistant bits generated from the K1 input bits. If the sub-channel availability is also affected by puncturing/shortening, the determination of X may not be as straightforward, and may depend on any one or more of K1, M, number of assistant bits, assistant bit generation technique, puncturing/shortening schemes, the ordered basic-length sub-channel sequence, and/or possibly other coding parameters. In this situation, determining the value of X for any particular set of coding parameters with a simple hardware implementation and with deterministic code construction latency can be a challenge.

Figure 14:
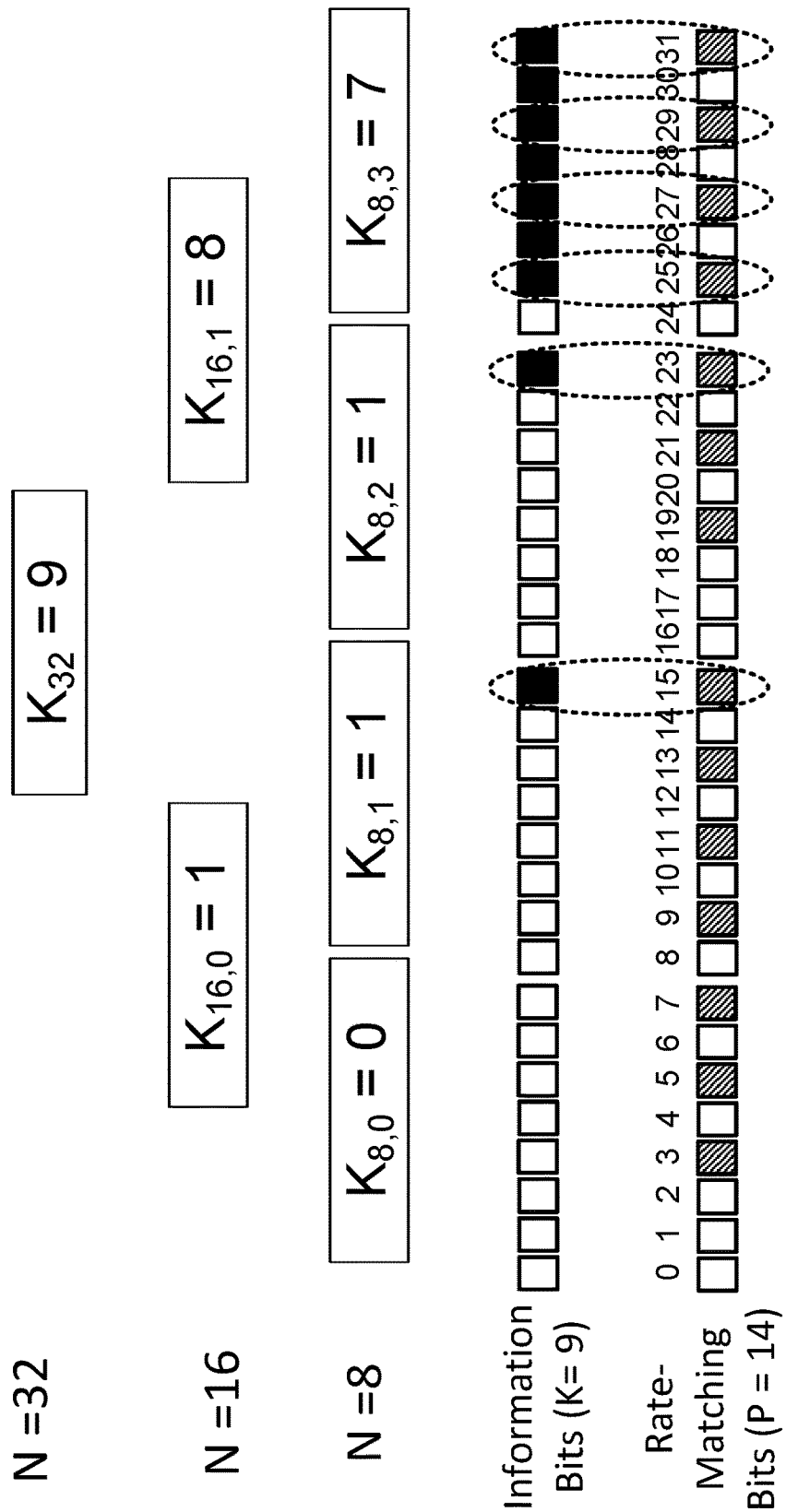
FIG. 14 is a block diagram illustrating an example of puncturing or shortening after sub-channel selection.

FIG. 14 is a block diagram illustrating an example of puncturing or shortening after sub-channel selection. For the example in FIG. 14, K1=9 and code rate R=1/2. Therefore, code block length M=K1/R=18, and mother code length N for an N=$2^n$ code is 32. 14 coded bits are shortened in this example, and the shortened bits are determined according to a BIV or bit reverse puncturing or shortening method in the example shown. BIV puncturing/shortening is a rate matching method. In this example, N=32, and 14 coded bits need to be shortened. The BIV method first marks the number of shortened bits (14 in this example) starting from the highest bit. The binary representations of the marked bit positions are then bit reversed. Consider the two highest marked bits 30 and 31, for example, with binary representations 11110 and 11111. These binary representations are bit reversed (01111, 11111), which gives bits 15 and 31 to be shortened. The other 12 coded bit positions to be shortened are similarly determined.

Conflicting bit positions, which are selected as one of the K1=9 selected bit positions and are also to be shortened, are circled in FIG. 14. The final codeword illustrated at the bottom of FIG. 14 has only 3 of the 9 selected bit positions remaining available to encode input bits after shortening. In other words, the final codeword is missing 6 bits to achieve the code rate of 1/2. 6 more bit positions or sub-channels are needed to achieve the target code rate.

Figure 15:
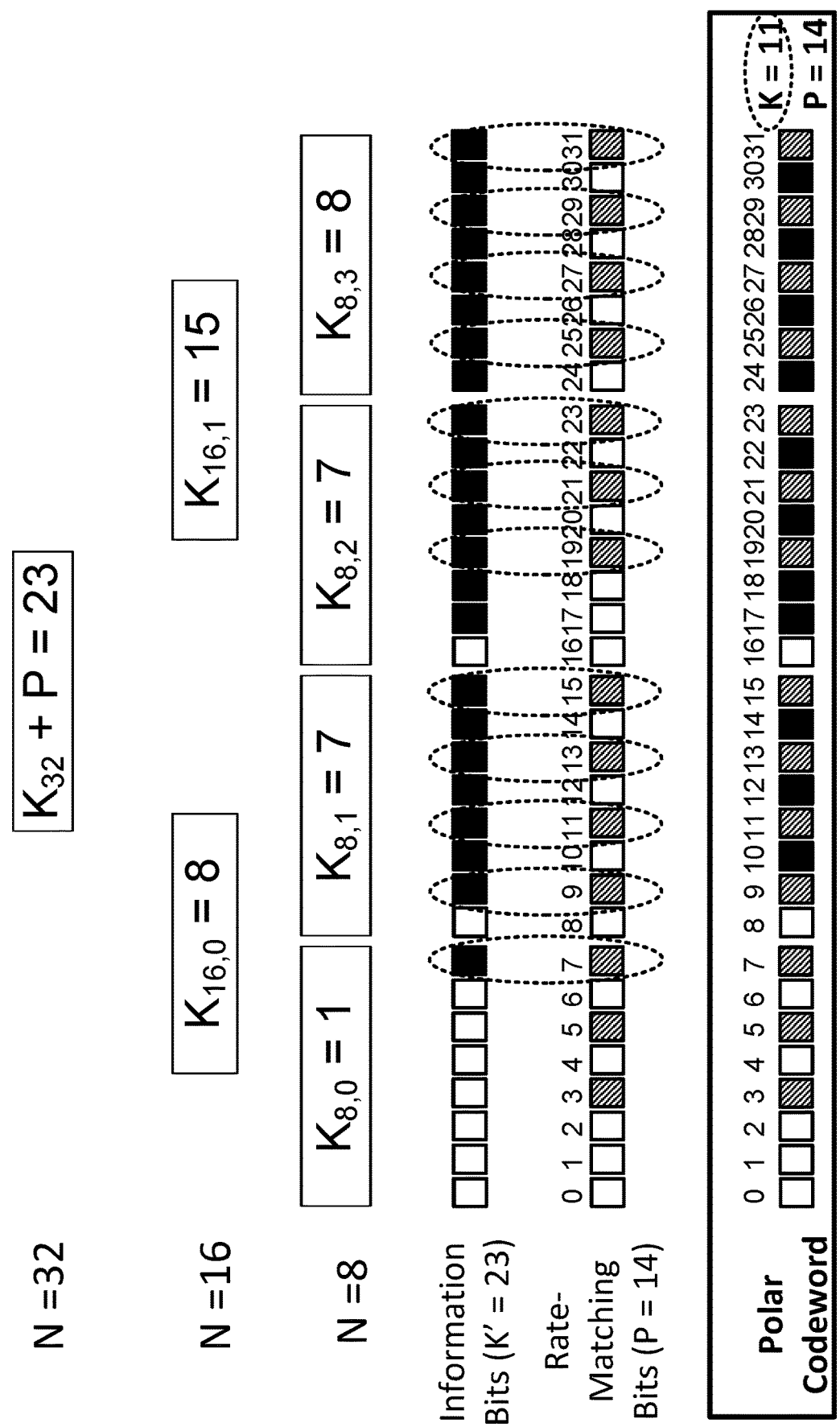
FIG. 15 is a block diagram illustrating another example of puncturing or shortening after sub-channel selection.

FIG. 15 is a block diagram illustrating another example of puncturing or shortening after sub-channel selection. For the example in FIG. 15, K1=9 and code rate R=1/2. Therefore, code block length M=K1/R=18, and mother code length N for an N=$2^n$ code is 32. As in FIG. 14, 14 coded bits are to be shortened in the example in FIG. 15, and the shortened bits are determined according to a BIV shortening method. With 14 coded bit positions to be shortened, the maximum number P of conflicting bit positions is 14. FIG. 15 illustrates selection of K2=K1+P=9+14=23 bit positions for allocation to encode input bits.

Conflicting bit positions are circled in FIG. 15. The final codeword illustrated at the bottom of FIG. 15 has 11 selected bit positions available to encode input bits after BIV shortening. In other words, the final codeword has 2 extra bit positions in addition to the 9 bit positions that achieve the code rate of 1/2. 2 bit positions or sub-channels must be removed or de-selected to achieve the target code rate.

According to embodiments disclosed herein, exactly K1 selected sub-channels are available to carry input bits. In the example of FIG. 14, there are too few selected sub-channels available to achieve the target code rate, whereas in FIG. 15 there are too many selected sub-channels available. Since the relative reliability between the sub-channels in different sub-channel subsets in FIGS. 14 and 15 (e.g., the basic sub-channel subset of length N=8) is unknown, it is difficult to determine which sub-channels should be further added in FIG. 14 or removed in FIG. 15 to get exactly K1 selected sub-channels to carry input bits.

Figure 16:
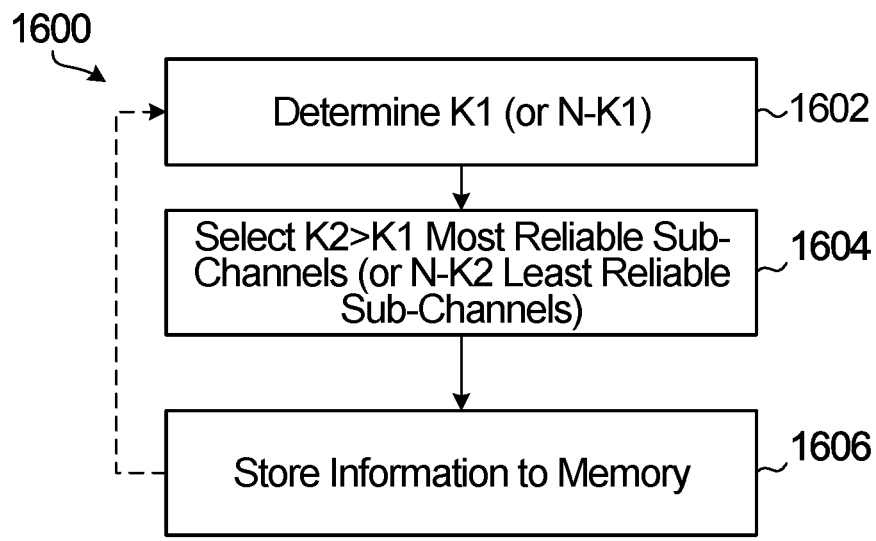
FIG. 16 is a flow diagram illustrating a sub-channel selection method according to an embodiment.

FIG. 16 is a flow diagram illustrating a sub-channel selection method according to an embodiment. The example method 1600 involves determining at 1602, from N sub-channels that are defined by a code and that have associated reliabilities for N bit positions, a number K1 of the N sub-channels to carry input bits that are to be encoded into codewords. Equivalently N−K1 frozen sub-channels could instead be determined at 1602. At 1604, a number K2>K1 of the N sub-channels, or equivalently N−K2 of the sub-channels, are selected to provide exactly K1 sub-channels that are available to carry the input bits that are to be encoded. The other selected (K2−K1)=X sub-channels are not available to carry the input bits that are to be encoded, and could include sub-channels that are selected to carry assistant bits, and/or sub-channels corresponding to punctured or shortened coded bit positions in a codeword, for example.

The example method 1600 also includes storing information to memory at 1606. The information that is stored to the memory at 1606 could include information such as sub-channel indices, indicative of the selected sub-channels, or other information from which the selected sub-channels can be determined.

In some embodiments, information that is indicative of the number of sub-channels K2 (or N−K2), or information from which K2 (or N−K2) can be determined, is stored in memory at 1606. For example, the operations at 1602, 1604 could be performed offline and used to populate a lookup table. The number of sub-channels that should be selected (K2 or N−K2 for example) to provide exactly K1 sub-channels that are available to carry the input bits that are to be encoded can then be determined based on at least K1 and the information stored in the memory. The dashed arrow in FIG. 16 is intended to illustrate that the determining and selecting could be repeated for multiple different sets of coding parameters, to populate a lookup table or otherwise store in a memory information that is indicative of K2 (or N−K2), or information from which K2 (or N−K2) can be determined, for each set of coding parameters. Such sets of coding parameters could include different sets of any one or more of K1 (or N−K1), code block length M, mother code length N, code rate R, puncturing/shortening schemes, number and generation of assistant bits, and possibly other coding parameters that may impact how many selected sub-channels are actually available to carry input bits that are to be encoded.

Figure 17:
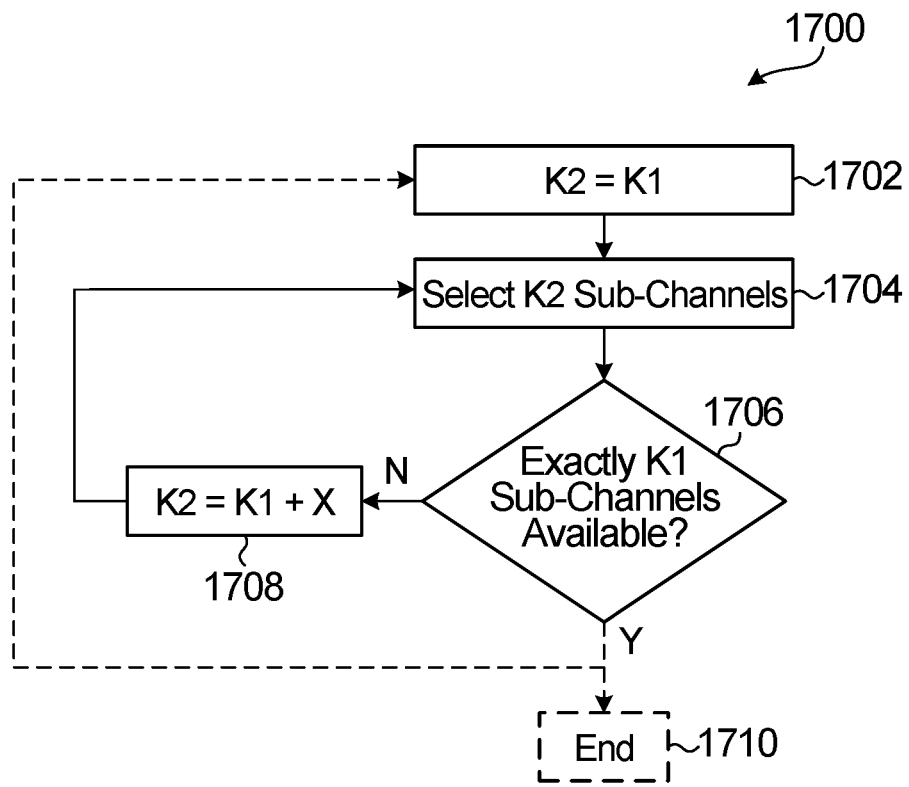
FIG. 17 is a flow diagram illustrating a sub-channel selection method according to another embodiment.

Sub-channel selection could be an iterative process. For example, K1 (or N−K1) sub-channels could be initially selected, and a determination could then be made as to a number X of the K1 selected (or non-selected) sub-channels that are not available to carry the input bits that are to be encoded. Selecting K2 (or N−K2) of the N sub-channels at 1604 could then involve selecting K2=K1+X (or N−K1−X) of the N sub-channels in a next iteration. This is an example of an iterative process that includes two iterations. More generally, an iterative process could involve two or more iterations until exactly K1 sub-channels are available to carry input bits that are to be encoded. FIG. 17 is a flow diagram illustrating an iterative sub-channel selection method according to another embodiment.

In the example method 1700, for an initial iteration K2=K1 as shown at 1702. K1 could be configured or otherwise determined for either online code design when input bits are to be encoded, or offline for population of a memory record such as a lookup table entry for subsequent determination of K2 when input bits are to be encoded, for example. FIG. 17 represents an illustrative embodiment in which the K2 most reliable sub-channels are selected at 1704. In other embodiments, N−K2 least reliable sub-channels could instead be selected.

A determination is made at 1706 as to whether exactly K1 of the selected sub-channels are available to carry the input bits that are to be encoded. The determination at 1706 could involve finding the intersection between selected positions or sub-channels and either or a combination of assistant positions or sub-channels and shortened or punctured positions or sub-channels, and comparing the number of remaining selected sub-channels K2−X with K1. Finding the above intersection is equivalent to determining a number of conflicting positions or sub-channels X, which are defined as the sub-channels that are within the K2 selected sub-channels but are also punctured/shortened or to be used for assistant bits so that they are not available to carry the input bits that are to be encoded. The determination at 1706 could also be stated as determining whether K2−X=K1.

Dependent on the determination at 1706, if the number of available selected sub-channels to carry the input bits K2−X is less than K1, the selecting and determining at 1704, 1706 could be repeated. If K2−X<K1, then there are still not enough selected sub-channels available to accommodate the K1 input bits. In a next iteration, K2 should be increased by the missing part, i.e., the difference between K1 and the remaining available selected sub-channels (K2−X), which is K1−(K2−X). The new K2 for the next iteration is therefore K2+K1−(K2−X)=K1+X in this example. This could be repeated until it is determined that exactly K1 sub-channels are available to carry the input bits are to be encoded, or until a maximum number of iterations have been performed.

An iterative method as shown in FIG. 17 could be described in terms of an iteration index or counter z. In each of a number of iterations z=1, . . . , Z, with Z≥2, K2$_z$ of the N sub-channels are selected. K2$_z$=K1 for z=1 as shown at 1702 and K2$_z$>K1 for z>1. Each iteration also involves determining at 1706 whether exactly K1 of the K2$_z$ selected sub-channels are available to carry the input bits that are to be encoded. If not, then the selecting at 1704 and the determining at 1706 are repeated for K2$_{z+1}$=K1+X$_z$, where X$_z$ is a number of conflicting bit positions or sub-channels, or equivalently the number of sub-channels within the K2$_z$ selected sub-channels that are not available to carry the input bits that are to be encoded (due to assistant bits and/or puncturing/shortening), until it is determined that exactly K1 of the K2$_z$ selected sub-channels are available to carry the input bits that are to be encoded. A maximum number of iterations Z could also be set to end sub-channel selection after a certain number of iterations if the available sub-channel condition has not been satisfied.

For online sub-channel selection, the example method 1700 ends as shown at 1710 when exactly K1 sub-channels are available to carry the input bits that are to be encoded. Multiple iterations may be completed before exactly K1 sub-channels are available to carry the input bits that are to be encoded. The number of iterations might not be known in advance, and therefore iterative online sub-channel selection might not have deterministic latency.

An iterative method as shown in FIG. 17 could also or instead be performed offline, to populate a memory with a lookup table or other information from which K2 (or N−K2) can be determined online as needed, without performing iterative sub-channel selection online when input bits are to be encoded. K2 (or N−K2) could be determined based on K1, M and possibly other coding parameters, and information in a memory. K2 (or N−K2) sub-channels could then be selected without having to perform multiple iterations to first determine K2 (or N−K2). Using the offline determined K2, exactly K1 available selected sub-channels to carry the input bits can be obtained in one iteration, considering any assistant bits and/or puncturing/shortening.

Considering selection of K2 sub-channels as an example, an iterative offline sub-channel selection method could be as described above. With reference to an iteration index or counter, in each of a number of iterations z=1, . . . , Z, with Z≥2, K2$_z$ of the N sub-channels are selected, with K2$_z$=K1 for z=1 as shown at 1702 and K2$_z$>K1 for z>1. Each iteration also involves determining at 1706 whether exactly K1 of the K2$_z$ selected sub-channels are available to carry the input bits that are to be encoded. If not, then the selecting at 1704 and the determining at 1706 are repeated for $K2_{z+1}=K1+X_z$, where $X_z$ is a number of the $K2_z$ selected sub-channels that are not available to carry the input bits that are to be encoded, until a final iteration in which it is determined that exactly K1 of the $K2_z$ selected sub-channels are available to carry the input bits that are to be encoded. For offline iteration, information indicative of $K2_z$ from the final iteration, or information from which $K2_z$ from the final iteration can be determined, is stored in memory. This offline iterative process could be repeated for different sets of coding parameters, to populate a lookup table for example. This is represented by the dashed line in FIG. 17 between 1706 and 1702.

A lookup table could be populated with information indicative of K2, X, (N−K2), or (N−K1−X), or information from which K2, X, (N−K2), or (N−K1−X) could be computed, for each of multiple different coding scenarios associated with different sets of coding parameters. For a given (K1,M), for example, a value of K2, X, (N−K2), or (N−K1−X) could be read from a memory, or otherwise determined (at 1602 in FIG. 16 for example) based on information that is read from a memory. A polar code could then be constructed by selecting sub-channels so that K1 sub-channels remain available for carrying input bits, after assistant bits are generated and/or coded bits are punctured or shortened.

Offline determination of K2, X, (N−K2), or (N−K1−X) to populate a lookup table or otherwise store sub-channel selection information to a memory could simplify hardware implementation at a coding device, in that a coding device could implement one or more memory devices to store a lookup table rather than hardware to perform iterative sub-channel selection. A lookup table or otherwise memory-based sub-channel selection may also have deterministic code construction latency, in that only one sub-channel selection iteration is performed. Multiple iterations may have been performed offline to populate information in the memory, but online sub-channel selection involves only one iteration, since the correct value of K2, X, (N−K2), or (N−K1−X) can be determined from information in the memory.

The example methods in FIGS. 16 and 17 are intended for illustrative purposes. Other embodiments could involve performing the illustrated operations in any of various ways, performing fewer or additional operations, and/or varying the order in which operations are performed. Other variations could be or become apparent to a skilled person based on the present disclosure.

For example, selecting sub-channels could involve selecting sub-channels based on one or more ordered number sequences and one or more ordered sub-channel sequences as disclosed herein. Other embodiments could use other techniques to select sub-channels based on reliabilities, for example, methods based on but not restricted to Density Evolution, Gaussian Approximation, Genie-Aided Simulations, Polarization Weights, Rate splitting and so on. Also, to encode and/or transmit input bits, the example methods of FIGS. 16 and 17 could also be implemented in conjunction with, or as part of, a method consistent with any one of the methods shown in FIG. 11, 12 or 13. For example, the steps recited in FIGS. 16 and 17 could be substituted in FIG. 11, 12 or 13 for the steps of determining K (or N−K) recited at 1106, 1206, 1306 and selecting K (or N−K) sub-channels) recited at 1108, 1208, 1308.

Embodiments could also be implemented in conjunction with any of various assistant bit generation techniques. Similarly, embodiments are not restricted to any particular type of puncturing or shortening.

Figure 18:
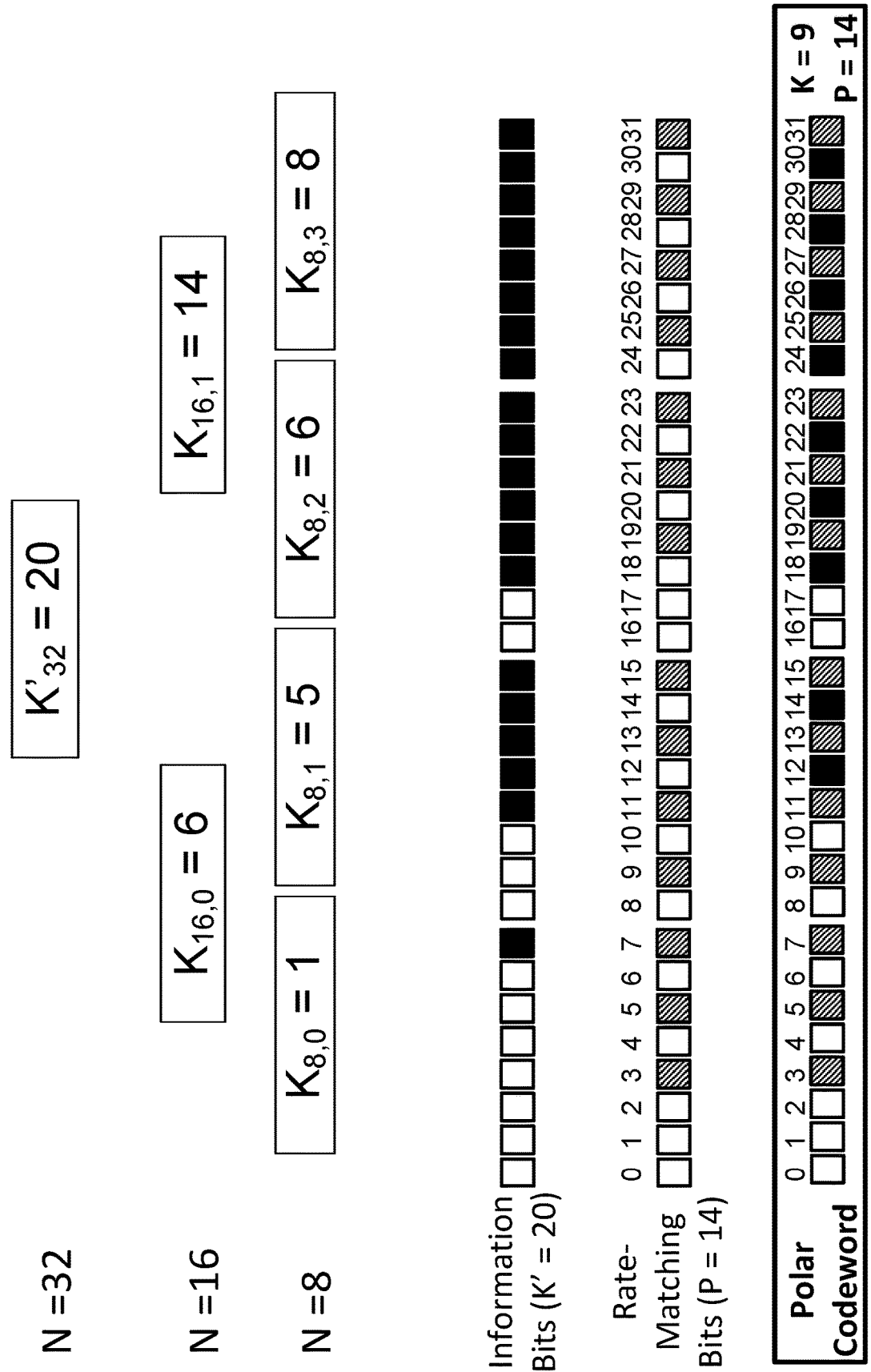
FIG. 18 is a block diagram illustrating another example of puncturing or shortening after sub-channel selection.

FIG. 18 is a block diagram illustrating another example of puncturing or shortening after sub-channel selection. In FIG. 18, it has been determined that for K1=9, K2=20 (X=11) to provide exactly K1=9 available sub-channels after puncturing or shortening. K2=20 could be determined in one iteration or multiple iterations online when input bits are to be encoded, or in one iteration or multiple iterations offline to populate a lookup table or other memory record for subsequent access when input bits are to be encoded.

Method embodiments as disclosed herein encompass, for example, a method that involves determining, from sub-channels that are defined by a code and that have associated reliabilities for input bits at input bit positions, a first number of the sub-channels to carry bits that are to be encoded; and selecting a second number of the sub-channels, greater than the first number, to provide exactly the first number of sub-channels to be available to carry the bits that are to be encoded.

Any of the following features, alone or in any of various combinations, could also or instead be provided:

the selected sub-channels include unavailable sub-channels that are not available to carry the bits;

the unavailable sub-channels include one or more of: sub-channels that are selected to carry assistant bits, and sub-channels corresponding to punctured or shortened coded bit positions in a codeword;

a method further involves selecting the first number of the sub-channels; and determining a number of unavailable sub-channels of the selected first number of the sub-channels that are not available to carry the bits that are to be encoded;

the second number is a sum of the first number and the determined number of unavailable sub-channels;

the selecting comprises, in each of multiple iterations z=1, . . . , Z, with Z≥2: selecting $K2_z$ of the sub-channels, with $K2_z$=K1 for z=1 and $K2_z$>K1 for z>1, where K1 is the first number and $K2_z$ is the second number for a $z^{th}$ iteration; and determining whether exactly K1 of the $K2_z$ selected sub-channels are available to carry the bits that are to be encoded, with a next iteration being performed for $K2_{z+1}$=K1+$X_z$, where $X_z$ is a number of the $K2_z$ selected sub-channels that are not available to carry the bits that are to be encoded, if it is not determined that exactly K1 of the $K2_z$ selected sub-channels are available to carry the bits that are to be encoded;

a method also involves storing, in a memory, information indicative of the second number or information from which the second number can be determined;

in embodiments in which the selecting involves multiple iterations, the storing involves storing, in the memory, information indicative of $K2_z$ from a final iteration or information from which $K2_z$ from the final iteration can be determined;

determining the first number and selecting the second number of sub-channels involve determining the first number and selecting the second number of sub-channels for multiple different sets of coding parameters;

the storing involves storing information indicative of the second number or information from which the second number can be determined, for each of the different sets of coding parameters;

when bits are to be encoded according to one of the different sets of coding parameters, selecting the second number of the sub-channels based on the information stored in the memory for the one of the sets of coding parameters;

the selecting involves determining the second number based on the first number and information stored in a memory;

the selecting involves selecting based on one or more ordered number sequences and one or more ordered sub-channel sequences;

a method also involves encoding the bits that are to be encoded onto the first number of sub-channels to generate a codeword;

a method also involves transmitting the codeword.

The foregoing description of embodiments refers primarily to encoding, and therefore relates primarily to operations that would be performed at an encoder/transmitter. Other embodiments could be implemented at a receiver/decoder. A word that is based on a codeword of a code could be received at a receiver and decoded, based on sub-channels that are selected by the decoder or a sub-channel selector coupled to the decoder according to a method as shown in FIG. 16 or FIG. 17 and/or as otherwise disclosed herein.

In another embodiment, a non-transitory processor-readable medium stores instructions which, when executed by one or more processors, cause the one or more processors to perform a method as disclosed herein.

Figure 19:
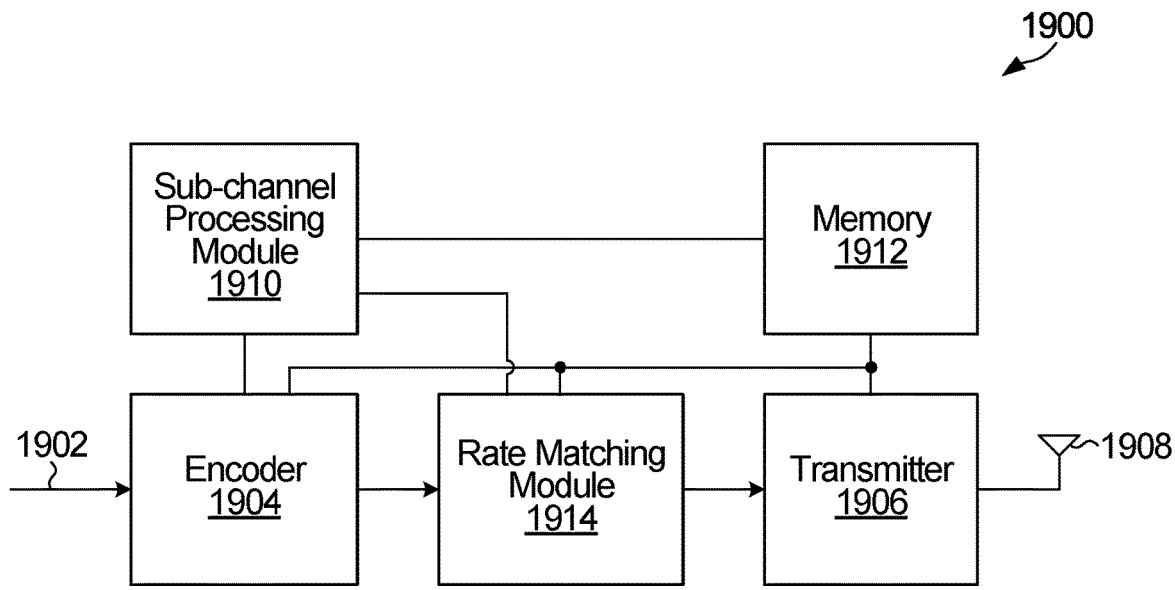
FIG. 19 is a block diagram of an apparatus for encoding and transmitting codewords.

FIG. 19 is a block diagram of an apparatus for encoding and transmitting codewords. The apparatus 1900 includes an encoder 1904 coupled to a transmitter 1906. The apparatus 1900 also includes a sub-channel processing module 1910 and a rate matching module 1914 coupled to the encoder 1904 and to the sub-channel processing module 1910. In the illustrated embodiment, the apparatus 1900 also includes an antenna 1908, coupled to the transmitter 1906, for transmitting signals over a wireless channel, and an input 1902 for receiving input bits. The transmitter 1906 is also coupled to the rate matching module 1914. In some embodiments, the transmitter 1906 includes a modulator, an amplifier, and/or other components of an RF transmit chain. A memory 1912 is also shown in FIG. 19, coupled to the encoder 1904, to the sub-channel processing module 1910, to the rate matching module 1914, and to the transmitter 1906.

The encoder 1904 is implemented in circuitry, such as a processor, that is configured to encode input bits as disclosed herein. In a processor-based implementation of the encoder 1904, processor-executable instructions to configure a processor to perform encoding operations are stored in a non-transitory processor-readable medium. The non-transitory medium could include, in the memory 1912 for example, one or more solid-state memory devices and/or memory devices with movable and possibly removable storage media.

For interweaving sequence-based sub-channel selection, the sub-channel processing module 1910 could be implemented in circuitry that is configured to determine (and store to the memory 1912) ordered number sequences and/or ordered sub-channel sequences as disclosed herein. The sub-channel processing module 1910 could be configured to also or instead determine coding parameters such as K or (N−K), and to select sub-channels as disclosed herein. In some embodiments, the sub-channel processing module 1910 is implemented using a processor. The same processor or other circuitry, or separate processors or circuitry, could be used to implement both the encoder 1904 and the sub-channel processing module 1910. As noted above for the encoder 1904, in a processor-based implementation of the sub-channel processing module 1910, processor-executable instructions to configure a processor to perform encoding operations are stored in a non-transitory processor-readable medium, in the memory 1912 for example.

The encoder 1904 is configured to encode, onto a number K of N sub-channels that are defined by a code and that have associated reliabilities for input bits at N input bit positions, input bits that are to be encoded. Information representing ordered sub-channel sequences, ordered number sequences, and/or selected sub-channels could be provided to the encoder 1904 by the sub-channel processing module 1910 for use in encoding input bits, and/or stored in the memory 1912 by the sub-channel processing module 1910 for subsequent use by the encoder.

The sub-channel processing module 1910 could be implemented in circuitry that is also or instead configured to determine, from N sub-channels that are defined by a code and that have associated reliabilities for N bit positions, a number K1 of the sub-channels to carry input bits that are to be encoded into codewords; and to select a number K2>K1 of the N sub-channels to provide exactly K1 sub-channels that are available to carry the input bits that are to be encoded when assistant bits and/or puncturing/shortening are considered, as disclosed herein.

Like the encoder 1904 and the sub-channel processing module 1910, the rate matching module 1914 is implemented in circuitry, such as a processor, that is configured to perform rate matching operations. These rate matching operations could include puncturing/shortening as disclosed herein, for example. In a processor-based implementation of the rate matching module 1914, processor-executable instructions to configure a processor to perform rate matching operations are stored in a non-transitory processor-readable medium, examples of which are described above. In an embodiment, the rate matching module 1914 determines one or more coding parameters such as K, N, M, that may impact a number of bit positions or sub-channels that are to be punctured/shortened or are otherwise affected by rate matching. The coding parameter(s) could be read from the memory 1912 or otherwise obtained or computed by the rate matching module 1914. Information indicative of bit positions and/or sub-channels that are affected by rate matching, or information from which such bit positions or sub-channels may be determined, may be fed back to the sub-channel processing module 1910, stored to the memory 1912, or otherwise made available to the sub-channel processing module 1910 by the rate matching module 1914. This enables the sub-channel processing module 1910 to determine how many selected bit positions or sub-channels are affected by rate matching, so that exactly K1 selected bit positions or sub-channels are available to carry input bits that are to be encoded, taking into account rate matching.

Assistant bit generation could be implemented by the encoder 1904, or in a separate assistant bit generation module configured to generate PC bits, CRC bits, and/or other types of assistant bits. Information indicative of at least the number of bit positions and/or sub-channels that are to be allocated to assistant bits (e.g., the number of assistant bits), or information from which the number of assistant bits, bit positions, or sub-channels may be determined, could be provided to the sub-channel processing module 1910, stored to the memory 1912, or otherwise made available to the sub-channel processing module. This enables the sub-channel processing module 1910 to determine how many selected bit positions or sub-channels are to be allocated to assistant bits, so that exactly K1 selected bit positions or sub-channels are available to carry input bits that are to be encoded, taking assistant bits into account in addition to or instead of rate matching.

The apparatus 1900 could implement any of various other features that are disclosed herein. For example, the encoder 1904, the transmitter 1906, the sub-channel processing module 1910, and/or the rate matching module 1914 could be configured to implement any one or more of the features listed or otherwise described above with reference to FIGS. 11 to 13, 16, and/or 17.

In some alternative embodiments, the functionality of the encoder 1904, the transmitter 1906, the sub-channel processing module 1910, and/or the rate matching module 1914 described herein may be fully or partially implemented in software or modules, for example in encoding and transmitting modules stored in a memory such as 1912 and executed by a processor(s) of the apparatus 1900.

An apparatus could therefore include processor, and a memory such as 1912, coupled to the processor, storing instructions which, when executed by the processor, cause the processor to perform a method as disclosed herein. In the embodiment shown in FIG. 19, the apparatus 1900 includes the memory 1912, and the sub-channel sequence processing module 1910, which is coupled to the memory, could be configured to determine K1 and select K2 sub-channels in accordance with embodiments disclosed herein, to store information to the memory 1912, and/or to perform other operations as described above with reference to FIG. 16 and/or FIG. 17, for example.

Figure 20:
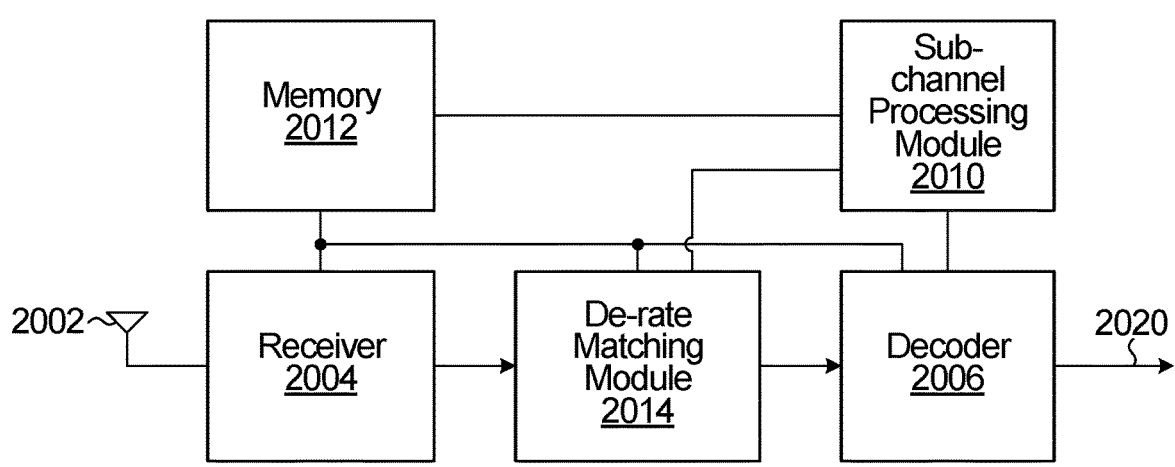
FIG. 20 is a block diagram of an example apparatus for receiving and decoding codewords.

FIG. 20 is a block diagram of an example apparatus for receiving and decoding codewords. The apparatus 2000 includes a receiver 2004 coupled to an antenna 2002 for receiving signals from a wireless channel, and to a decoder 2006. The apparatus 2000 also includes a sub-channel processing module 2010 and a de-rate matching module 2014 coupled to the decoder 2006 and to the sub-channel processing module 2010. A memory 2012 is also shown in FIG. 20, coupled to the decoder 2006, to the sub-channel processing module 2010, to the receiver 2004, and to the de-rate matching module 2014. The receiver 2004 is also coupled to the de-rate matching module 2014.

In some embodiments, the receiver 2004 includes a demodulator, an amplifier, and/or other components of an RF receive chain. The receiver 2004 receives, via the antenna 2002, a word that is based on a codeword of a polar code. Decoded bits are output at 2020 for further receiver processing.

In some embodiments, the apparatus 2000, and similarly the apparatus 1900 in FIG. 19 as noted above, include a non-transitory computer readable medium at 1912, 2012 that includes instructions for execution by a processor to implement and/or control operation of the encoder 1904, the sub-channel processing module 1910, and the rate matching module 1914 in FIG. 19, to implement and/or control operation of the decoder 2006, the sub-channel processing module 2010, and the de-rate matching module 2014 in FIG. 20, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1912, 2012.

The decoder 2006 is implemented in circuitry that is configured to decode received codewords. The sub-channel processing module 2010 is implemented in circuitry that is configured to determine (and store to the memory 2012) ordered number sequences and/or ordered sub-channel sequences as disclosed herein. The sub-channel processing module 2010 could be configured to also or instead determine coding parameters such as K or (N–K), and to select sub-channels as disclosed herein. Information representing ordered sub-channel sequences, ordered number sequences, and/or the selected sub-channels could be provided to the decoder 2006 by the sub-channel processing module 2010 for use in decoding received words, and/or stored in the memory 2012 by the sub-channel processing module 2010 for subsequent use by the decoder.

The sub-channel processing module 2010 could be implemented in circuitry that is also or instead configured to determine, from N sub-channels that are defined by a code and that have associated reliabilities for N bit positions, a number K1 of the sub-channels to carry input bits that are to be encoded into codewords; and to select a number K2>K1 of the N sub-channels to provide exactly K1 sub-channels that are available to carry the input bits that are to be encoded when assistant bits and/or puncturing/shortening are considered, as disclosed herein.

Like the decoder 2006 and the sub-channel processing module 2010, the rate matching module 2014 is implemented in circuitry, such as a processor, that is configured to perform receiver/decoder-side rate matching operations, also referred to as de-rate matching operations. These de-rate matching operations could include de-puncturing/de-shortening to reverse puncturing/shortening that was applied at an encoder/transmitter side, for example. In a processor-based implementation of the de-rate matching module 2014, processor-executable instructions to configure a processor to perform de-rate matching operations are stored in a non-transitory processor-readable medium, examples of which are described above. In an embodiment, the de-rate matching module 2014 determines one or more coding parameters such as K, N, M, that may impact a number of bit positions or sub-channels that are to be punctured/shortened or are otherwise affected by rate matching at an encoder/transmitter side. The coding parameter(s) could be read from the (memory 2012 or otherwise obtained or computed by the de-rate matching module 2014. Information indicative of bit positions and/or sub-channels that are affected by rate matching, or information from which such bit positions or sub-channels may be determined, may be fed back to the sub-channel processing module 2010, stored to the memory 2012, or otherwise made available to the sub-channel processing module 2010 by the de-rate matching module 2014. This enables the sub-channel processing module 2010 to determine how many selected bit positions or sub-channels are affected by rate matching, so that exactly K1 selected bit positions or sub-channels are available to carry input bits that are to be encoded, taking into account rate matching, and the K1 selected and available bit positions or sub-channels can be identified for decoding.

Assistant bit processing could be implemented by the decoder 2006, or in a separate assistant bit processing module configured to process PC bits, CRC bits, and/or other types of assistant bits. Information indicative of at least the number of bit positions and/or sub-channels that are to be allocated to assistant bits (e.g., the number of assistant bits), or information from which the number of assistant bits, bit positions, or sub-channels may be determined, could be provided to the sub-channel processing module 2010, stored to the memory 2012, or otherwise made available to the sub-channel processing module. This enables the sub-channel processing module 2010 to determine how many selected bit positions or sub-channels are to be allocated to assistant bits, so that exactly K1 selected bit positions or sub-channels are available to carry input bits that are to be encoded, taking assistant bits into account in addition to or instead of rate matching, and the K1 selected and available bit positions or sub-channels can be identified for decoding.

In some alternative embodiments, the functionality of the receiver 2004, the decoder 2006, the sub-channel processing module 2010, and/or the de-rate matching module 2014 described herein may be fully or partially implemented in software or modules, for example in receiving and decoding modules stored in a memory 2012 and executed by a processor(s) of the apparatus 2000.

An apparatus could therefore include a processor, and a memory such as 2012, coupled to the processor, storing instructions which, when executed by the processor, cause the processor to perform a method as disclosed herein, or receiving/decoding operations corresponding to transmitting/encoding operations disclosed herein. In the embodiment shown in FIG. 20, the apparatus 2000 includes the memory 2012, and the sub-channel sequence processing module 2010, which is coupled to the memory, could be configured to determine K1 and select K2 sub-channels in accordance with embodiments disclosed herein, to store information to the memory 2012, and/or to perform other operations or receiving/decoding operations corresponding to transmitting/encoding operations as described above with reference to FIG. 16 and/or FIG. 17, for example.

The apparatus 2000 could implement any of various other features that are disclosed herein. For example, the decoder 2006, the receiver 2004, the sub-channel processing module 2010, and/or the de-rate matching module 2014 could be configured to implement any one or more of the features listed above with reference to FIGS. 11 to 13, 16, and/or 17, or receiving/decoding features corresponding to encoding/transmitting features noted above.

Figure 21:
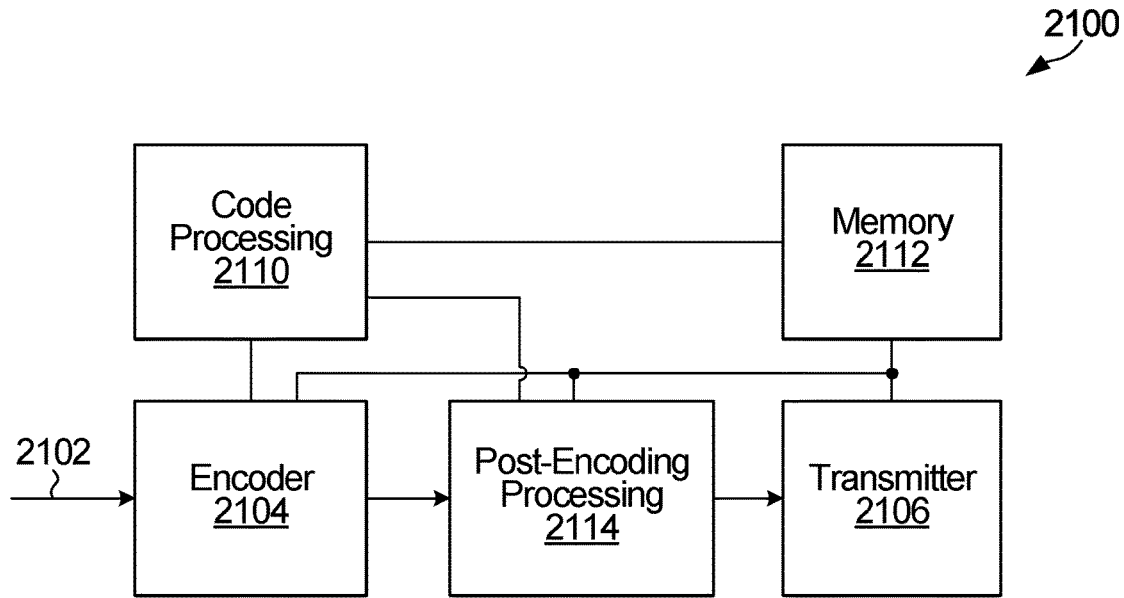
FIG. 21 is a block diagram of another example apparatus for encoding and transmitting codewords.

FIG. 21 is a block diagram of another apparatus for encoding and transmitting codewords. The apparatus 2100 includes an encoder module 2104 coupled to a transmitter module 2106. The apparatus 2100 also includes a code processing module 2110 coupled to the encoder module 2104 and a post-encoding processing module 2114. The post-encoding processing module 2114 is also coupled to the encoder module 2104 and to the transmitter module 2106. A memory 2112, also shown in FIG. 21, is coupled to the encoder module 2104, to the code processing module 2110, to the post-encoding processing module 2114, and to the transmitter module 2106. Although not shown, the transmitter module 2106 could include a modulator, an amplifier, antenna and/or other modules or components of a transmit chain or alternatively could be configured to interface with a separate (Radio-Frequency—RF) transmission module. For example, some of all of the modules 2104, 2106, 2110, 2112, 2114 of the apparatus 2100 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to produce codewords as described herein for transmission by a separate (RF) unit.

In some embodiments, the memory 2112 is a non-transitory computer readable medium at 2112, that includes instructions for execution by a processor to implement and/or control operation of the code processing module 2110, the encoder module 2104, the post-encoding processing module 2114, the transmitter module 2106 in FIG. 21, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 2112.

In some embodiments, the encoder module 2104 is implemented in circuitry, such as a processor, that is configured to encode input bits at input 2102 as disclosed herein. In a processor-based implementation of the encoder module 2104, processor-executable instructions to configure a processor to perform encoding operations are stored in a non-transitory processor-readable medium. The non-transitory medium could include, in the memory 2112 for example, one or more solid-state memory devices and/or memory devices with movable and possibly removable storage media.

The code processing module 2110 could be implemented in circuitry that is configured for sub-channel processing as disclosed herein. For example, the code processing module 2110 could be configured to perform operations that are the same as or similar to those disclosed herein in the context of the sub-channel processing module 1910. In some embodiments, the code processing module 2110 is implemented using a processor. The same processor or other circuitry, or separate processors or circuitry, could be used to implement both the encoder module 2104 and the code processing module 2110. As noted above for the encoder module 2104, in a processor-based implementation of the code processing module 2110, processor-executable instructions to configure a processor to perform code processing operations are stored in a non-transitory processor-readable medium, in the memory 2112 for example.

Like the encoder module 2104 and the code processing module 2110, the post-encoding processing module 2114 is implemented in circuitry, such as a processor, that is configured to perform various post-encoding operations. These post-encoding operations could include rate-matching operations such as puncturing, shortening and/or interleaving, for example. The post-encoding processing module 2114 could be configured to perform operations that are the same as or similar to those disclosed herein in the context of the rate matching module 1914. In a processor-based implementation of the post-encoding processing module 2114, processor-executable instructions to configure a processor to perform post-encoding operations are stored in a non-transitory processor-readable medium, examples of which are described above. In an embodiment, the post-encoding processing module 2114 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 2110, stored to the memory 2112, or otherwise made available to the code processing module 2110 by the post-encoding processing module 2114.

In some embodiments of the code processing module 2110, coding parameters, an ordered sub-channel sequence, and/or sub-channel allocations or selections may be determined based on information from the post-encoding processing module 2114. For instance, the ordered sub-channel sequence and/or sub-channel selections may be determined based on the rate-matching scheme determined by the post-encoding processing module 2114. Conversely, in some other embodiments, the post-encoding processing module 2114 may determine a rate-matching scheme based on the coding parameters and/or the ordered sub-channel sequence determined by the code processing module 2110. In yet some other embodiments, the determinations made within the code processing module 2110 and post-encoding processing module 2114 are jointly performed and optimized.

The apparatus 2100 could implement any of various other features that are disclosed herein. For example, the encoder module 2104, the transmitter module 2106, the code processing module 2110, and/or the post-encoding processing module 2114 could be configured to implement any one or more of the features listed or otherwise described herein.

In some alternative embodiments, the functionality of the encoder module 2104, the transmitter module 2106, the code processing module 2110, and/or the post-encoding processing module 2114 described herein may be fully or partially implemented in hardware or alternatively in software, for example in modules stored in a memory such as 2112 and executed by one or more processors of the apparatus 2100.

An apparatus could therefore include a processor, and a memory such as 2112, coupled to the processor, storing instructions which, when executed by the processor, cause the processor to perform the functionality and/or embodiments described herein in relation to the encoder module 2104, the transmitter module 2106, the code processing module 2110, and/or the post-encoding module 2114.

Figure 22:
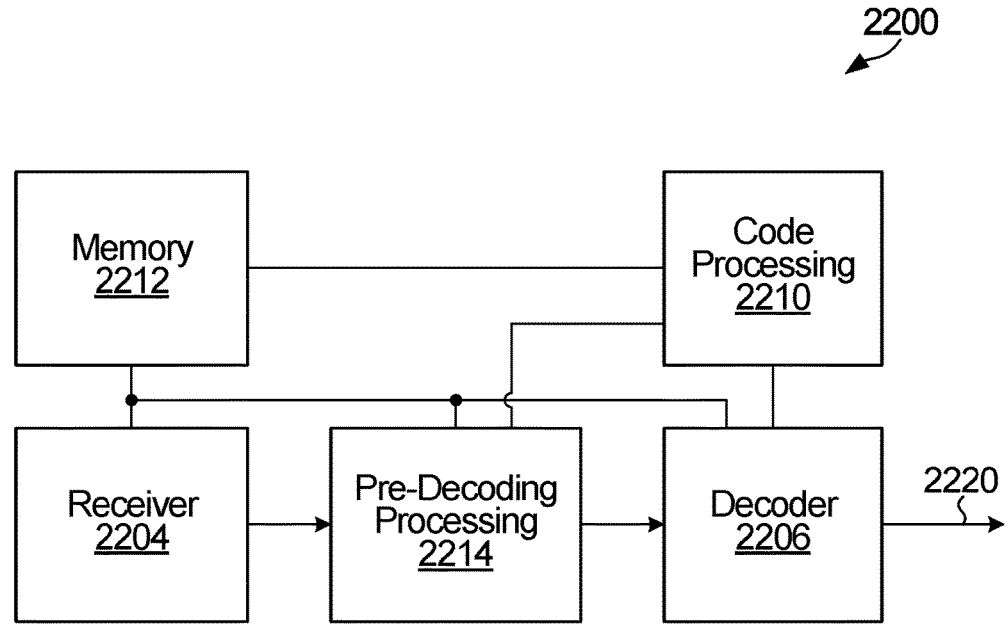
FIG. 22 is a block diagram of another example apparatus for receiving and decoding codewords.

FIG. 22 is a block diagram of another example apparatus for receiving and decoding codewords. The apparatus 2200 includes a receiver module 2204 which is configured to receive signals transmitted wirelessly and which is coupled to a decoder module 2206. The apparatus 2200 also includes a code processing module 2210 coupled to the decoder module 2206 and a pre-decoding processing module 2214. The pre-decoding processing module 2214 is also coupled to the decoder module 2206 and to the receiver module 2204. A memory 2212 also shown in FIG. 22, is coupled to the decoder module 2206, to the code processing module 2210, to the receiver module 2204, and to the pre-decoding processing module 2214.

Although not shown, the receiver module 2204 could include an antenna, demodulator, amplifier, and/or other modules or components of a receive chain or alternatively could be configured to interface with a separate (Radio-Frequency—RF) receiving module. For example, some of all of the modules 2204, 2206, 2210, 2212, 2214 of the apparatus 2200 may be implemented in hardware or circuitry (e.g. in one or more chipsets, microprocessors, ASICs, FPGAs, dedicated logic circuitry, or combinations thereof) so as to receive a word based on a codeword of a polar code as described herein. Decoded bits are output at 2220 for further receiver processing.

In some embodiments, the memory 2212 is a non-transitory computer readable medium that includes instructions for execution by a processor to implement and/or control operation of the receiver module 2204, decoder module 2206, the code processing module 2210, and the pre-decoding processing module 2214 in FIG. 22, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 2212.

The decoder module 2206 is implemented in circuitry, such as a processor, that is configured to decode received codewords. In a processor-based implementation of the decoder module 2206, processor-executable instructions to configure a processor to perform decoding operations are stored in a non-transitory processor-readable medium. The non-transitory medium could include, in the memory 2212 for example, one or more solid-state memory devices and/or memory devices with movable and possibly removable storage media.

The code processing module 2210 could be implemented in circuitry that is configured for sub-channel processing as disclosed herein. For example, the code processing module 2210 could be configured to perform operations that are the same as or similar to those disclosed herein in the context of the sub-channel processing module 2010. In a processor-based implementation of the code-processing module 2210, processor-executable instructions to configure a processor to perform code-processing operations are stored in a non-transitory processor-readable medium, examples of which are described above. Information representing ordered sub-channel sequences, and/or the selected sub-channels could be provided to the decoder module 2206 by the code processing module 2210 for use in decoding received words, and/or stored in the memory 2212 by the code processing module 2210 for subsequent use by the decoder module 2206.

Like the decoder module 2206 and the code processing module 2210, the pre-decoding processing module 2214 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In an embodiment, the pre-decoding processing module 2214 could be configured to perform operations that are the same as or similar to those disclosed herein in the context of the de-rate matching module 2014. In a processor-based implementation of the pre-decoding processing module 2214, processor-executable instructions to configure a processor to perform pre-decoding processing operations are stored in a non-transitory processor-readable medium, examples of which are described above. In an embodiment, the pre-decoding processing module 2214 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 2210, stored to the memory 2212, or otherwise made available to the code processing module 2210 by the pre-decoding processing module 2214.

In some embodiments of the code processing module 2210, an ordered sub-channel sequence and/or sub-channel allocations or selections may be determined based on information from the pre-decoding processing module 2214. For instance, the ordered sub-channel sequence and/or sub-channel selections may be determined based on the rate-matching scheme determined by the pre-decoding processing module 2214. Conversely, in some other embodiments, the pre-decoding processing module 2214 may determine a rate-matching scheme based on the coding parameters and/or the ordered sub-channel sequence determined by the code processing module 2210. In yet some other embodiments, the determinations made within the code processing module 2210 and pre-decoding processing module 2214 are jointly performed and optimized.

The apparatus 2200 could implement any of various other features that are disclosed herein. For example, the decoder module 2206, the receiver module 2204, the code processing module 2210, and/or the pre-decoding processing module 2214 could be configured to implement any one or more of the features listed or otherwise described herein.

In some alternative embodiments, the functionality of the receiver module 2204, the decoder module 2206, the code processing module 2210, and/or the pre-decoding processing module 2214 described herein may be fully or partially implemented in software or modules, for example in receiving and decoding modules stored in a memory 2212 and executed by one or more processors of the apparatus 2200.

An apparatus could therefore include a processor, and a memory such as 2212, coupled to the processor, storing instructions which, when executed by the processor, cause the processor to perform the functionality and/or embodiments disclosed herein, or receiving/decoding operations corresponding to transmitting/encoding operations disclosed herein.

Communication equipment could include the apparatus 1900, the apparatus 2000, the apparatus 2100, the apparatus 2200 or both a transmitter and a receiver and both an encoder and a decoder. Such communication equipment could be user equipment or communication network equipment.

Figure 23:
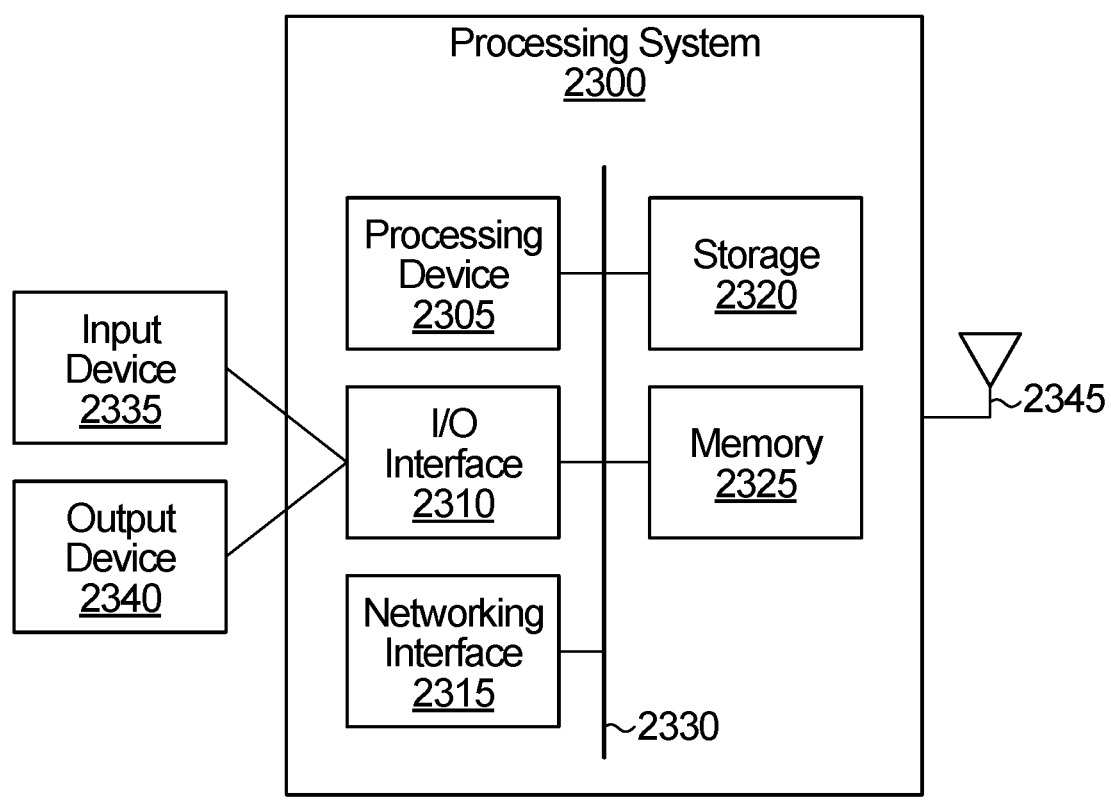
FIG. 23 is a block diagram of an example processing system, which may be used to implement embodiments disclosed herein.

FIGS. 19 to 22 are generalized block diagrams of apparatus that could be used to implement embodiments disclosed herein. FIG. 23 is a block diagram of an example processing system 2300, and provides a higher level implementation example. The apparatus 1900, the apparatus 2000, the apparatus 2100, and/or the apparatus 2200 may be implemented using the example processing system 2300, or variations of the processing system 2300. The processing system 2300 could be a server or a mobile device, for example, or any suitable processing system. Other processing systems suitable for implementing embodiments described in the present disclosure may be used, which may include components different from those discussed below. Although FIG. 23 shows a single instance of each component, there may be multiple instances of each component in the processing system 2300.

The processing system 2300 may include one or more processing devices 2305, such as a processor, a microprocessor, an application-specific integrated circuit (ASIC), a field-programmable gate array (FPGA), a dedicated logic circuitry, or combinations thereof. The processing system 2300 may also include one or more input/output (I/O) interfaces 2310, which may enable interfacing with one or more appropriate input devices 2335 and/or output devices 2340. The processing system 2300 may include one or more network interfaces 2315 for wired or wireless communication with a network (e.g., an intranet, the Internet, a P2P network, a WAN and/or a LAN) or other node. The network interfaces 2315 may include wired links (e.g., Ethernet cable) and/or wireless links (e.g., one or more antennas) for intra-network and/or inter-network communications. The network interfaces 2315 may provide wireless communication via one or more transmitters or transmit antennas and one or more receivers or receive antennas, for example. In this example, a single antenna 2345 is shown, which may serve as both transmitter and receiver. However, in other examples there may be separate antennas for transmitting and receiving. The processing system 2300 may also include one or more storage units 2320, which may include a mass storage unit such as a solid state drive, a hard disk drive, a magnetic disk drive and/or an optical disk drive.

The processing system 2300 may include one or more memories 2325, which may include a volatile or non-volatile memory (e.g., a flash memory, a random access memory (RAM), and/or a read-only memory (ROM)). The non-transitory memories 2325 may store instructions for execution by the processing devices 2305, such as to carry out examples described in the present disclosure. The memories 2325 may include other software instructions, such as for implementing an operating system and other applications/functions. In some examples, one or more data sets and/or modules may be provided by an external memory (e.g., an external drive in wired or wireless communication with the processing system 2300) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 2330 providing communication among components of the processing system 2300. The bus 2330 may be any suitable bus architecture including, for example, a memory bus, a peripheral bus or a video bus. In FIG. 23, the input devices 2335 (e.g., a keyboard, a mouse, a microphone, a touchscreen, and/or a keypad) and output devices 2340 (e.g., a display, a speaker and/or a printer) are shown as external to the processing system 2300. In other examples, one or more of the input devices 2335 and/or the output devices 2340 may be included as a component of the processing system 2300.

Figure 24:
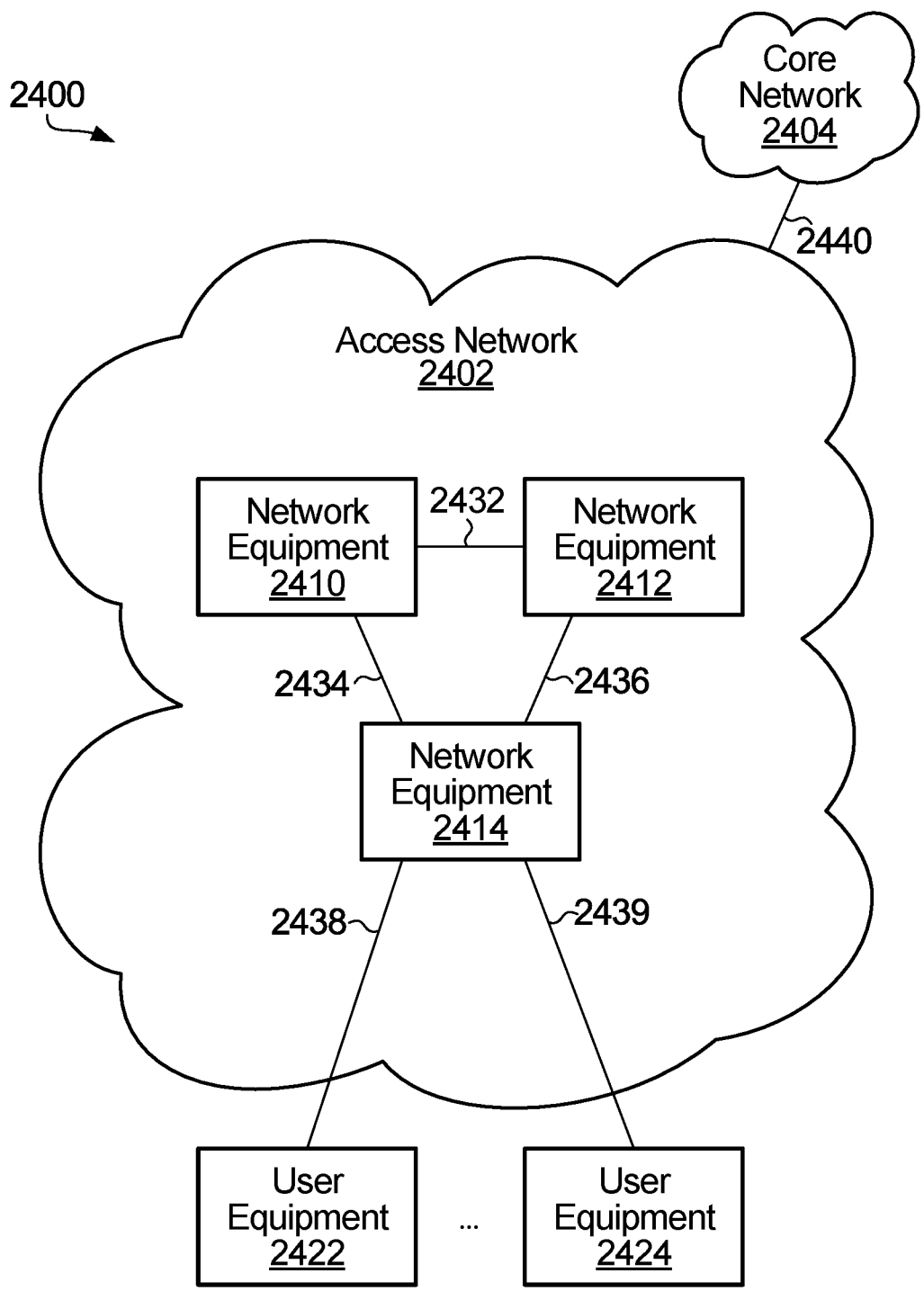
FIG. 24 is a block diagram of an example communication system.

FIG. 24 is a block diagram of an example communication system in which embodiments of the present disclosure could be implemented. The example communication system 2400 in FIG. 24 includes an access network 2402 and a core network 2404. The access network 2402 includes network equipment 2410, 2412, 2414 which communicates over network communication links 2432, 2434, 2436, and user equipment 2422, 2424 which communicates with network equipment 2414 in the example shown, over access communication links 2438, 2439. The access network 2402 communicates with the core network 2404 over another network communication link 2440. The core network 2404, like the access network 2402, may include network equipment that communicates with one or more installations of the network equipment 2410, 2412, 2414 in the access network 2402. However, in a communication system with an access network 2402 and a core network 2404, the core network might not itself directly provide communication service to user equipment.

The communication system 2400 is intended solely as an illustrative example. An access network 2402 could include more or fewer than three installations of network equipment, for example, which might or might not all directly communicate with each other as shown. Also, more than one installation of network equipment in the access network 2402 could provide communication service to user equipment. There could be more than one access network 2402 coupled to a core network 2404. It should also be appreciated that the present disclosure is not in any way limited to communication systems having an access network/core network structure.

Considering the access network 2402, any of various implementations are possible. The exact structure of network equipment 2410, 2412, 2414, and user equipment 2422, 2424 for which such network equipment provides communication service, is implementation-dependent. The apparatus 1900, 2000, 2300 in FIGS. 19 to 23 are examples of communication equipment that could be implemented at user equipment 2422, 2424 and/or network equipment 2410, 2412, 2414.

At least the network equipment 2414 that provides communication service to the user equipment 2422, 2424 includes a physical interface and communications circuitry to support access-side communications with the user equipment over the access links 2438, 2439. The access-side physical interface could be in the form of an antenna or an antenna array, for example, where the access communication links 2438, 2439 are wireless links. In the case of wired access communication links 2438, 2439, an access-side physical interface could be a port or a connector to a wired communication medium. Multiple access-side interfaces could be provided at the network equipment 2414 to support multiple access communication links 2438, 2439 of the same type or different types, for instance. The type of communications circuitry coupled to the access-side physical interface or interfaces at the access network equipment 2414 is dependent upon the type or types of access communication links 2438, 2439 and the communication protocol or protocols used to communicate with the user equipment 2422, 2424.

The network equipment 2410, 2412, 2414 also includes a network-side physical interface, or possibly multiple network-side physical interfaces, and communications circuitry to enable communications with other network equipment in the access network 2402. At least some installations of network equipment 2410, 2412, 2414 also include one or more network-side physical interfaces and communications circuitry to enable communications with core network equipment over the communication link 2440. There could be multiple communication links between network equipment 2410, 2412, 2414 and the core network 2404. Network-side communication links 2432, 2434, 2436 in the access network 2402, and the communication link 2440 to the core network 2404, could be the same type of communication link. In this case the same type of physical interface and the same communications circuitry at the network equipment 2410, 2412, 2414 could support communications between access network equipment within the access network 2402 and between the access network 2402 and the core network 2404. Different physical interfaces and communications circuitry could instead be provided at the network equipment 2410, 2412, 2414 for communications within the access network 2402 and between the access network 2402 and the core network 2404.

Network equipment in the core network 2404 could be similar in structure to the network equipment 2410, 2412, 2414. However, as noted above, network equipment in the core network 2404 might not directly provide communication service to user equipment and therefore might not include access-side physical interfaces for access communication links or associated access-side communications circuitry. Physical interfaces and communications circuitry at network equipment in the core network 2404 could support the same type or types of network communication link or links as in the access network 2402, different type or types of network communication link or links, or both.

Just as the exact structure of physical interfaces at network equipment 2410, 2412, 2414 and network equipment in the core network 2404 is implementation-dependent, the associated communications circuitry is implementation-dependent as well. In general, hardware, firmware, components which execute software, or some combination thereof, might be used in implementing such communications circuitry. Examples of electronic devices that might be suitable for implementing communications circuitry are provided above.

Each installation of user equipment 2422, 2424 includes a physical interface and communications circuitry compatible with an access-side physical interface and communications circuitry at the network equipment 2414, to enable the user equipment to communicate with the network equipment. Multiple physical interfaces of the same or different types could be provided at the user equipment 2422, 2424. The user equipment 2422, 2424 could also include such components as input/output devices through which functions of the user equipment are made available to a user. In the case of a wireless communication device such as a smartphone, for example, these functions could include not only communication functions, but other local functions which need not involve communications. Different types of user equipment 2422, 2424, such as different smartphones for instance, could be serviced by the same network equipment 2414.

Any of the communication links 2432, 2434, 2436, 2438, 2439, 2440, and communication links in the core network 2404 could potentially be or include wireless communication links. Such communication links tend to be used more often within an access network 2402 than in a core network 2404, although wireless communication links at the core network level are possible.

Figure 25:
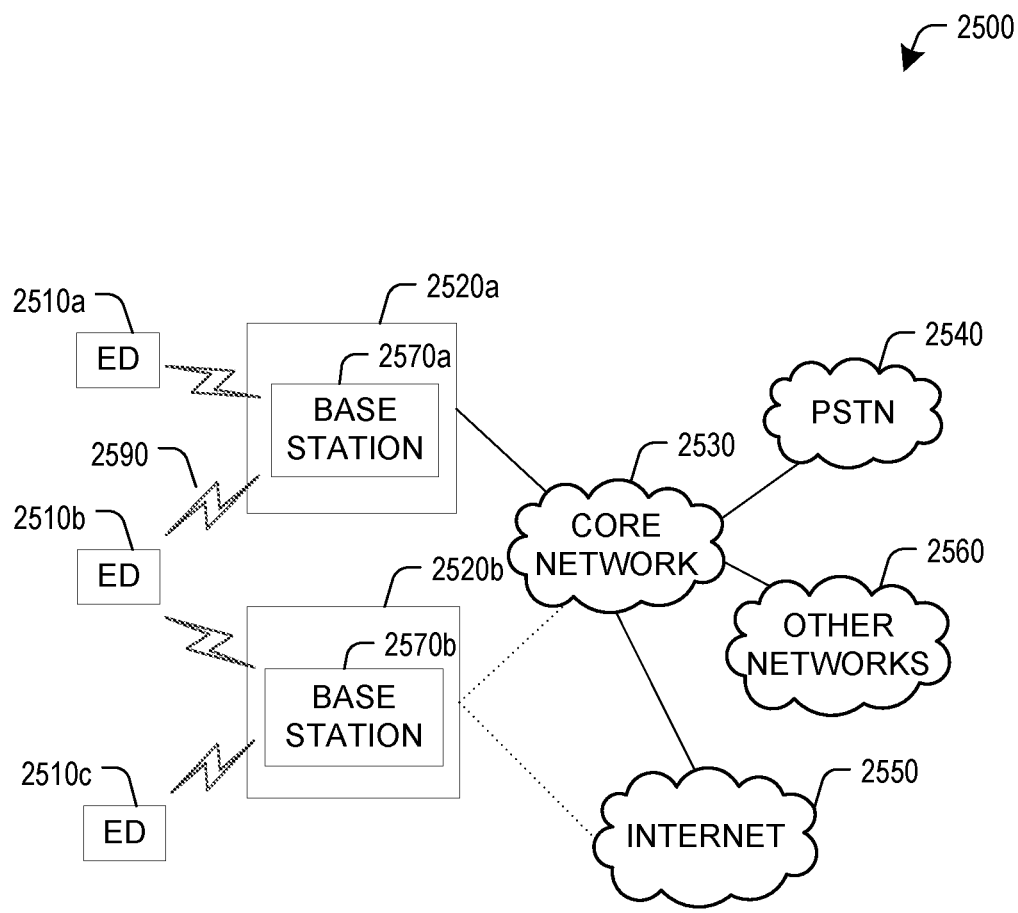
FIG. 25 is a block diagram of another example communication system in which embodiments disclosed herein may be used.

FIG. 25 illustrates another example communication system 2500 in which embodiments of the present disclosure could be implemented. In general, the communication system 2500 enables multiple wireless or wired elements to communicate data and other content. The purpose of the communication system 2500 may be to provide content (voice, data, video, text) via broadcast, narrowcast, user device to user device, etc. The communication system 2500 may operate by sharing resources such as bandwidth.

In this example, the communication system 2500 includes electronic devices (ED) 2510a-2510c, radio access networks (RANs) 2520a-2520b, a core network 2530, a public switched telephone network (PSTN) 2540, the internet 2550, and other networks 2560. Although certain numbers of these components or elements are shown in FIG. 25, any reasonable number of these components or elements may be included.

The EDs 2510a-2510c and base stations 2570a-2570b are examples of communication equipment that can be configured to implement some or all of the functionality and/or embodiments described herein. For example, any one of the EDs 2510a-2510c and base stations 2570a-2570b could be configured to implement the encoding or decoding functionality (or both) described above. In another example, any one of the EDs 2510a-2510c and base stations 2570a-2570b could include an apparatus as shown in one or more of FIGS. 19 to 22.

The EDs 2510a-2510c are configured to operate, communicate, or both, in the communication system 2500. For example, the EDs 2510a-2510c are configured to transmit, receive, or both via wireless or wired communication channels. Each ED 2510a-2510c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 25, the RANs 2520a-2520b include base stations 2570a-2570b, respectively. Each base station 2570a-2570b is configured to wirelessly interface with one or more of the EDs 2510a-2510c to enable access to any other base station 2570a-2570b, the core network 2530, the PSTN 2540, the Internet 2550, and/or the other networks 2560. For example, the base stations 2570a-2570b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 2510a-2510c may be alternatively or additionally configured to interface, access, or communicate with any other base station 2570a-2570b, the internet 2550, the core network 2530, the PSTN 2540, the other networks 2560, or any combination of the preceding. The communication system 2500 may include RANs, such as RAN 2520b, wherein the corresponding base station 2570b accesses the core network 2530 via the internet 2550, as shown.

The EDs 2510a-2510c and base stations 2570a-2570b are examples of communication equipment that can be configured to implement some or all of the functionality and/or embodiments described herein. In the embodiment shown in FIG. 25, the base station 2570a forms part of the RAN 2520a, which may include other base stations, base station controller(s) (BSC), radio network controller(s) (RNC), relay nodes, elements, and/or devices. Any base station 2570a, 2570b may be a single element, as shown, or multiple elements, distributed in the corresponding RAN, or otherwise. Also, the base station 2570b forms part of the RAN 2520b, which may include other base stations, elements, and/or devices. Each base station 2570a-2570b transmits and/or receives wireless signals within a particular geographic region or area, sometimes referred to as a "cell" or "coverage area". A cell may be further divided into cell sectors, and a base station 2570a-2570b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 2520a-2520b shown is exemplary only. Any number of RAN may be contemplated when devising the communication system 2500.

The base stations 2570a-2570b communicate with one or more of the EDs 2510a-2510c over one or more air interfaces 2590 using wireless communication links e.g. radio frequency (RF), microwave, infrared (IR), etc. The air interfaces 2590 may utilize any suitable radio access technology. For example, the communication system 2500 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 2590.

A base station 2570a-2570b may implement Universal Mobile Telecommunication System (UMTS) Terrestrial Radio Access (UTRA) to establish an air interface 2590 using wideband CDMA (WCDMA). In doing so, the base station 2570a-2570b may implement protocols such as HSPA, HSPA+ optionally including HSDPA, HSUPA or both. Alternatively, a base station 2570a-2570b may establish an air interface 2590 with Evolved UTMS Terrestrial Radio Access (E-UTRA) using LTE, LTE-A, and/or LTE-B. It is contemplated that the communication system 2500 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 2520a-2520b are in communication with the core network 2530 to provide the EDs 2510a-2510c with various services such as voice, data, and other services. The RANs 2520a-2520b and/or the core network 2530 may be in direct or indirect communication with one or more other RANs (not shown), which may or may not be directly served by core network 2530, and may or may not employ the same radio access technology as RAN 2520a, RAN 2520b or both. The core network 2530 may also serve as a gateway access between (i) the RANs 2520a-2520b or EDs 2510a-2510c or both, and (ii) other networks (such as the PSTN 2540, the internet 2550, and the other networks 2560). In addition, some or all of the EDs 2510a-2510c may include functionality for communicating with different wireless networks over different wireless links using different wireless technologies and/or protocols. Instead of wireless communication (or in addition thereto), the EDs 2510a-2510c may communicate via wired communication channels to a service provider or switch (not shown), and to the internet 2550. PSTN 2540 may include circuit switched telephone networks for providing plain old telephone service (POTS). Internet 2550 may include a network of computers and subnets (intranets) or both, and incorporate protocols, such as IP, TCP, UDP. EDs 2510a-2510c may be multimode devices capable of operation according to multiple radio access technologies, and incorporate multiple transceivers necessary to support such.

Figure 26A:
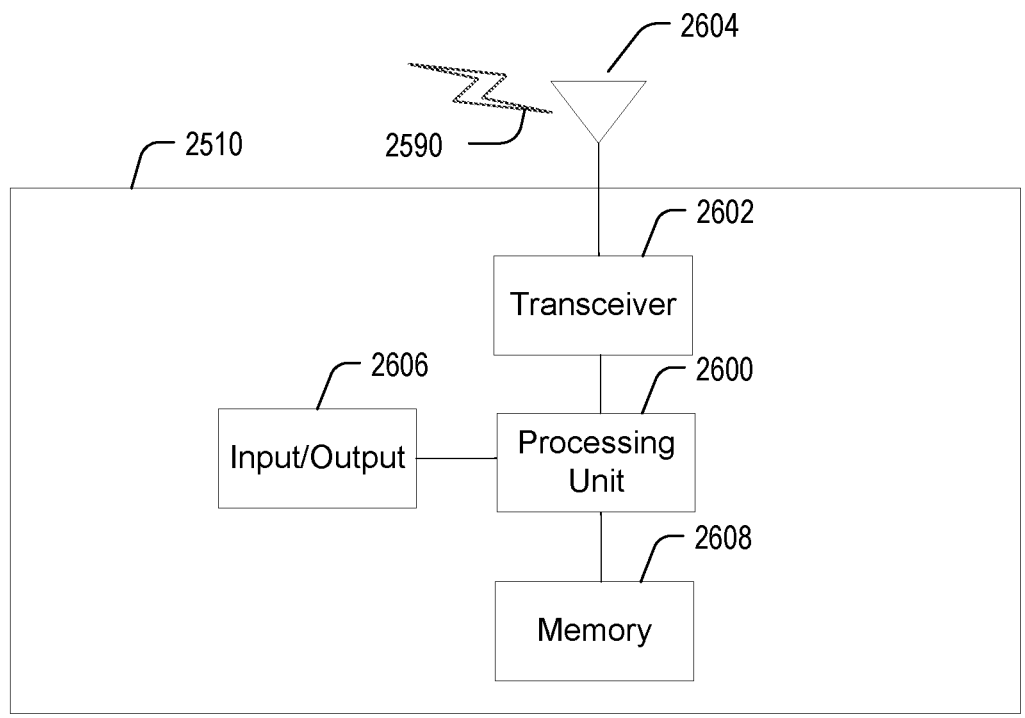
FIGS. 26A-B are block diagrams of an example Electronic Device (ED) and an example base station which may implement embodiments disclosed herein.
Figure 26B:
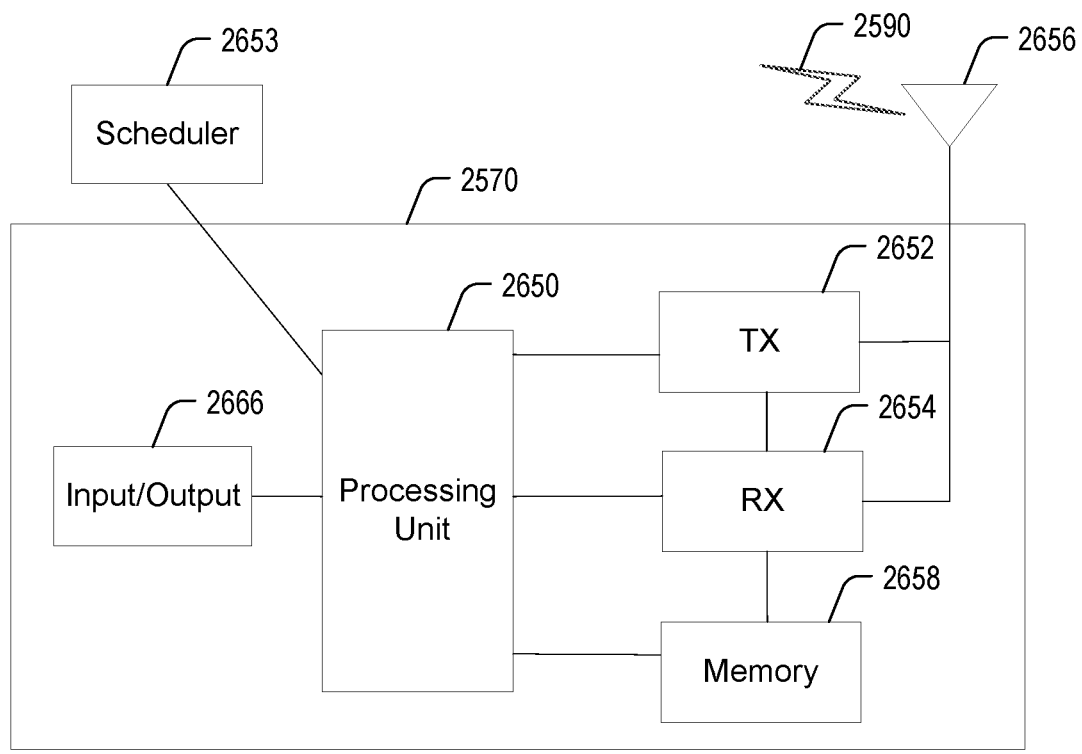

FIGS. 26A and 26B illustrate example devices that may implement the methods and teachings according to this disclosure. In particular, FIG. 26A illustrates an example ED 2510, and FIG. 26B illustrates an example base station 2570. These components could be used in the communication system 2500 or in any other suitable system.

As shown in FIG. 26A, the ED 2510 includes at least one processing unit 2600. The processing unit 2600 implements various processing operations of the ED 2510. For example, the processing unit 2600 could perform signal coding, data processing, power control, input/output processing, or any other functionality enabling the ED 2510 to operate in the communication system 2500. The processing unit 2600 may also be configured to implement some or all of the functionality and/or embodiments described in more detail above. Each processing unit 2600 includes any suitable processing or computing device configured to perform one or more operations. Each processing unit 2600 could, for example, include a microprocessor, microcontroller, digital signal processor, field programmable gate array, or application specific integrated circuit.

The ED 2510 also includes at least one transceiver 2602. The transceiver 2602 is configured to modulate data or other content for transmission by at least one antenna or Network Interface Controller (NIC) 2604. The transceiver 2602 is also configured to demodulate data or other content received by the at least one antenna 2604. Each transceiver 2602 includes any suitable structure for generating signals for wireless or wired transmission and/or processing signals received wirelessly or by wire. Each antenna 2604 includes any suitable structure for transmitting and/or receiving wireless or wired signals. One or multiple transceivers 2602 could be used in the ED 2510, and one or multiple antennas 2604 could be used in the ED 2510. Although shown as a single functional unit, a transceiver 2602 could also be implemented using at least one transmitter and at least one separate receiver.

The ED 2510 further includes one or more input/output devices 2606 or interfaces (such as a wired interface to the internet 2550). The input/output devices 2606 permit interaction with a user or other devices in the network. Each input/output device 2606 includes any suitable structure for providing information to or receiving information from a user, such as a speaker, microphone, keypad, keyboard, display, or touch screen, including network interface communications.

In addition, the ED 2510 includes at least one memory 2608. The memory 2608 stores instructions and data used, generated, or collected by the ED 2510. For example, the memory 2608 could store software instructions or modules configured to implement some or all of the functionality and/or embodiments described above and that are executed by the processing unit(s) 2600. Each memory 2608 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 26B, the base station 2570 includes at least one processing unit 2650, at least one transmitter 2652, at least one receiver 2654, one or more antennas 2656, at least one memory 2658, and one or more input/output devices or interfaces 2666. A transceiver, not shown, may be used instead of the transmitter 2652 and receiver 2654. A scheduler 2653 may be coupled to the processing unit 2650. The scheduler 2653 may be included within or operated separately from the base station 2570. The processing unit 2650 implements various processing operations of the base station 2570, such as signal coding, data processing, power control, input/output processing, or any other functionality. The processing unit 2650 can also be configured to implement some or all of the functionality and/or embodiments described in more detail above. Each processing unit 2650 includes any suitable processing or computing device configured to perform one or more operations. Each processing unit 2650 could, for example, include a microprocessor, microcontroller, digital signal processor, field programmable gate array, or application specific integrated circuit.

Each transmitter 2652 includes any suitable structure for generating signals for wireless or wired transmission to one or more EDs or other devices. Each receiver 2654 includes any suitable structure for processing signals received wirelessly or by wire from one or more EDs or other devices. Although shown as separate components, at least one transmitter 2652 and at least one receiver 2654 could be combined into a transceiver. Each antenna 2656 includes any suitable structure for transmitting and/or receiving wireless or wired signals. Although a common antenna 2656 is shown here as being coupled to both the transmitter 2652 and the receiver 2654, one or more antennas 2656 could be coupled to the transmitter(s) 2652, and one or more separate antennas 2656 could be coupled to the receiver(s) 2654. Each memory 2658 includes any suitable volatile and/or non-volatile storage and retrieval device(s) such as those described above in connection to the ED 2510. The memory 2658 stores instructions and data used, generated, or collected by the base station 2570. For example, the memory 2658 could store software instructions or modules configured to implement some or all of the functionality and/or embodiments described above and that are executed by the processing unit(s) 2650.

Each input/output device 2666 permits interaction with a user or other devices in the network. Each input/output device 2666 includes any suitable structure for providing information to or receiving/providing information from a user, including network interface communications.

FIGS. 19 to 26B provide examples of devices or systems in which apparatus embodiments of the present disclosure could be implemented. Apparatus embodiments as disclosed herein encompass, for example, an apparatus that includes a processor and a memory, coupled to the processor, storing instructions which, when executed by the processor, cause the processor to perform a method. Such a method could involve determining, from sub-channels that are defined by a code and that have associated reliabilities for input bits at input bit positions, a first number of the sub-channels to carry bits that are to be encoded, and selecting a second number of the sub-channels, greater than the first number, to provide exactly the first number of sub-channels to be available to carry the bits that are to be encoded.

Another apparatus as disclosed herein includes a sub-channel processing module to determine, from sub-channels that are defined by a code and that have associated reliabilities for input bits at input bit positions, a first number of the sub-channels to carry bits that are to be encoded; and to select a second number of the sub-channels, greater than the first number, to provide exactly the first number of sub-channels to be available to carry the bits that are to be encoded.

Apparatus embodiments could include any of the following features, alone or in any of various combinations:

the selected sub-channels include unavailable sub-channels that are not available to carry the bits;

the unavailable sub-channels include one or more of: sub-channels that are selected to carry assistant bits, and sub-channels corresponding to punctured or shortened coded bit positions in a codeword;

the sub-channel processing module, or a processor in a processor-based embodiment, is further configured to select the first number of the sub-channels and to determine a number of unavailable sub-channels of the selected first number of the sub-channels that are not available to carry the bits that are to be encoded;

the second number is a sum of the first number and the determined number of unavailable sub-channels;

the sub-channel processing module, or a processor in a processor-based embodiment, is configured to, in each of multiple iterations z=1, . . . , Z, with Z≥2: select $K2_z$ of the sub-channels, with $K2_z$=K1 for z=1 and $K2_z$>K1 for z>1, where K1 is the first number and $K2_z$ is the second number for a $z^{th}$ iteration; and determine whether exactly K1 of the $K2_z$ selected sub-channels are available to carry the bits that are to be encoded, and to perform a next iteration for $K2_{z+1}=K1+X_z$, where $X_z$ is a number of the $K2_z$ selected sub-channels that are not available to carry the bits that are to be encoded, if it is not determined that exactly K1 of the $K2_z$ selected sub-channels are available to carry the bits that are to be encoded;

an apparatus also includes a memory operatively coupled to the sub-channel processing module, or to a processor in a processor-based embodiment;

the sub-channel processing module, or a processor in a processor-based embodiment, is further configured to store, in the memory, information indicative of the second number or information from which the second number can be determined;

in conjunction with iterative selection, the sub-channel processing module, or a processor in a processor-based embodiment, is further configured to store, in the memory, information indicative of $K2_z$ from a final iteration or information from which $K2_z$ from the final iteration can be determined;

the sub-channel processing module, or a processor in a processor-based embodiment, is configured to determine the first number and select the second number of sub-channels for a plurality of different sets of coding parameters;

the sub-channel processing module, or a processor in a processor-based embodiment, is configured to store in the memory information indicative of the second number or information from which the second number can be determined, for each of the different sets of coding parameters;

the sub-channel processing module, or a processor in a processor-based embodiment, is further configured to, when bits are to be encoded according to one of the different sets of coding parameters, select the second number of the sub-channels based on the information stored in the memory for the one of the sets of coding parameters;

the sub-channel processing module, or a processor in a processor-based embodiment, is configured to determine the second number based on the first number and information stored in a memory;

the sub-channel processing module, or a processor in a processor-based embodiment, is configured to select the second number of the sub-channels based on one or more ordered number sequences and one or more ordered sub-channel sequences;

an apparatus also includes an encoder, coupled to the sub-channel processing module or to a processor in a processor-based embodiment, to encode the bits that are to be encoded onto the first number of sub-channels to generate a codeword;

an apparatus also includes a transmitter, coupled to the encoder, to transmit the codeword;

user equipment includes such an apparatus;

network equipment includes such an apparatus.

Various embodiments disclosed herein relate to specifying full sub-channel sequences using shorter ordered sequences of numbers. This could reduce memory space requirements for ordered sequence storage.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

The present disclosure refers primarily to a 2-by-2 kernel as an example to demonstrate and explain illustrative embodiments. However, it is understood that the techniques for selecting sub-channels as disclosed herein could be applied to other types of polarization kernels as well, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as the new 5G NR. The techniques disclosed herein could be used not only for control data over a control channel (e.g. PDCCH) but also or instead other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

Sub-channel selection to provide K1 available sub-channels could be applied in conjunction with any of various assistant bit generation method and/or puncturing/shortening methods. EDCs and ECCs are examples of assistant bit generation methods, and BIV shortening is similarly an example of a shortening or puncturing method. Other assistant bit generation methods and/or shortening/puncturing methods are contemplated. For BIV shortening, indices of shortened coded bit positions are the same as those of corresponding input bit positions (i.e., a coded bit position of index 'x' to be shortened corresponds to input bit position of index 'x'), which can simplify the procedure of determining which input bit positions correspond to coded bit positions that are to be shortened or punctured. However, other puncturing or shortening methods could be used if it is possible to determine which input bit positions correspond to coded bit positions which are to be punctured or shortened.

Other examples are also described below.

According to an example 1, a method comprises: determining, from N sub-channels that are defined by a code and that have associated reliabilities for N bit positions, a number K1 of the sub-channels to carry input bits that are to be encoded into codewords; selecting a number K2>K1 of the N sub-channels to provide exactly K1 sub-channels that are available to carry the input bits that are to be encoded.

An example 2 relates to the method of example 1, wherein the (K2-K1) selected sub-channels are not available to carry the input bits that are to be encoded, and include sub-channels that are selected to carry assistant bits, and/or sub-channels corresponding to punctured or shortened coded bit positions in a codeword.

An example 3 relates to the method of example 1 or example 2, further comprising: selecting K1 of the N sub-channels; and determining a number X of the K1 selected sub-channels that are not available to carry the input bits that are to be encoded, wherein selecting K2 of the N sub-channels comprises selecting K2=K1+X of the N sub-channels.

An example 4 relates to the method of example 1 or example 2, wherein the selecting comprises, in each of a plurality of iterations z=1, ..., Z, with Z≥2: selecting $K2_z$ of the N sub-channels, with $K2_z$=K1 for z=1 and $K2_z$>K1 for z>1; determining whether exactly K1 of the $K2_z$ selected sub-channels are available to carry the input bits that are to be encoded; and repeating the selecting and determining for $K2_{z+1}$=K1+$X_z$, where $X_z$ is a number of the $K2_z$ selected sub-channels that are not available to carry the input bits that are to be encoded, until it is determined that exactly K1 of the $K2_z$ selected sub-channels are available to carry the input bits that are to be encoded.

An example 5 relates to the method of example 4, wherein the repeating comprises repeating the selecting and determining until either Z iterations have been completed or it is determined that exactly K1 of the $K2_z$ selected sub-channels are available to carry the input bits that are to be encoded.

An example 6 relates to the method of example 1 or example 2, further comprising: storing, in a memory, information indicative of K2 or information from which K2 can be determined.

An example 7 relates to the method of example 6, further comprising: in each of a plurality of iterations z=1, ..., Z, with Z≥2: selecting $K2_z$ of the N sub-channels, with $K2_z$=K1 for z=1 and $K2_z$>K1 for z>1; determining whether exactly K1 of the $K2_z$ selected sub-channels are available to carry the input bits that are to be encoded; and repeating the selecting and determining for $K2_{z+1}$=K1+$X_z$, where $X_z$ is a number of the $K2_z$ selected sub-channels that are not available to carry the input bits that are to be encoded, until a final iteration in which it is determined that exactly K1 of the $K2_z$ selected sub-channels are available to carry the input bits that are to be encoded, wherein the storing comprises storing, in the memory, information indicative of $K2_z$ from the final iteration or information from which $K2_z$ from the final iteration can be determined.

An example 8 relates to the method of example 6 or example 7, wherein determining K1 and selecting K2 sub-channels comprise determining K1 and selecting K2 for a plurality of different sets of coding parameters, and wherein storing comprises storing information indicative of K2 or information from which K2 can be determined for each set of coding parameters.

An example 9 relates to the method of any one of examples 6 to 8, wherein the selecting comprises: determining K2 based on K1 and the information stored in the memory.

An example 10 relates to the method of example 1 or example 2, wherein the selecting comprises: determining K2 based on K1 and information stored in a memory.

An example 11 relates to the method of any one of examples 1 to 10, wherein the selecting comprises selecting based on one or more ordered number sequences and one or more ordered sub-channel sequences.

An example 12 relates to a non-transitory processor-readable medium storing instructions which, when executed by one or more processors, cause the one or more processors to perform the method of any one of examples 1 to 11.

According to an example 13, an apparatus comprises: a processor; and a memory, coupled to the processor, storing instructions which, when executed by the processor, cause the processor to perform the method of any one of examples 1 to 11.

According to an example 14, and apparatus comprises: a memory; and a sub-channel sequence processing module, coupled to the memory, to determine K1 and select K2 sub-channels in accordance with any one of examples 1 to 5 and 9 to 11.

An example 15 relates to the apparatus of example 14, wherein the sub-channel sequence processing module is configured to store information to a memory in accordance with example 6 or example 7.

An example 16 relates to the apparatus of example 14 or example 15, wherein the sub-channel sequence processing module is configured to select, determine, and repeat in accordance with example 7.

An example 17 relates to the apparatus of any one of examples 14 to 16, wherein the sub-channel sequence processing module is configured to determine and select in accordance with example 8.

An example 18 relates to user equipment comprising the apparatus of any one of examples 13 to 17.

An example 19 relates to communication network equipment comprising the apparatus of any one of examples 13 to 17.

Coding sub-channel selection involves, in an embodiment, determining, from N sub-channels that are defined by a code and that have associated reliabilities for N bit positions, a number K1 of the sub-channels to carry input bits that are to be encoded into codewords. A number K2>K1 of the N sub-channels are selected, to provide exactly K1 sub-channels that are available to carry the input bits that are to be encoded.

The invention claimed is:

1. A method comprising:
   determining, from sub-channels that are defined by a code and that have associated reliabilities for input bits at input bit positions, a first number of the sub-channels to carry bits that are to be encoded; prior to rate matching, selecting a second number of the sub-channels, greater than the first number, to provide, after rate matching, a remaining number of sub-channels available to carry the bits that are to be encoded that is exactly equal to the first number, wherein the selecting comprises, in each of a plurality of iterations z=1, ... Z, with Z≥2: selecting $K2_z$ of the sub-channels, with $K2_z$=K1 for z=1 and $K2_z$>K1 for z>1, where K1 is the first number and $K2_z$ is the second number for a $Z^{th}$ iteration; determining whether exactly K1 of the $K2_z$ selected sub-channels are available to carry the bits that are to be encoded, wherein a next iteration is performed for $K2_{z+1}$=K1+$X_z$, where $X_z$ is a number of the $K2_z$ selected sub-channels that are not available to carry the bits that are to be encoded, if it is not determined that exactly K1 of the K2$_z$ selected sub-channels are available to carry the bits that are to be encoded; and encoding the bits that are to be encoded onto the first number of sub-channels to generate a codeword.

2. The method of claim 1, wherein the selected sub-channels include unavailable sub-channels that, due to the rate matching, are not available to carry the bits, the unavailable sub-channels including one or more of: sub-channels that are selected to carry assistant bits, and sub-channels corresponding to punctured or shortened coded bit positions in a codeword.

3. The method of claim 1, further comprising: selecting the first number of the sub-channels; and determining a number of unavailable sub-channels of the selected first number of the sub-channels that, due to the rate matching, are not available to carry the bits that are to be encoded, wherein the second number comprises a sum of the first number and the determined number of unavailable sub-channels.

4. The method of claim 1, further comprising: storing, in a memory, information indicative of the second number or information from which the second number can be determined.

5. The method of claim 4, wherein the selecting comprises, in each of a plurality of iterations z=1, . . . Z, with Z≥2: selecting K2$_z$ of the sub-channels, with K2$_z$=K1 for z=1 and K2$_z$>K1 for z>1, where K1 is the first number and K2$_z$ is the second number for a $Z^{th}$ iteration; determining whether exactly K1 of the K2$_z$ selected sub-channels are available to carry the bits that are to be encoded, wherein a next iteration is performed for K2$_z$+1=K1+X$_z$, where X$_z$ is a number of the K2z selected sub-channels that are not available to carry the bits that are to be encoded, if it is not determined that exactly K1 of the K2$_z$ selected sub-channels are available to carry the bits that are to be encoded, wherein the storing comprises storing, in the memory, information indicative of K2$_z$ from a final iteration or information from which K2$_z$ from the final iteration can be determined.

6. The method of claim 4, wherein determining the first number and selecting the second number of sub-channels comprise determining the first number and selecting the second number of sub-channels for a plurality of different sets of coding parameters, and wherein the storing comprises storing information indicative of the second number or information from which the second number can be determined, for each of the different sets of coding parameters.

7. The method of claim 6, further comprising, when bits are to be encoded according to one of the different sets of coding parameters: selecting the second number of the sub-channels based on the information stored in the memory for the one of the sets of coding parameters.

8. The method of claim 1, wherein the selecting comprises: determining the second number based on the first number and information stored in a memory.

9. The method of claim 1, wherein the selecting comprises selecting based on one or more ordered number sequences and one or more ordered sub-channel sequences.

10. The method of claim 1, further comprising: transmitting the codeword.

11. A non-transitory processor-readable medium storing instructions which, when executed by one or more processors, cause the one or more processors to perform the method of claim 1.

12. An apparatus comprising: a processor; and a memory, coupled to the processor, storing instructions which, when executed by the processor, cause the processor to perform the method of claim 1.

13. User equipment comprising the apparatus of claim 12.

14. Communication network equipment comprising the apparatus of claim 12.

15. An apparatus comprising: a processor configured to determine, from sub-channels that are defined by a code and that have associated reliabilities or input bits at input bit positions, a first number of the sub-channels to carry bits that are to be encoded; and to, prior to rate matching, select a second number of the sub-channels, greater than the first number, to provide, after rate matching, a remaining number of sub-channels available to carry the bits that are to be encoded that is exactly equal to the first number, wherein the processor is configured to, in each of a plurality of iterations z=1, . . . Z, with Z≥2: selecting K2$_z$ of the sub-channels, with K2$_z$=K1 for z=1 and K2$_z$>K1 for z>1, where K1 is the first number and K2$_z$ is the second number for a $Z^{th}$ iteration; determine whether exactly K1 of the K2$_z$ selected sub-channels are available to carry the bits that are to be encoded, wherein the processor is configured to perform a next iteration for K2$_{z+1}$=K1+X$_z$, where X$_z$ is a number of the K2$_z$ selected sub-channels that are not available to carry the bits that are to be encoded, if it is not determined that exactly K1 of the K2$_z$ selected sub-channels are available to carry the bits that are to be encoded; and the processor further configured to implement an encoder to encode the bits that are to be encoded onto the first number of sub-channels to generate a codeword.

16. The apparatus of claim 15, wherein the selected sub-channels include unavailable sub-channels that, due to the rate matching, are not available to carry the bits, the unavailable sub-channels including one or more of: sub-channels that are selected to carry assistant bits, and sub-channels corresponding to punctured or shortened coded bit positions in a codeword.

17. The apparatus of claim 15, wherein the processor is further configured to select the first number of the sub-channels and to determine a number of unavailable sub-channels of the selected first number of the sub-channels that, due to the rate matching, are not available to carry the bits that are to be encoded, wherein the second number comprises a sum of the first number and the determined number of unavailable sub-channels.

18. The apparatus of claim 15, further comprising: a memory operatively coupled to the processor, wherein the processor is further configured to store, in the memory, information indicative of the second number or information from which the second number can be determined.

19. The apparatus of claim 18, wherein the processor is configured to, in each of a plurality of iterations z=1, . . . Z, with Z≥2: selecting K2$_z$ of the sub-channels, with K2$_z$=K1 for z=1 and K2$_z$>K1 for z>1, where K1 is the first number and K2$_z$ is the second number for a $Z^{th}$ iteration; determine whether exactly K1 of the K2$_z$ selected sub-channels are available to carry the bits that are to be encoded, wherein the processor is configured to perform a next iteration for K2$_{z+1}$=K1+X$_z$, where X$_z$ is a number of the K2$_z$ selected sub-channels that are not available to carry the bits that are to be encoded, if it is not determined that exactly K1 of the K2$_z$ selected sub-channels are available to carry the bits that are to be encoded, wherein the processor is configured to store, in the memory, information indicative of K2, from a final iteration or information from which K2$_z$ from the final iteration can be determined.

20. The apparatus of claim 18, wherein processor is configured to determine the first number and select the second number of sub-channels for a plurality of different sets of coding parameters, and to store in the memory information indicative of the second number or information from which the second number can be determined, for each of the different sets of coding parameters.

21. The apparatus of claim 20, wherein the processor is further configured to, when bits are to be encoded according to one of the different sets of coding parameters, select the second number of the sub-channels based on the information stored in the memory for the one of the sets of coding parameters.

22. The apparatus of claim 15, wherein processor is configured to determine the second number based on the first number and information stored in a memory.

23. The apparatus of claim 15, wherein the processor is configured to select the second number of the sub-channels based on one or more ordered number sequences and one or more ordered sub-channel sequences.

24. The apparatus of claim 15, further comprising: a transmitter, coupled to the encoder, to transmit the codeword.

25. User equipment comprising the apparatus of claim 15.

26. Communication network equipment comprising the apparatus of claim 15.

* * * * *

UNITED STATES PATENT AND TRADEMARK OFFICE
CERTIFICATE OF CORRECTION

PATENT NO. : 10,735,154 B2
APPLICATION NO. : 15/901238
DATED : August 4, 2020
INVENTOR(S) : Louis-Philippe Hamelin et al.

Page 1 of 1

It is certified that error appears in the above-identified patent and that said Letters Patent is hereby corrected as shown below:

In the Claims

In Column 54, Line 10 (Claim 15): "that have associated reliabilities or input bits," should read --that have associated reliabilities for input bits--.

In Column 54, Line 65 (Claim 19): "information indicative of K2, from a" should read --information indicative of $K2_z$--.

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*